United States Patent
Masuda

(10) Patent No.: US 10,483,989 B2
(45) Date of Patent: Nov. 19, 2019

(54) PHASE-LOCKED LOOP, PHASE-LOCKING METHOD, AND COMMUNICATION UNIT

(71) Applicant: Sony Semiconductor Solutions Corporation, Kanagawa (JP)

(72) Inventor: Takashi Masuda, Tokyo (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/751,094

(22) PCT Filed: Aug. 15, 2016

(86) PCT No.: PCT/JP2016/073817
§ 371 (c)(1),
(2) Date: Feb. 7, 2018

(87) PCT Pub. No.: WO2017/043254
PCT Pub. Date: Mar. 16, 2017

(65) Prior Publication Data
US 2018/0234098 A1 Aug. 16, 2018

(30) Foreign Application Priority Data
Sep. 11, 2015 (JP) .................. 2015-179019

(51) Int. Cl.
*H03L 7/00* (2006.01)
*H03L 7/083* (2006.01)
(Continued)

(52) U.S. Cl.
CPC ............... *H03L 7/083* (2013.01); *H03L 7/07* (2013.01); *H03L 7/08* (2013.01); *H03L 7/081* (2013.01);
(Continued)

(58) Field of Classification Search
CPC .................. H03L 7/00; H03L 7/083
See application file for complete search history.

(56) References Cited

U.S. PATENT DOCUMENTS 8,841,948 B1 9/2014 Chien et al.
9,191,187 B2 * 11/2015 Shibasaki ............. H04L 7/0079

FOREIGN PATENT DOCUMENTS

| JP | 2013-118638 A | 6/2013 |
| JP | 2014-187561 A | 10/2014 |
| WO | 2016/152438 A1 | 9/2016 |

OTHER PUBLICATIONS

Q. Beraud-Sudreau et al., "SiGe Clock and Data Recovery System Based on Injection-Locked Oscillator for 100 Gbit/s Serial Data Link," IEEE Journal of Solid-State Circuits, vol. 49, No. 9, Sep. 2014, pp. 1895-1904.
(Continued)

*Primary Examiner* — Hai L Nguyen
(74) *Attorney, Agent, or Firm* — Michael Best & Friedrich LLP

(57) ABSTRACT

A phase-locked loop of the disclosure includes a detector, an oscillator, an adjuster, and a controller. The detector detects a transition of an input clock signal. The oscillator generates a clock signal having a frequency corresponding to a first control signal, and changes a phase of the clock signal on a basis of a detection result in the detector. The adjuster adjusts a phase difference between a phase of the input clock signal and the phase of the clock signal depending on a second control signal. The controller compares the phase of the input clock signal and the phase of the clock signal at a plurality of comparison timings, and generates the first control signal and the second control signal on a basis of a result of the comparison.

5 Claims, 37 Drawing Sheets

(51) Int. Cl.
    *H03L 7/08*     (2006.01)
    *H03L 7/081*    (2006.01)
    *H03L 7/087*    (2006.01)
    *H03L 7/07*     (2006.01)
    *H03L 7/099*    (2006.01)
    *H03L 7/091*    (2006.01)

(52) U.S. Cl.
    CPC .............. *H03L 7/087* (2013.01); *H03L 7/091* (2013.01); *H03L 7/0997* (2013.01)

(56) References Cited

OTHER PUBLICATIONS

J. Lee et al., "Study of Subharmonically Injection-Locked PLLS," IEEE Journal of Solid-State Circuits, vol. 44, No. 5, May 2009, pp. 1539-1553.

\* cited by examiner

[ FIG. 1 ]
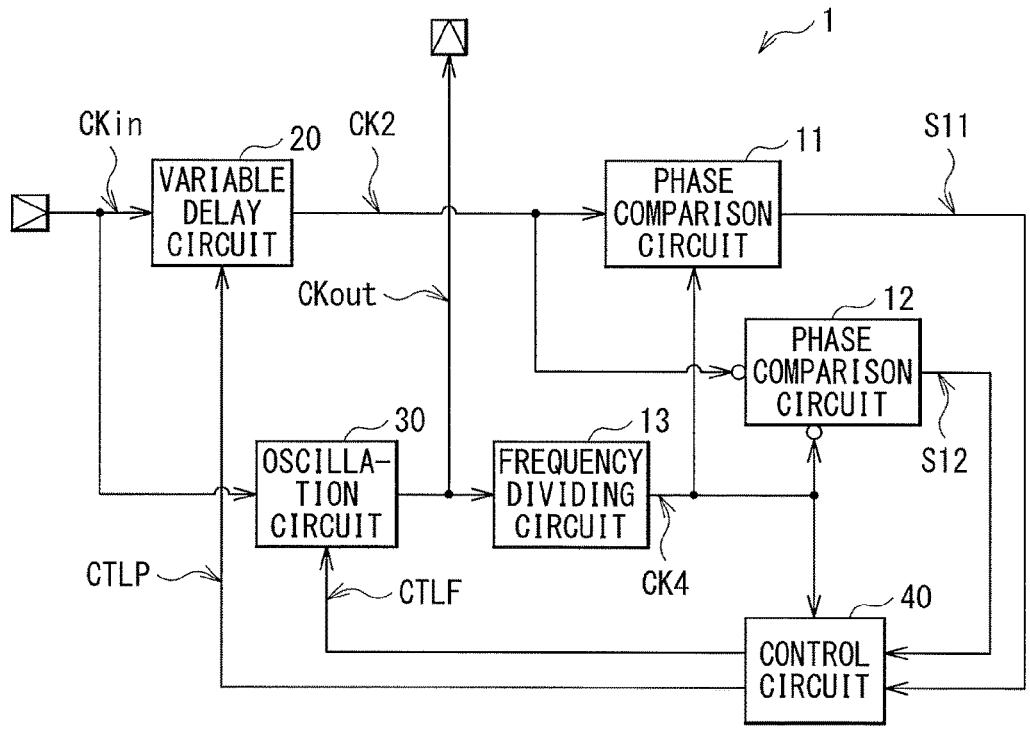
[ FIG. 2 ]
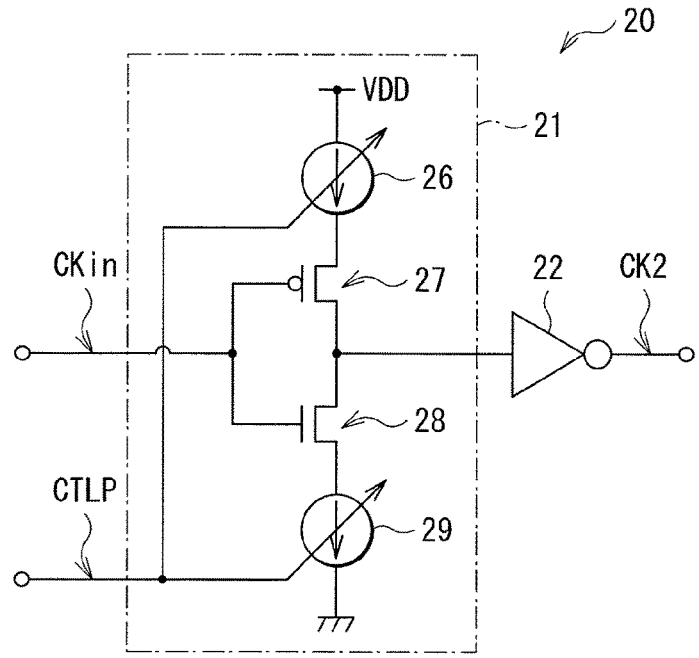

[ FIG. 3 ]
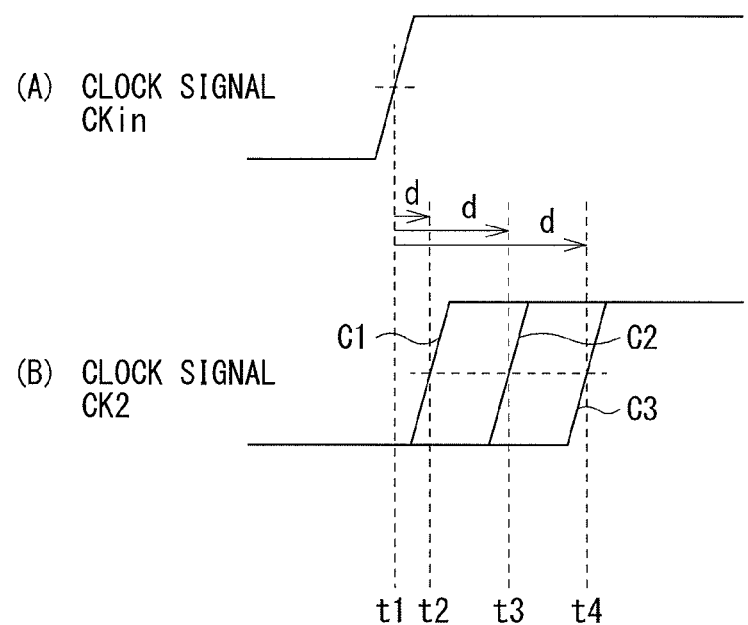

[FIG. 4]
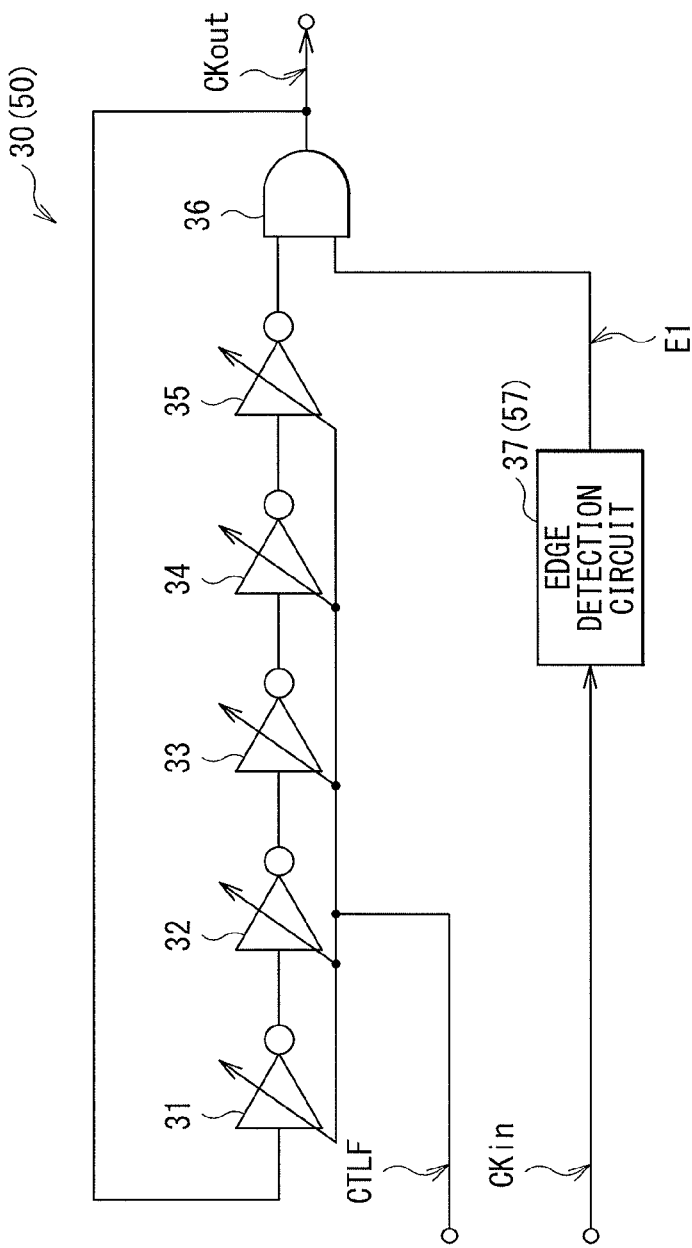

[ FIG. 5 ]
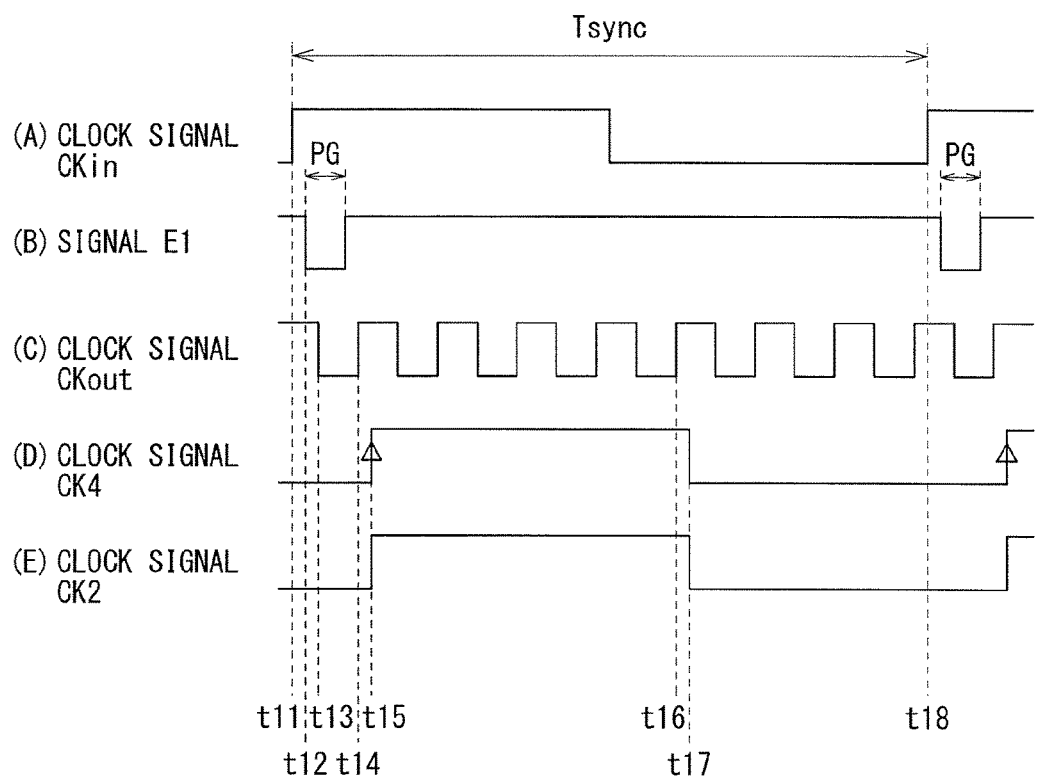

[ FIG. 6 ]
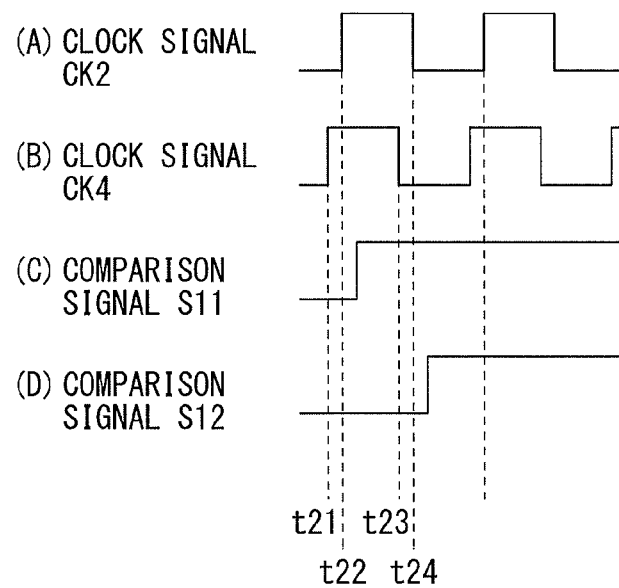
[ FIG. 7 ]
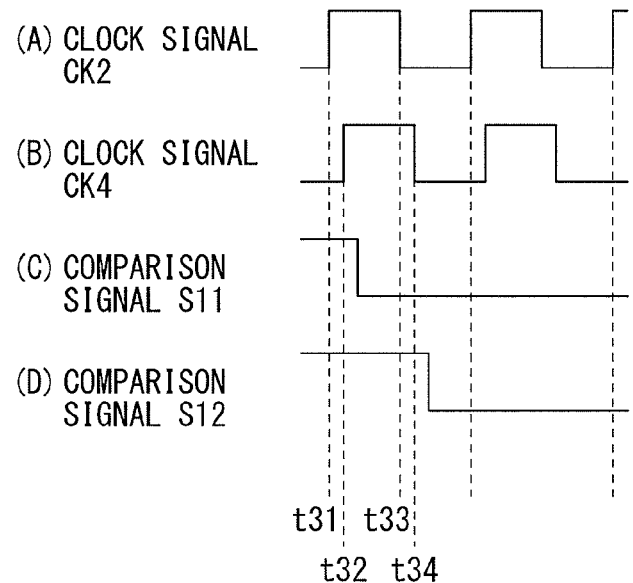

[ FIG. 8 ]
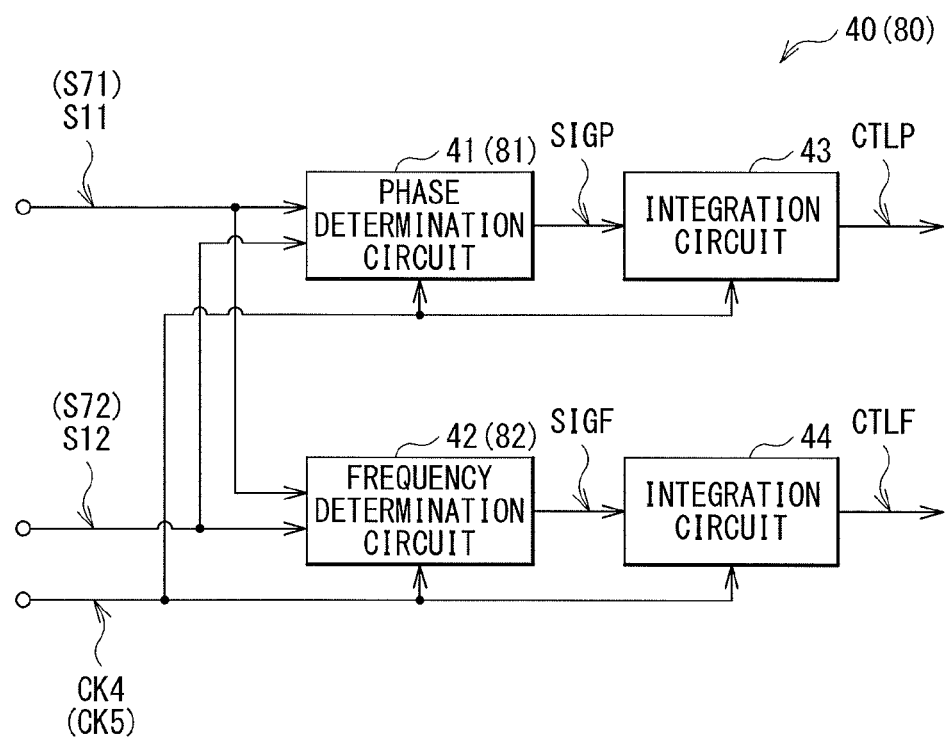

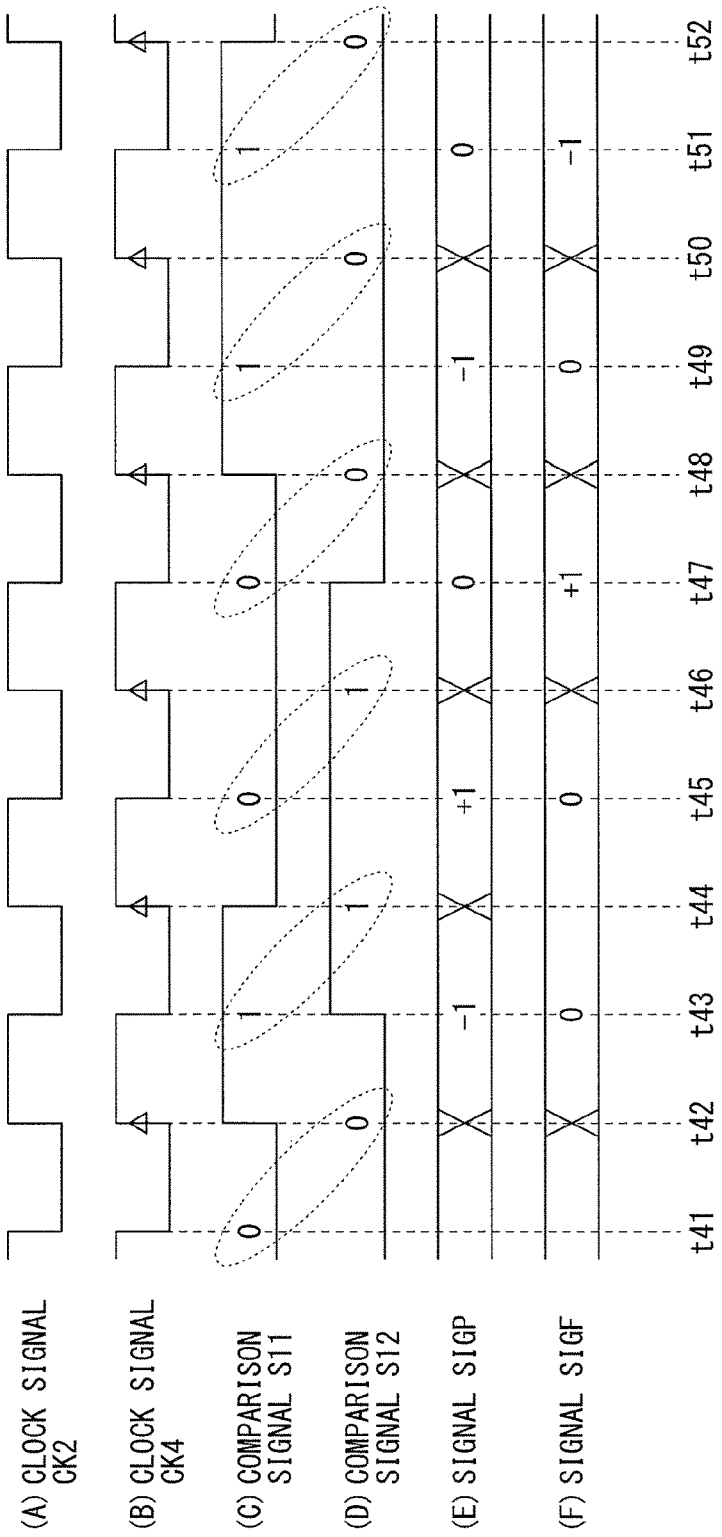
[FIG. 9]

[ FIG. 10 ]
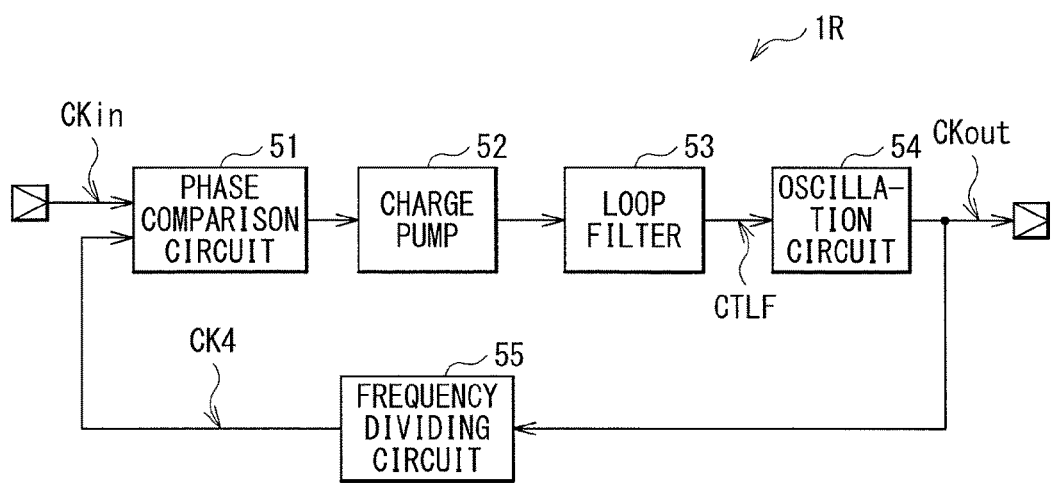
[ FIG. 11 ]
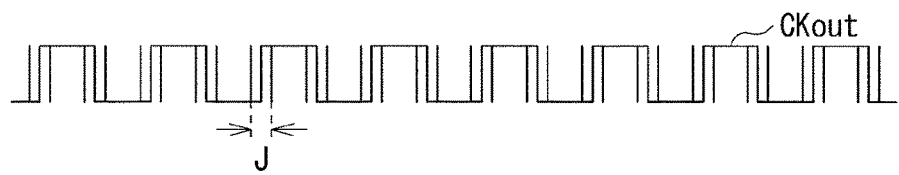

[ FIG. 12 ]
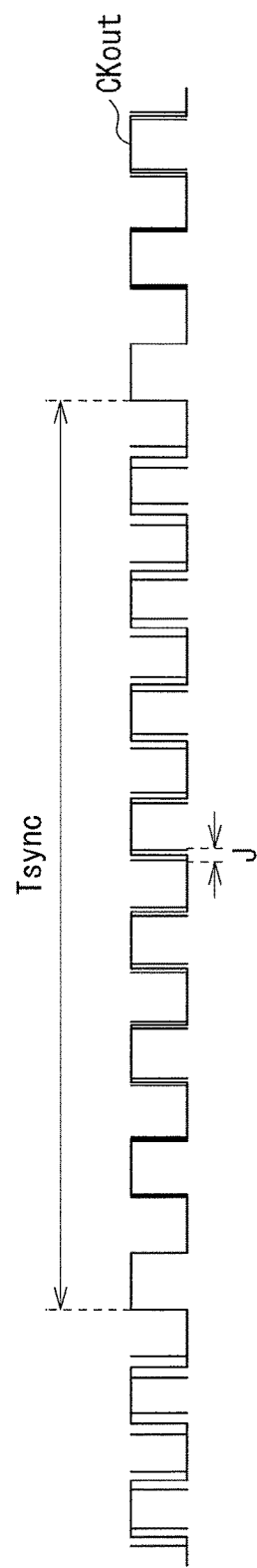

[ FIG. 13 ]
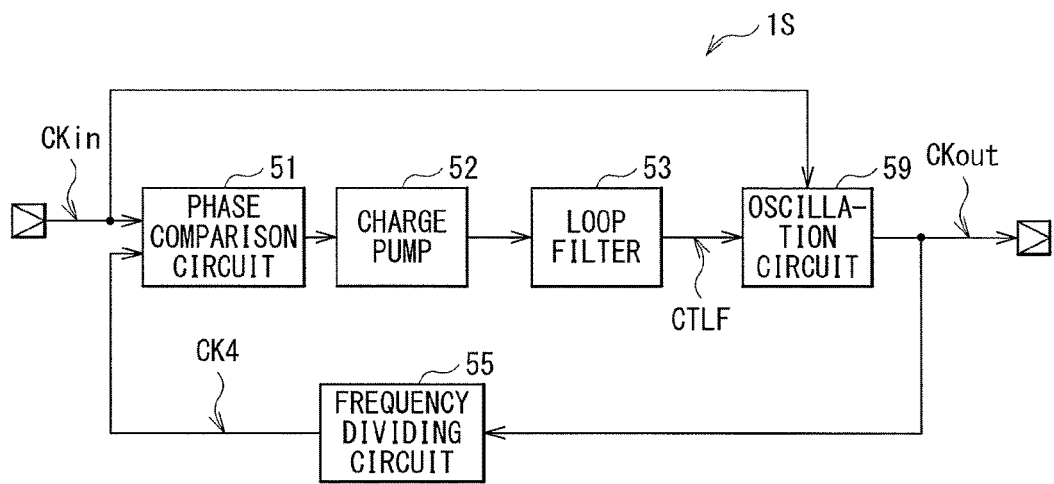

[ FIG. 14 ]
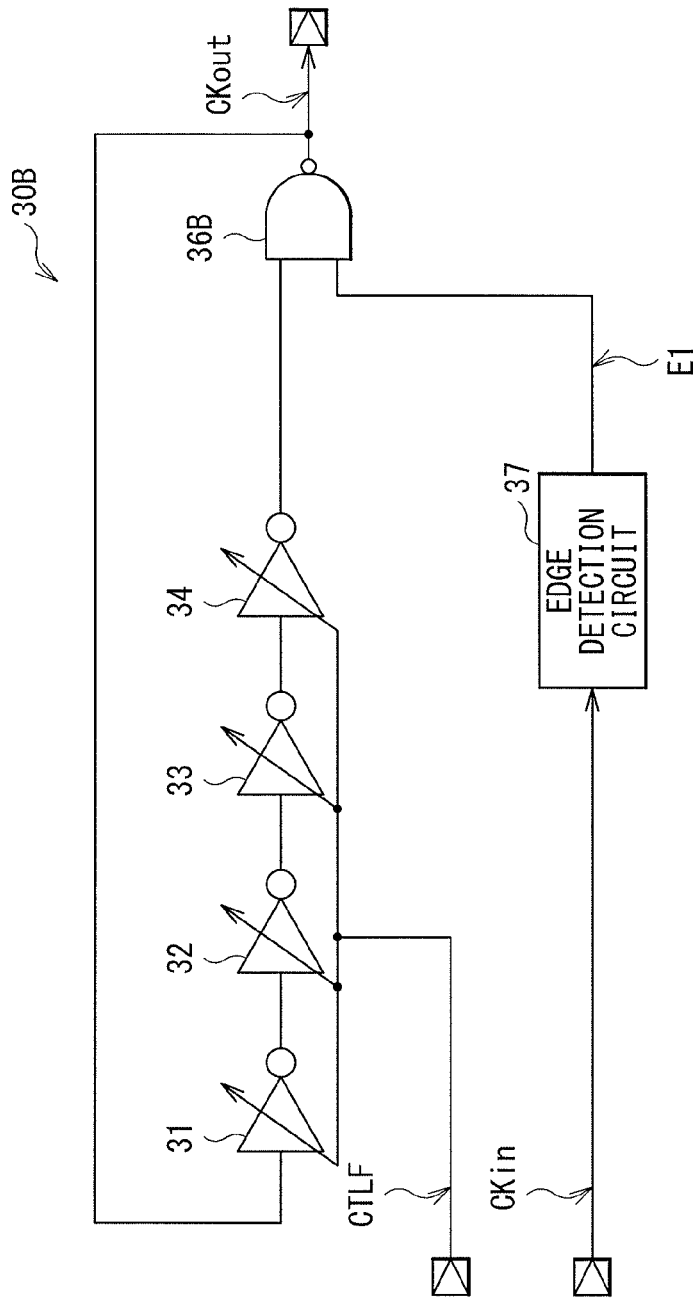

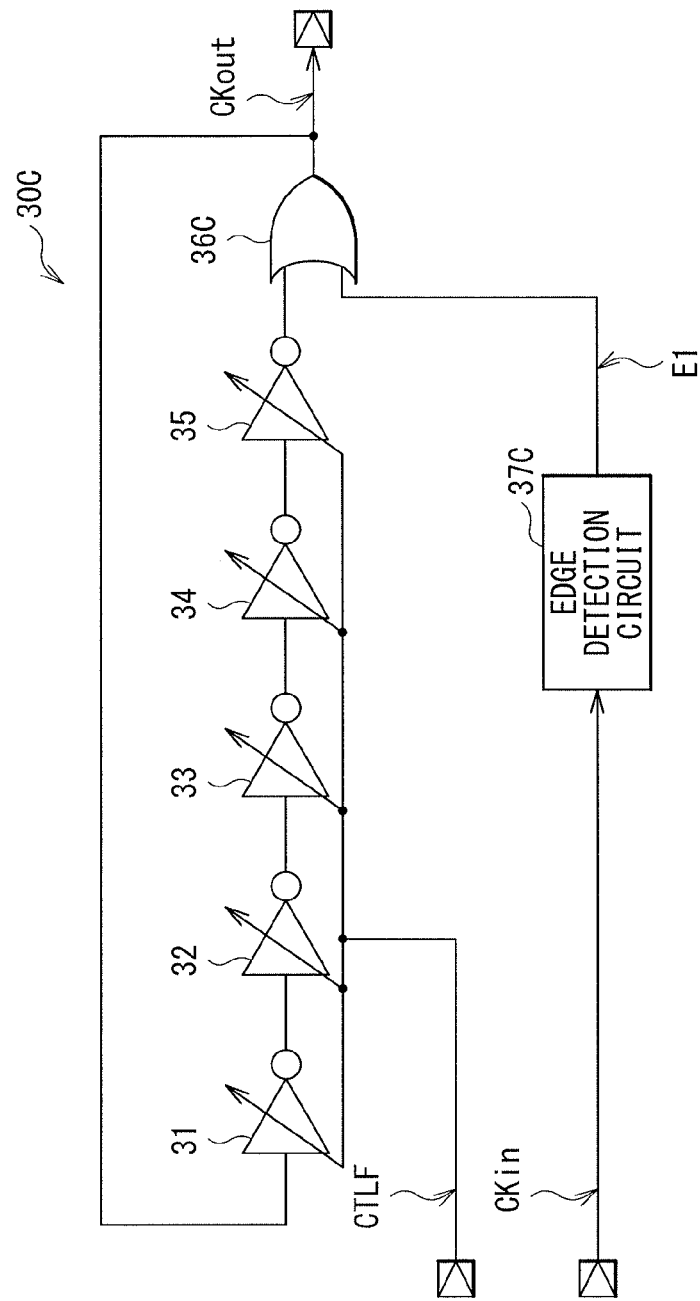
[ FIG. 15 ]

[FIG. 16]
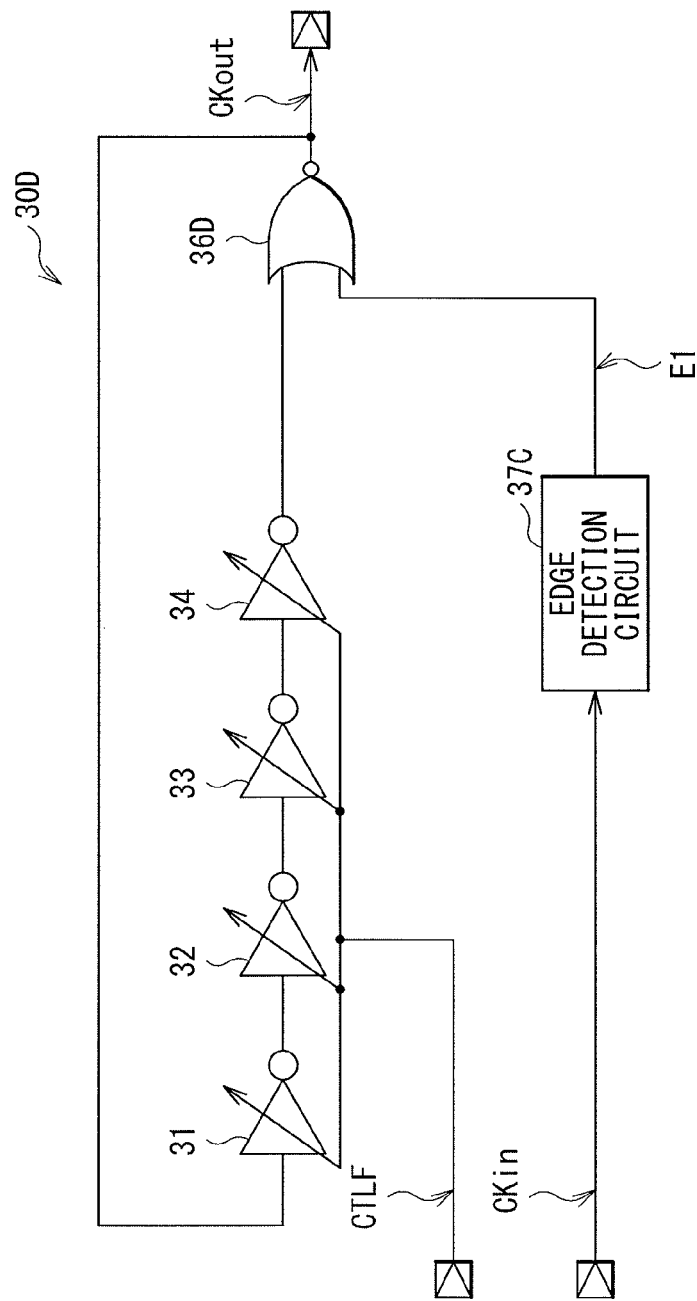

[ FIG. 17 ]
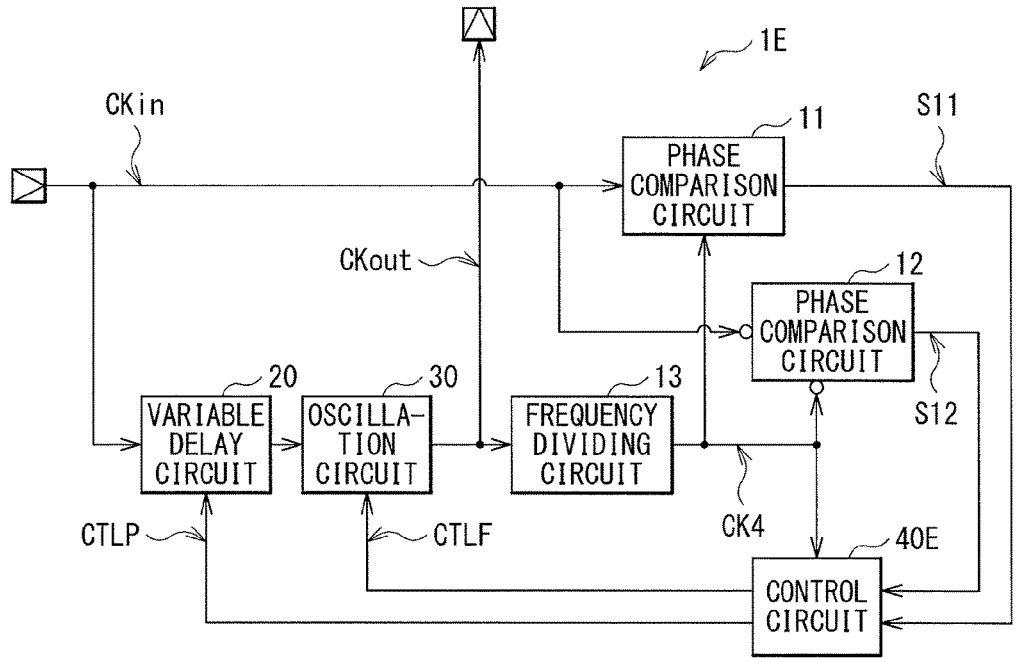
[ FIG. 18 ]
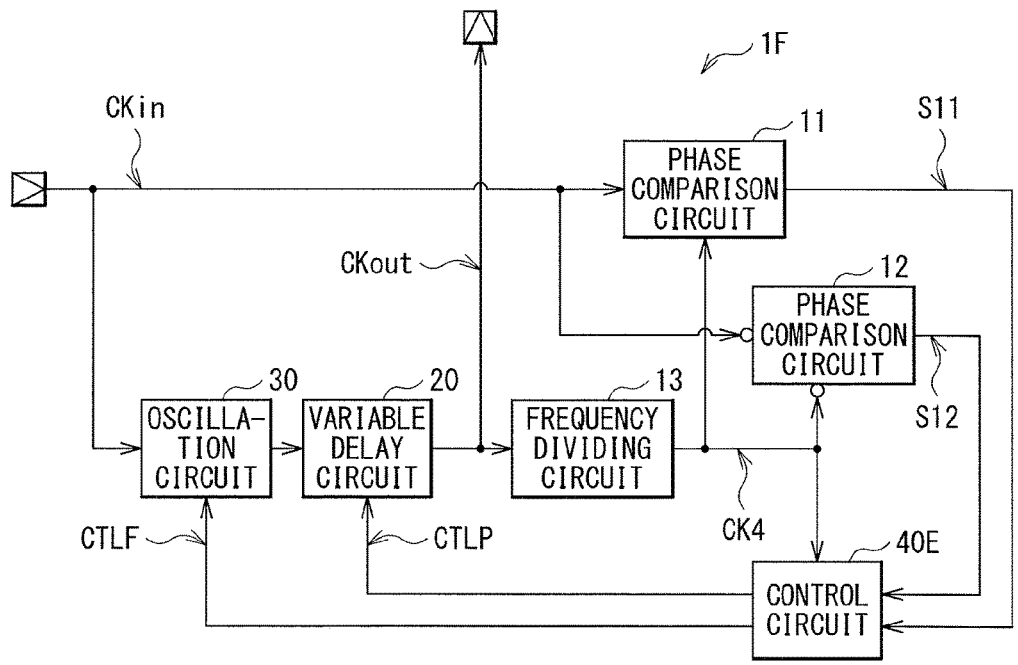

[ FIG. 19 ]
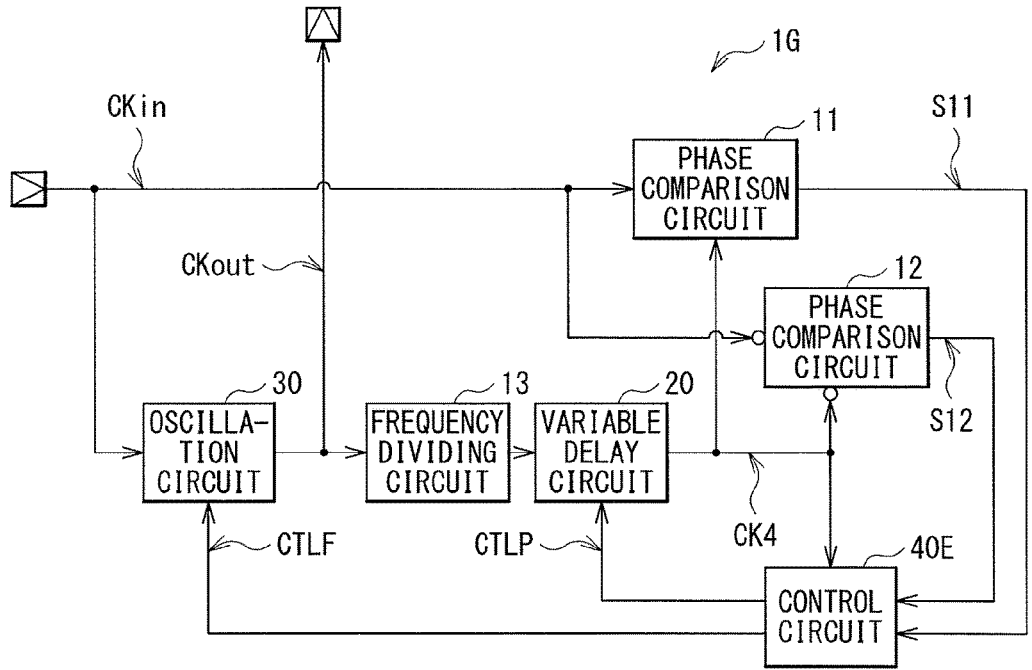
[ FIG. 20 ]
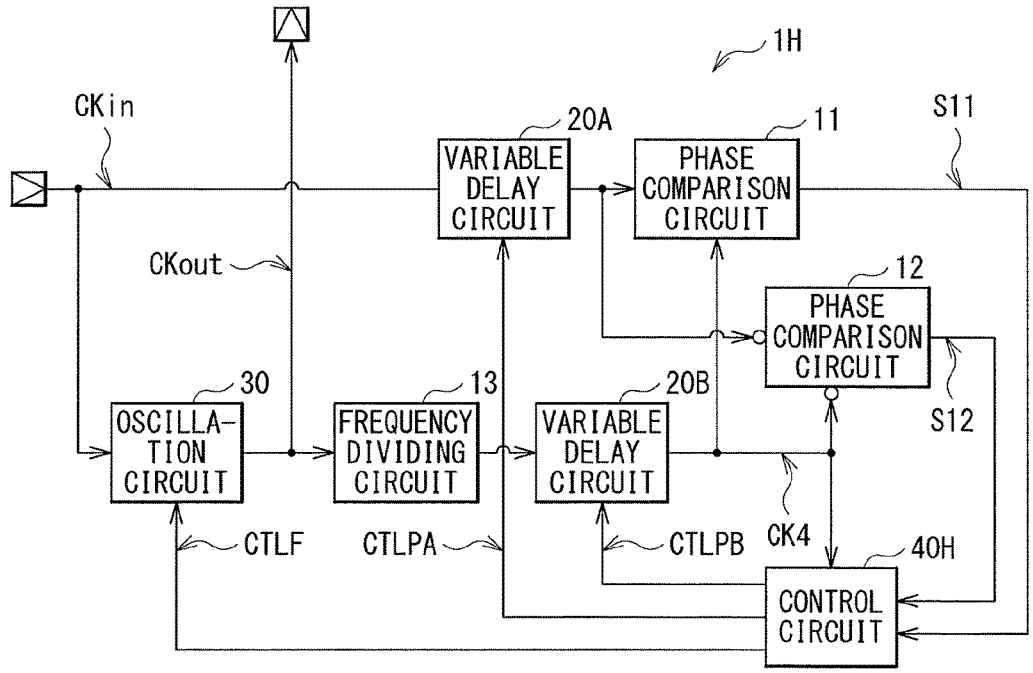

[FIG. 21]
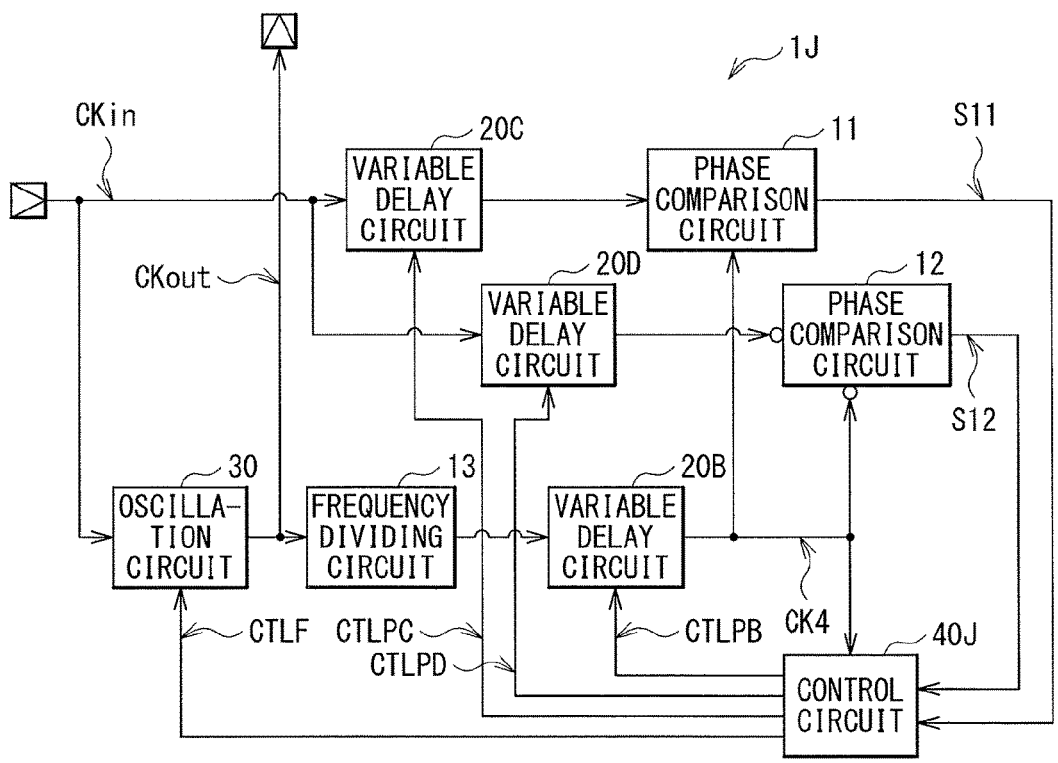

[ FIG. 22 ]
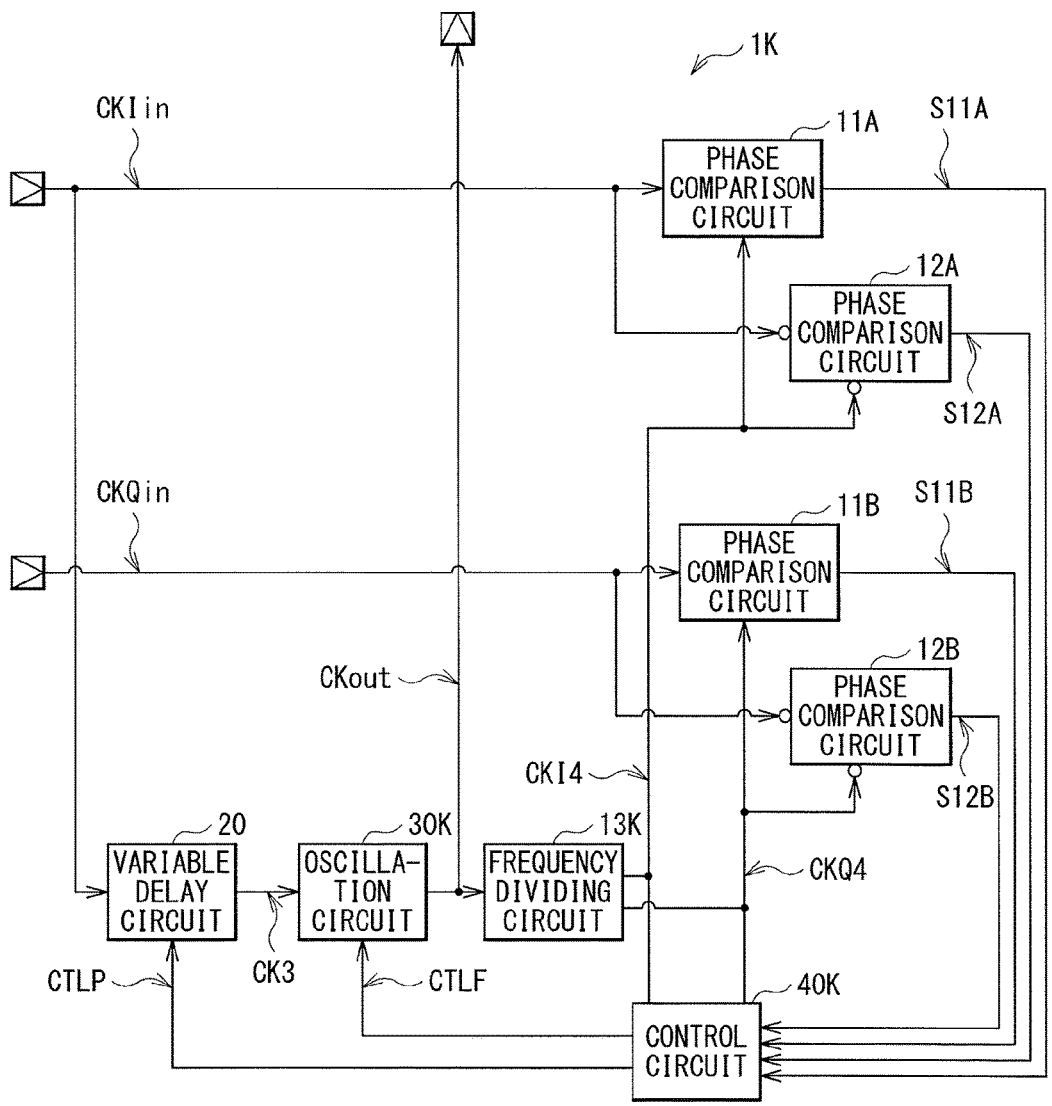

[ FIG. 23 ]
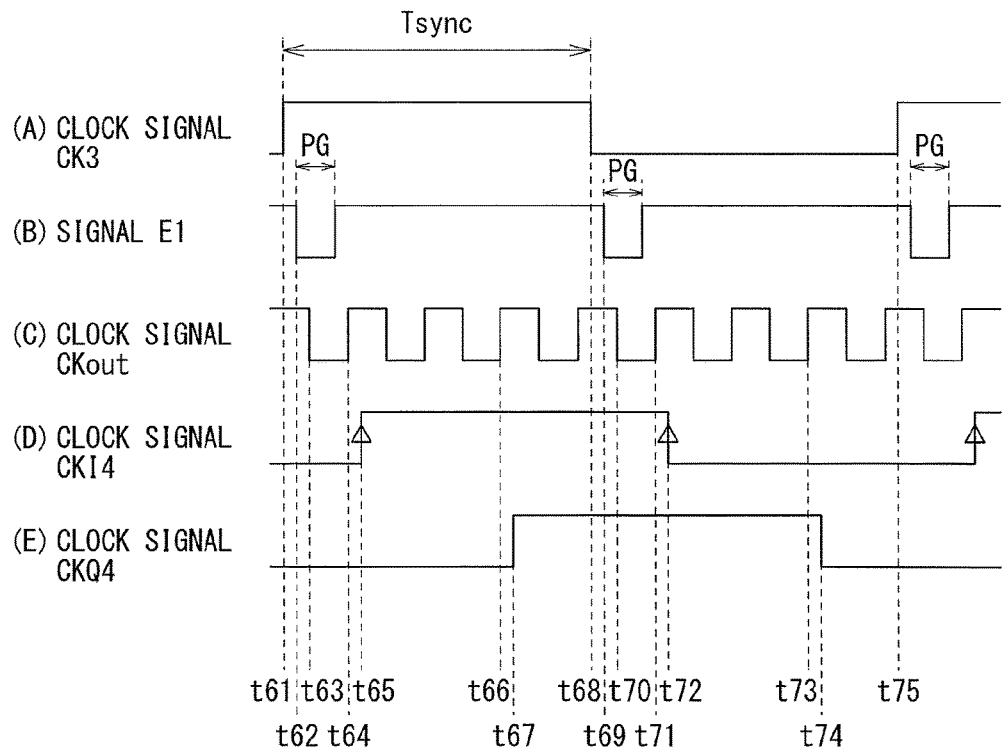
[ FIG. 24 ]
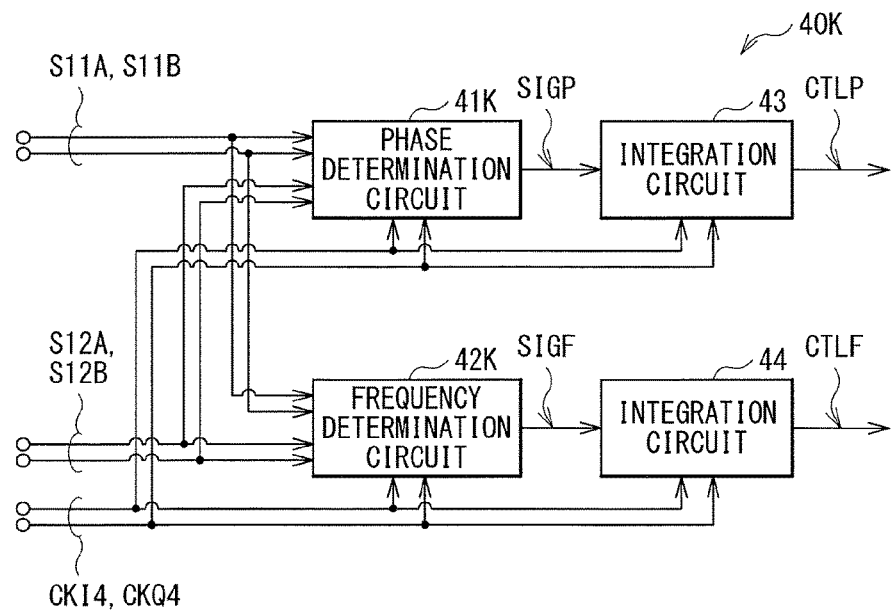

[ FIG. 25 ]
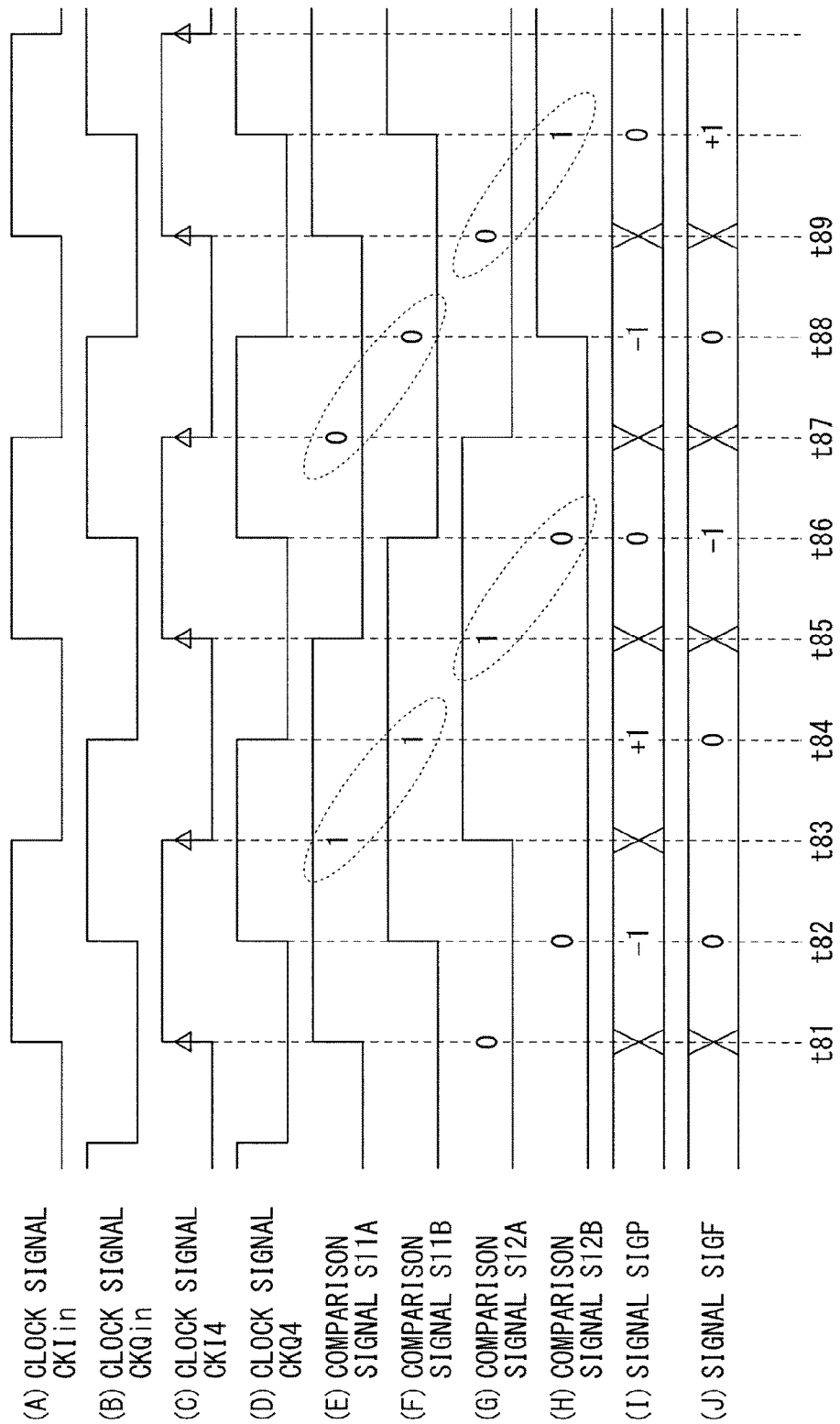

[ FIG. 26 ]
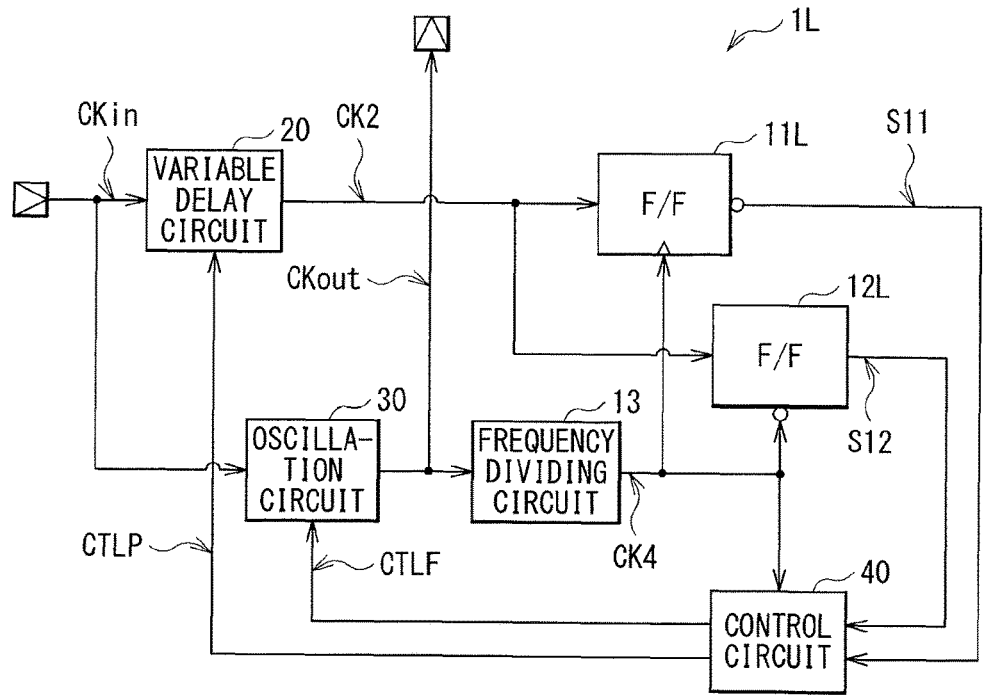
[ FIG. 27 ]
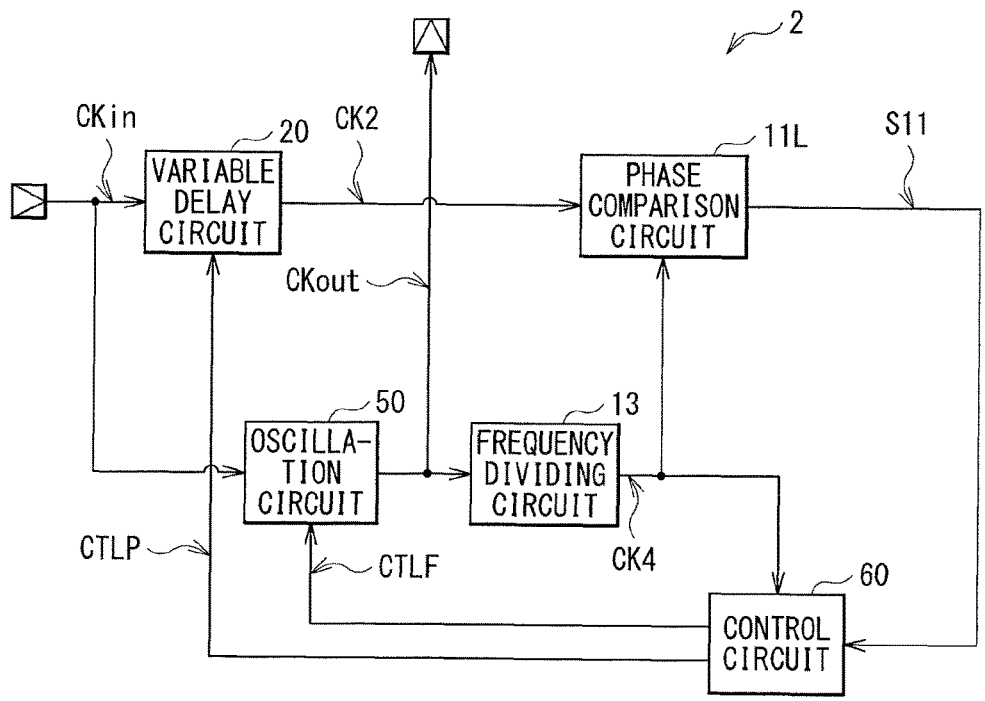

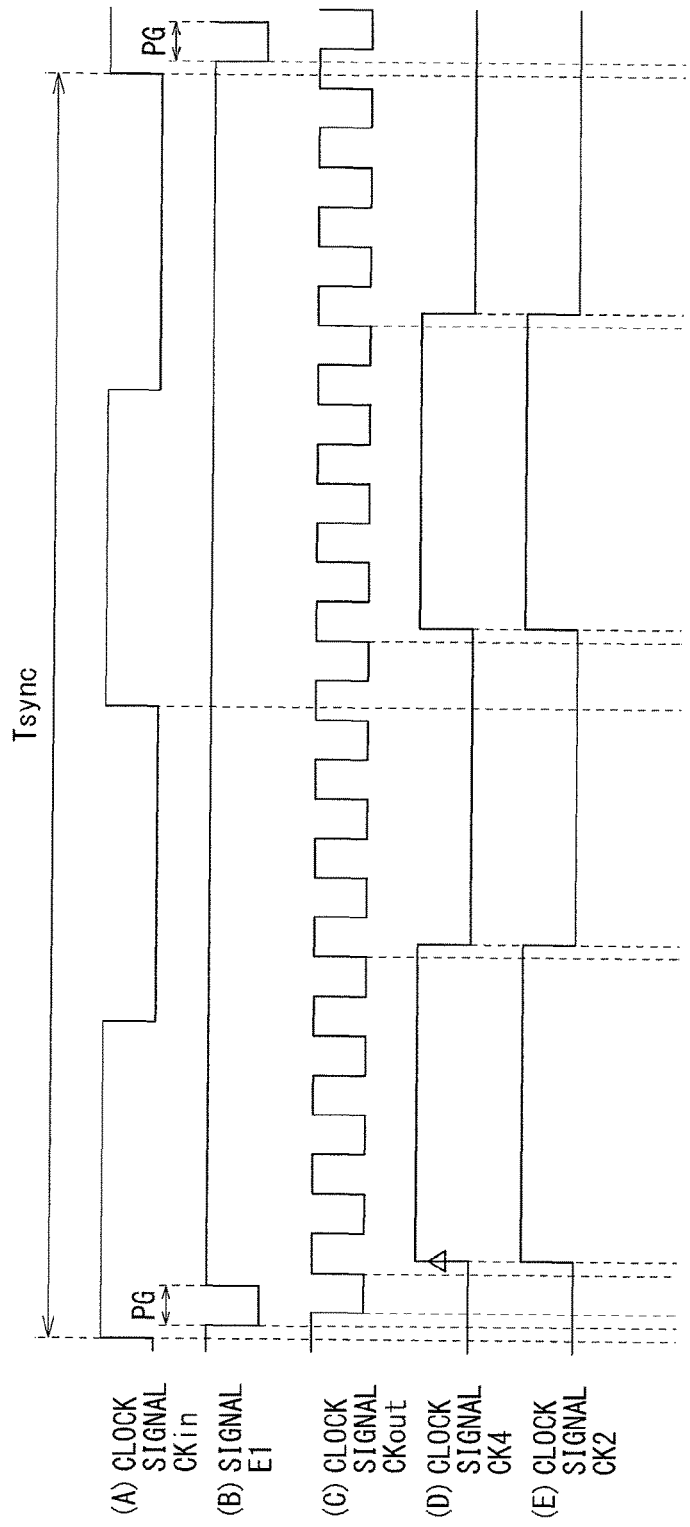
[FIG. 28]

[ FIG. 29 ]
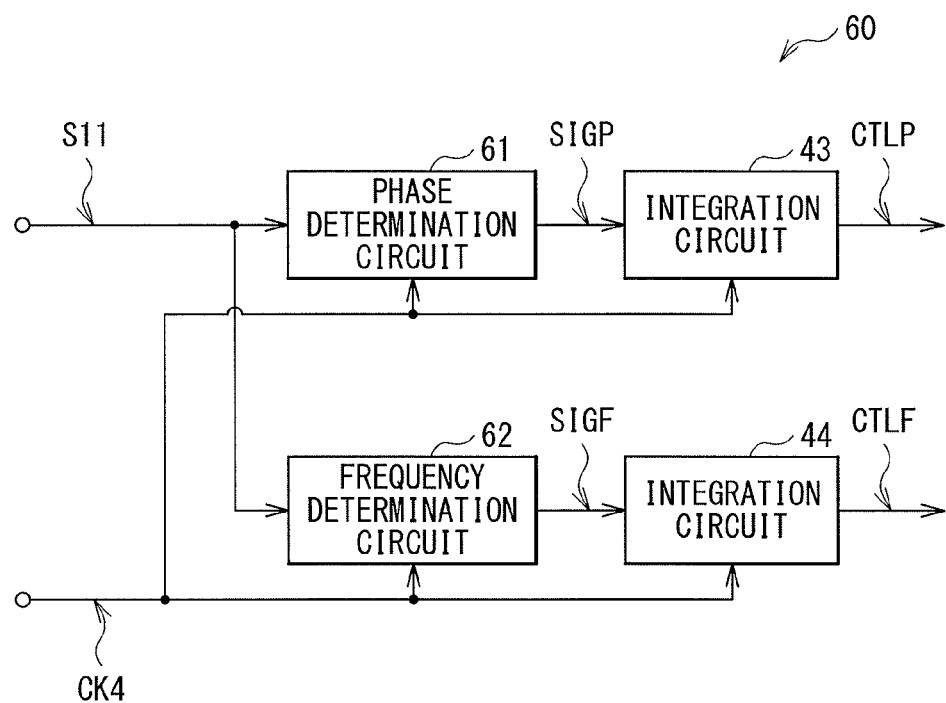

[ FIG. 30 ]
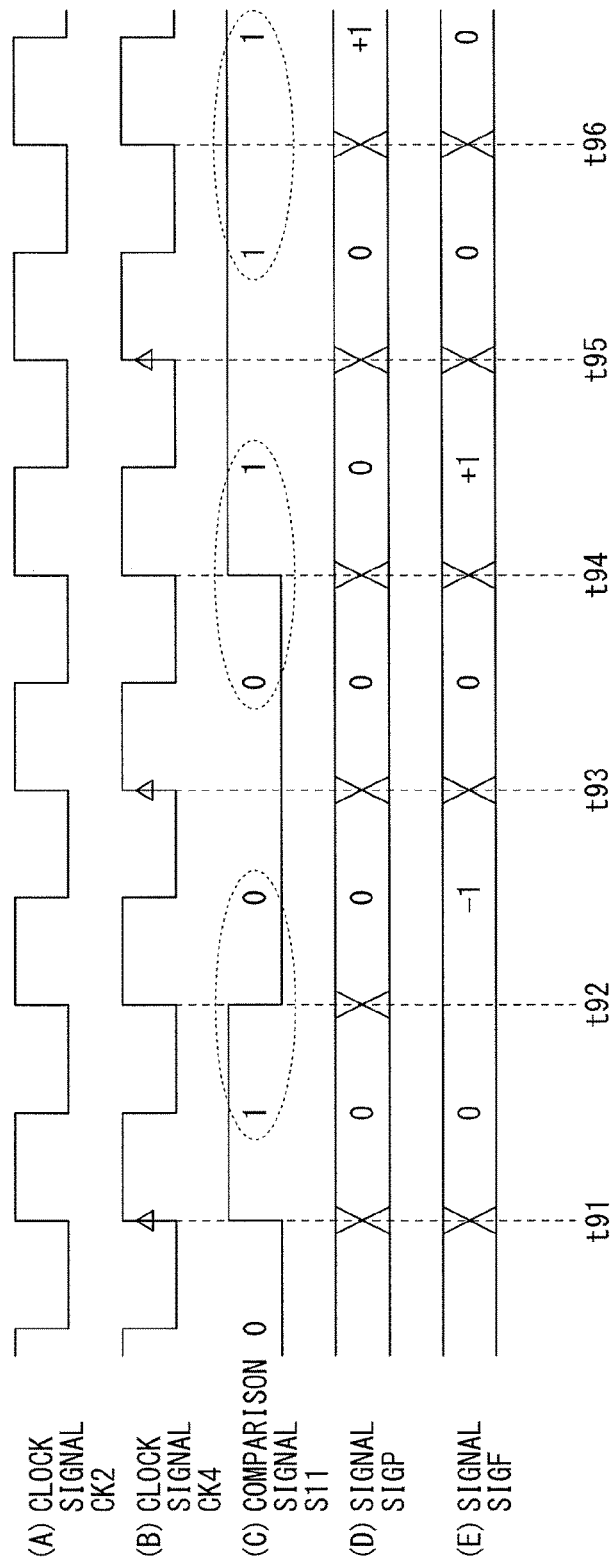

[ FIG. 31 ]
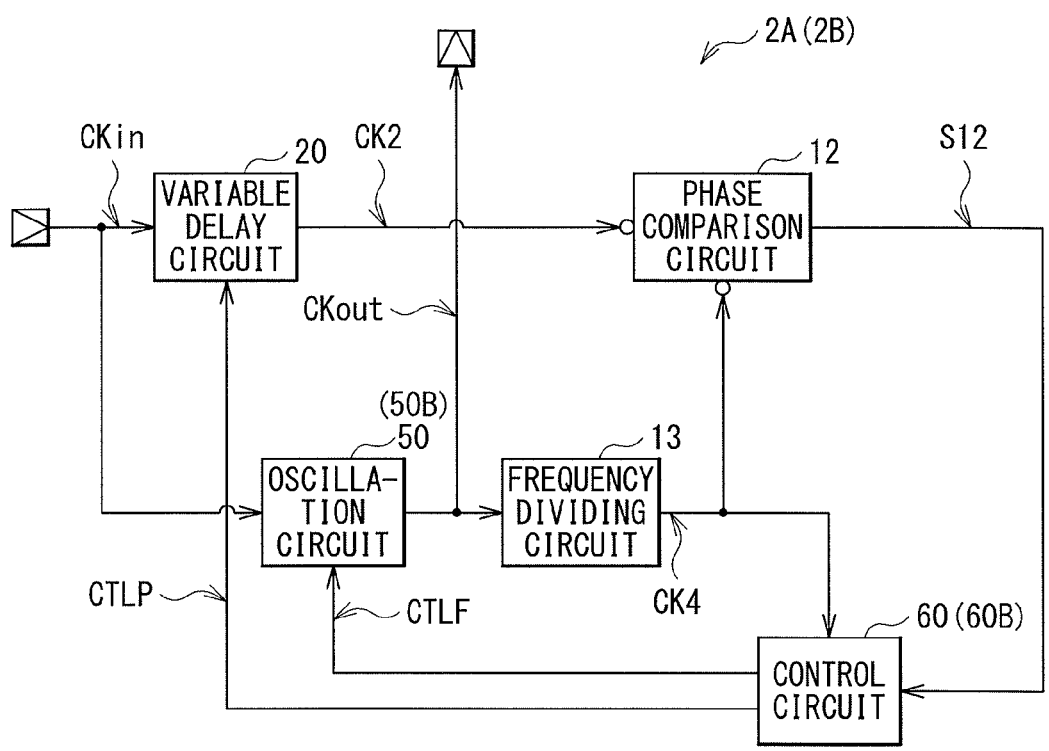

[ FIG. 32 ]
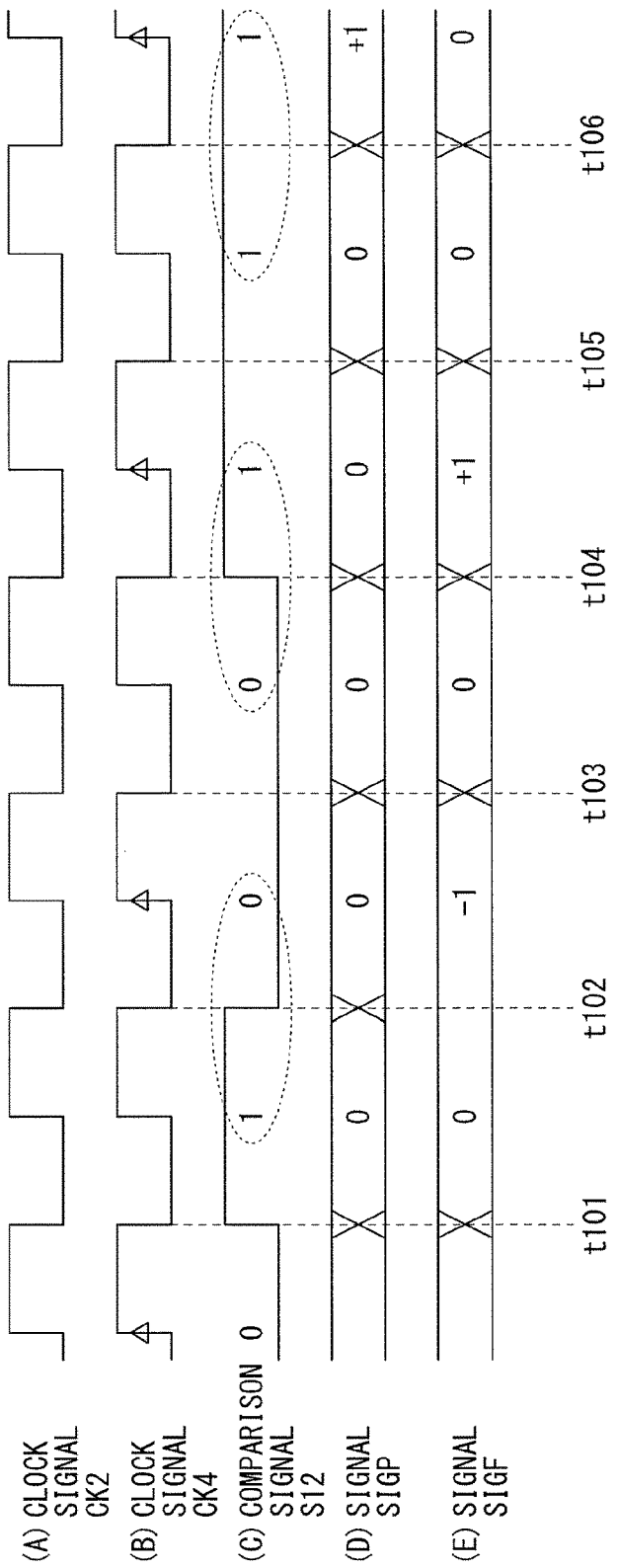

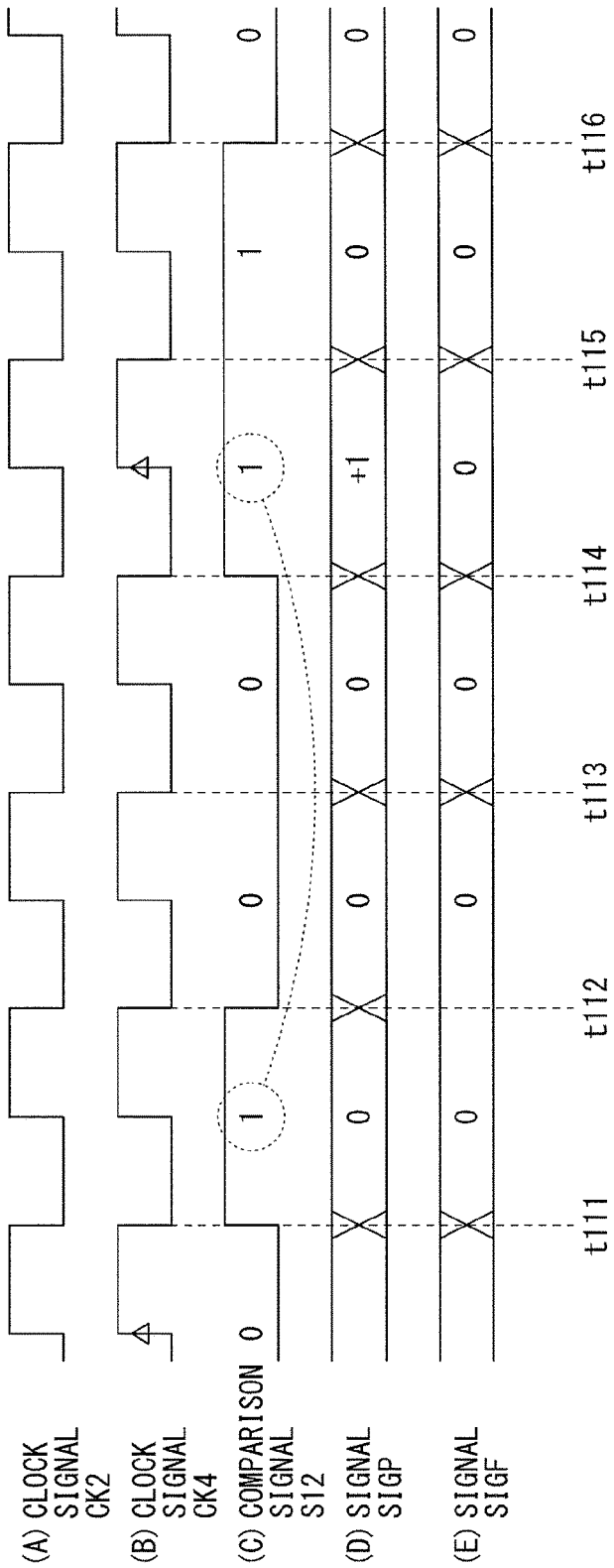
[FIG. 33]

[ FIG. 34 ]
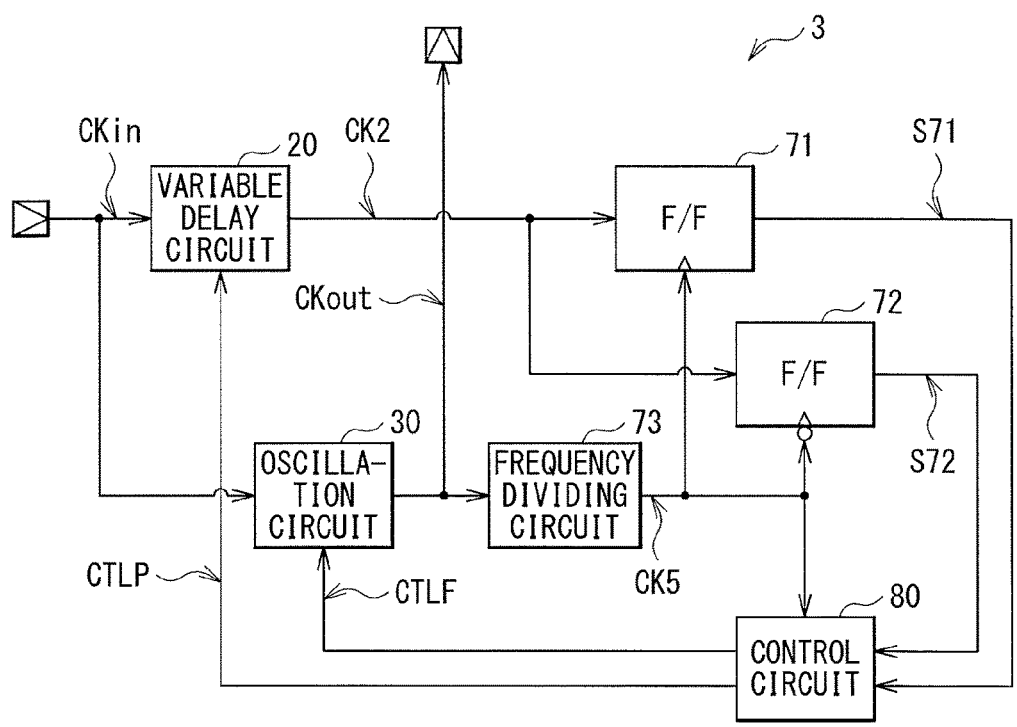

[ FIG. 35 ]
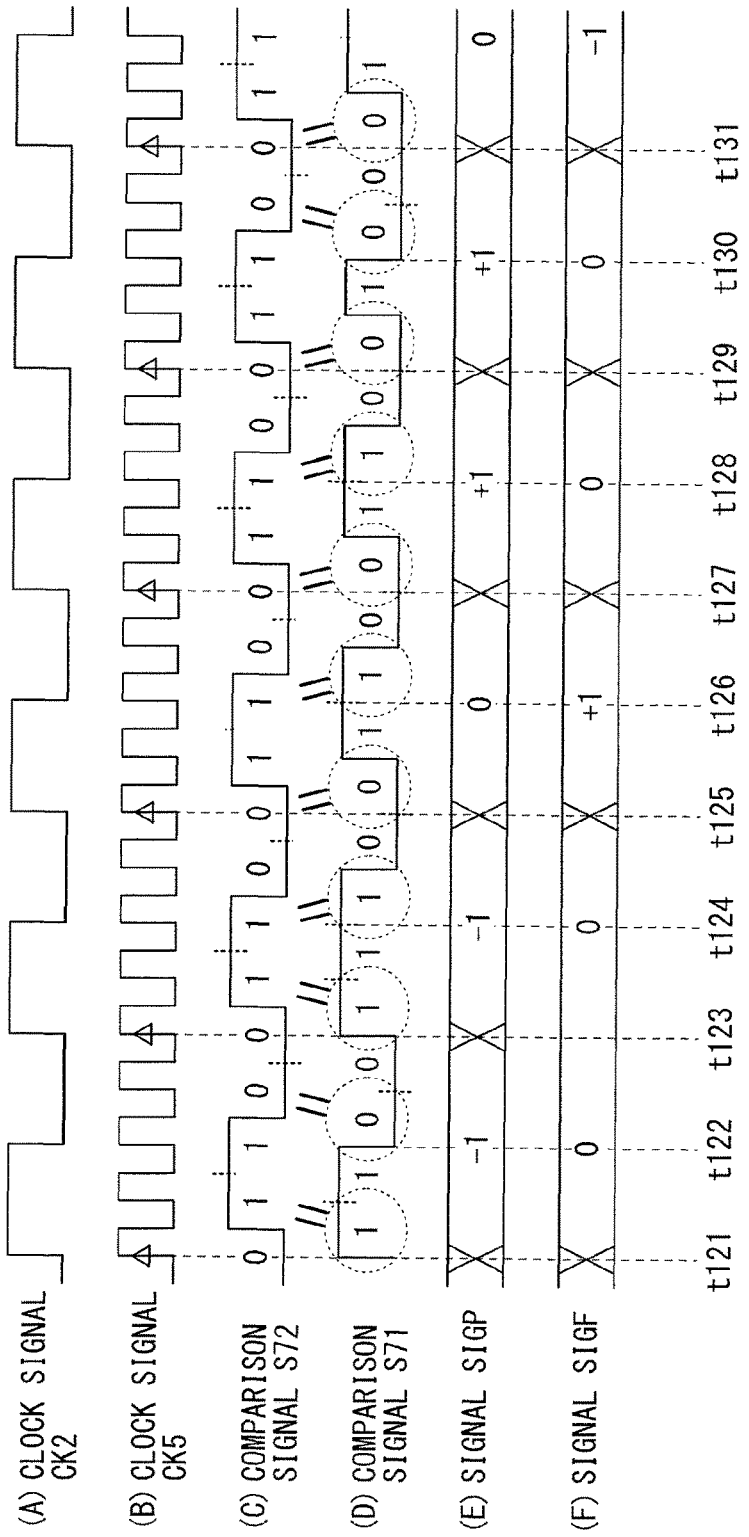

[FIG. 36]
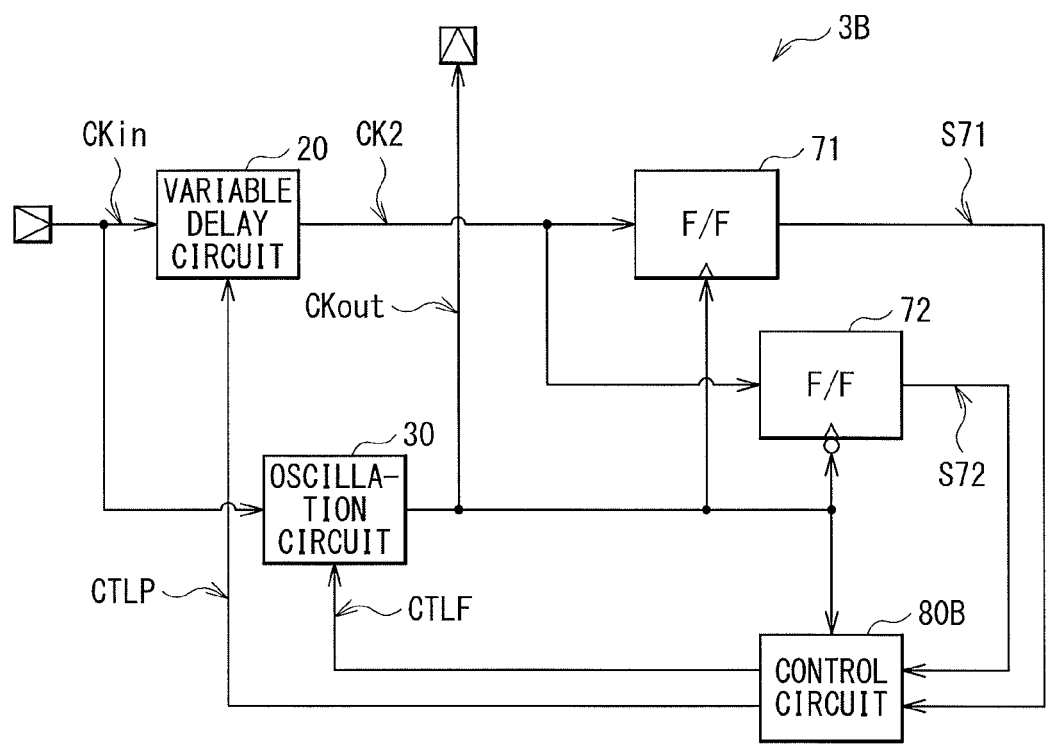

[ FIG. 37 ]
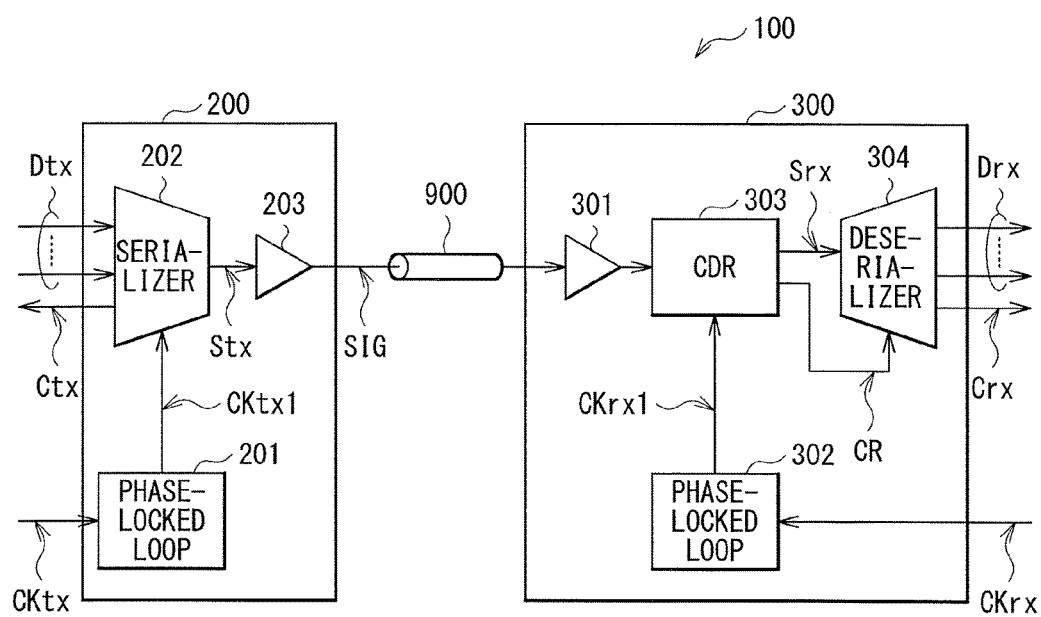

[ FIG. 38 ]
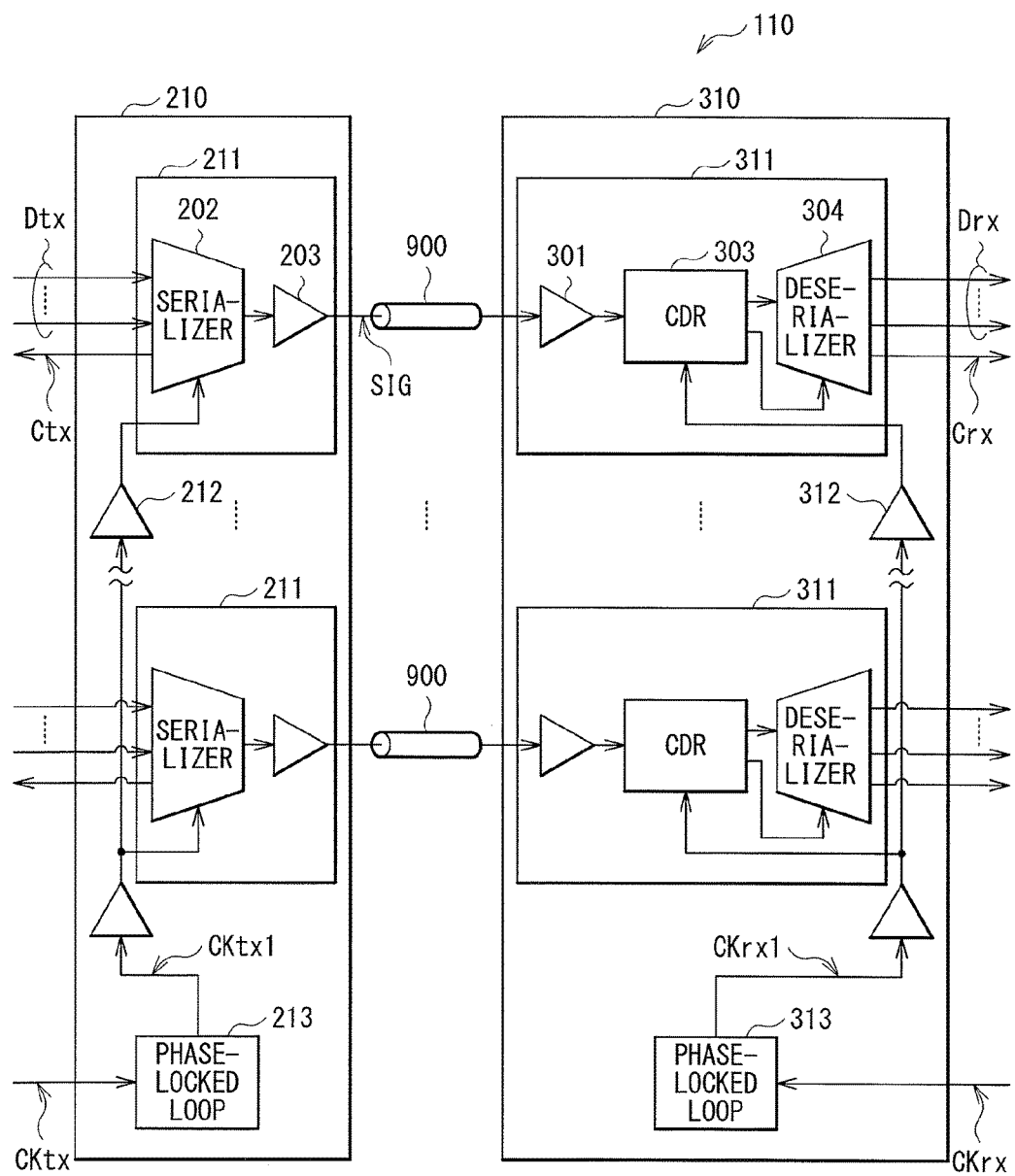

[FIG. 39]
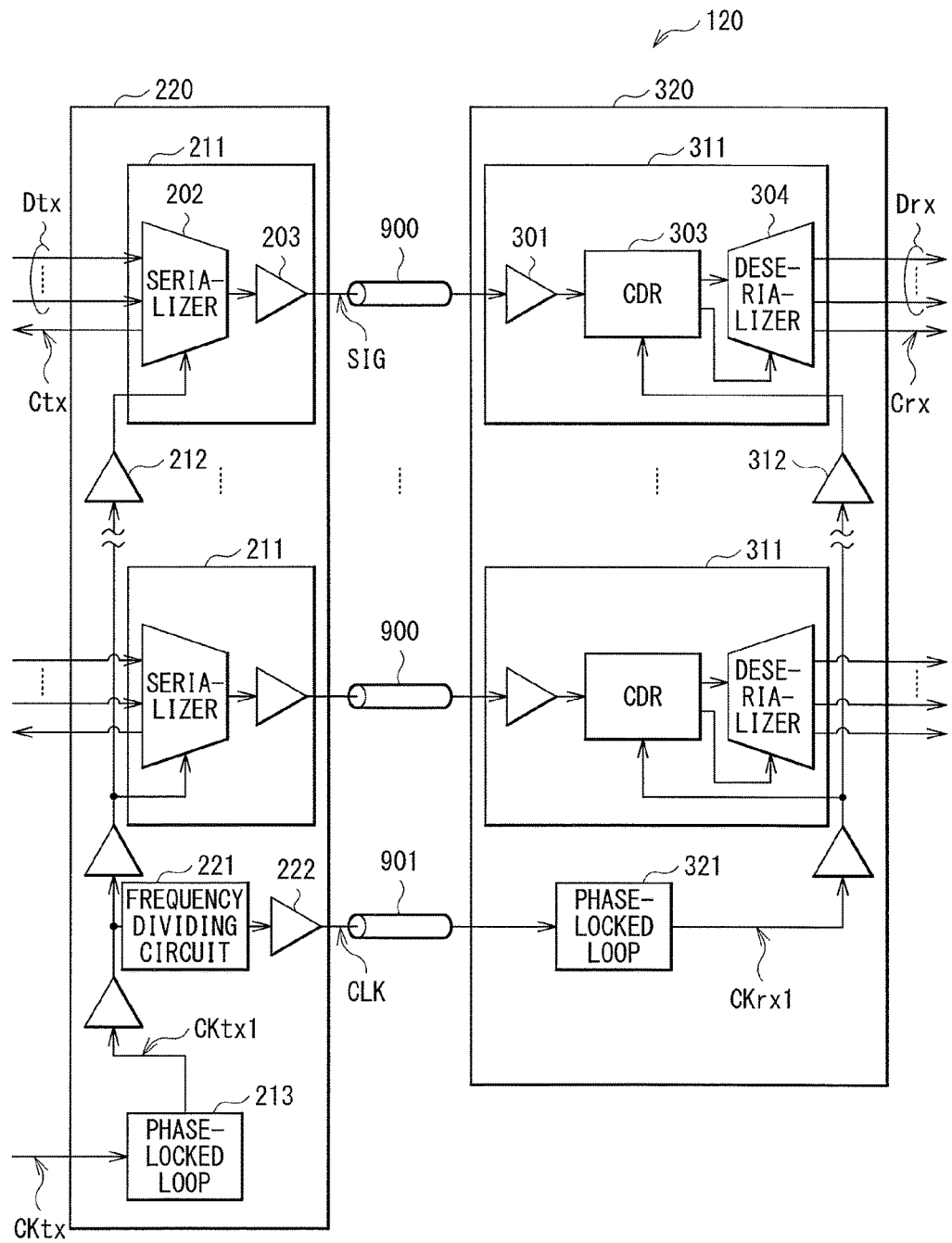

[ FIG. 40 ]
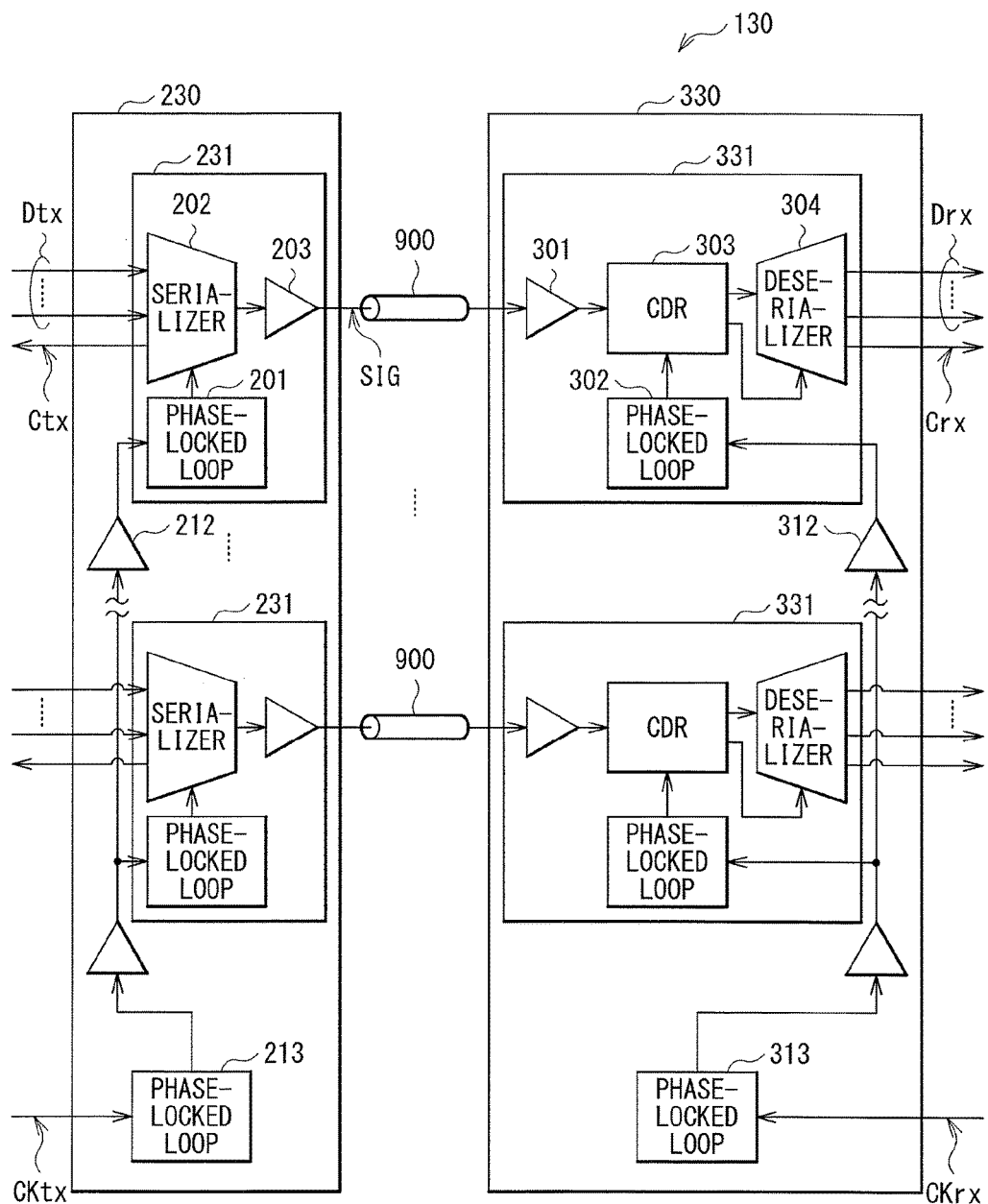

[ FIG. 41 ]
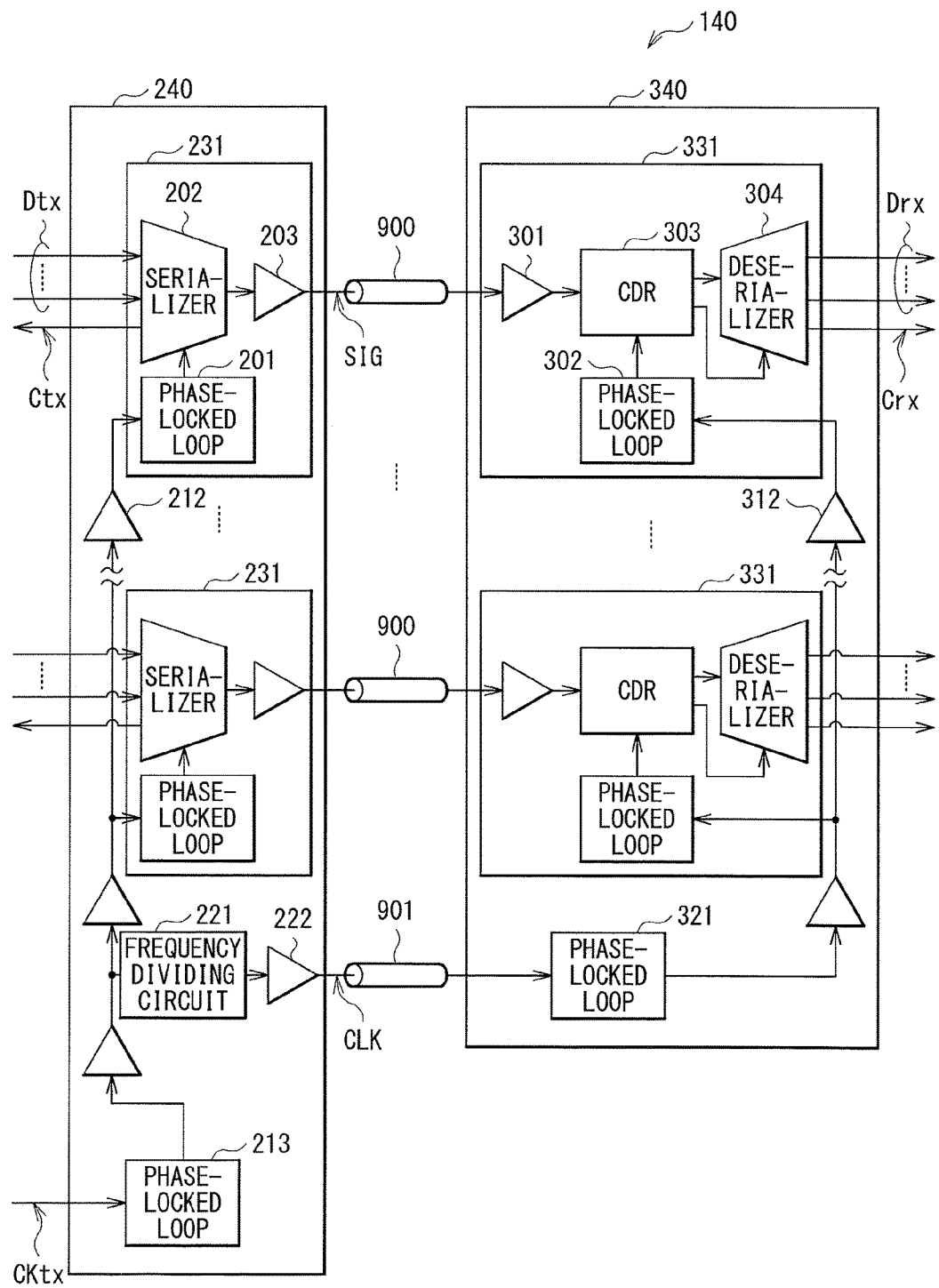

[ FIG. 42 ]
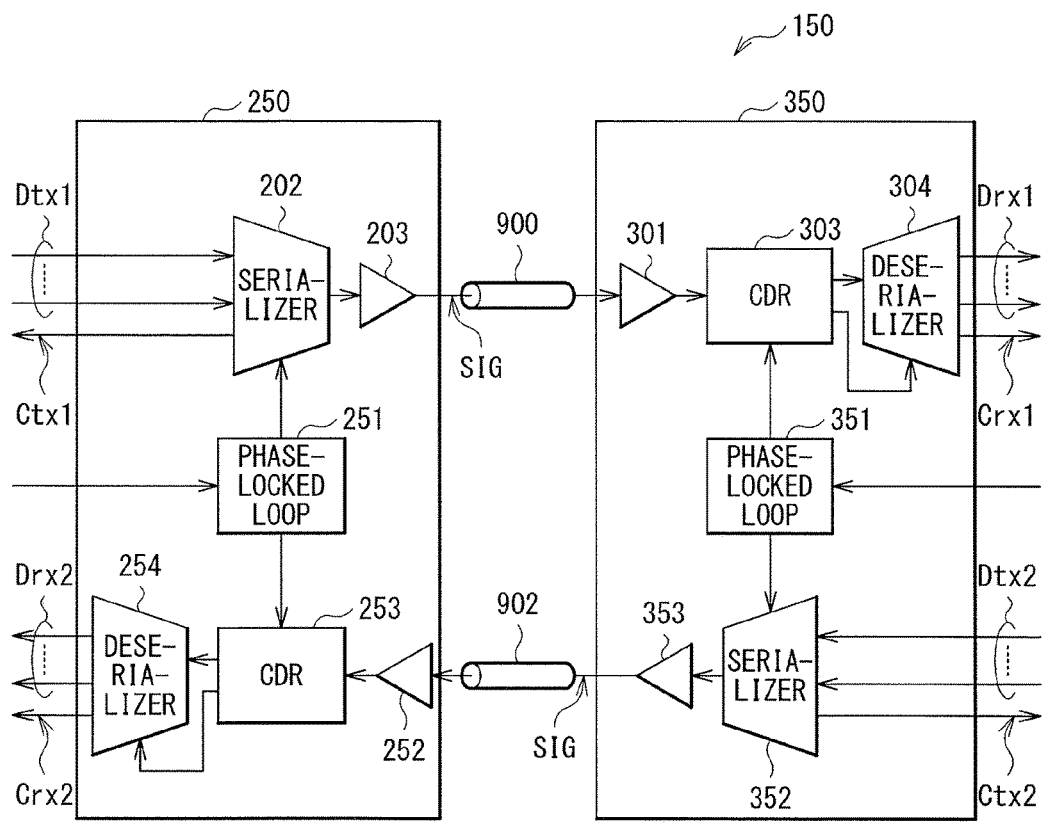

[ FIG. 43 ]
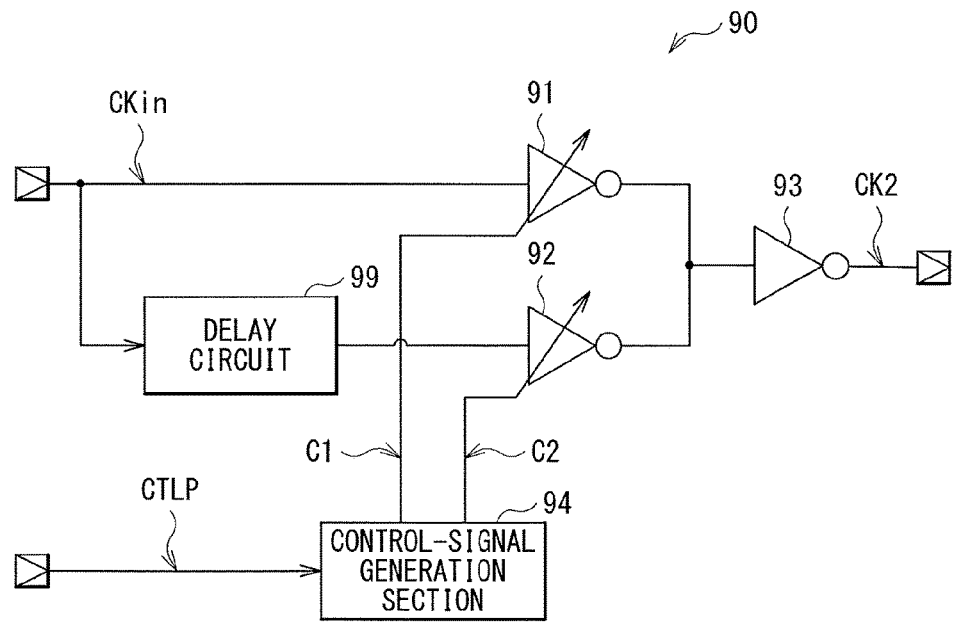
[ FIG. 44 ]
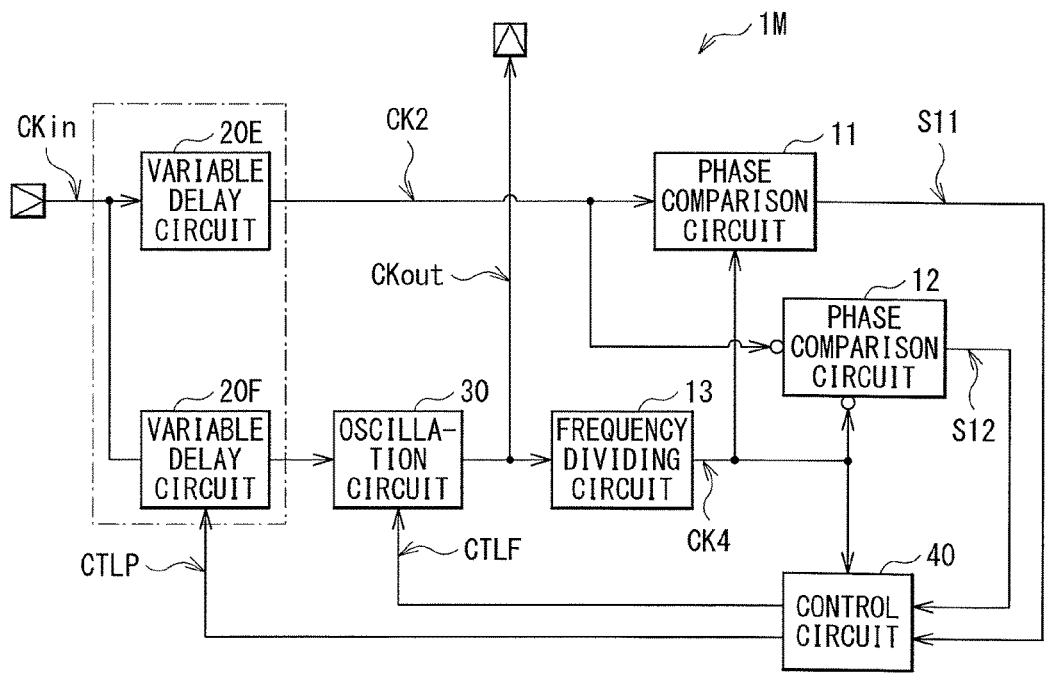

[ FIG. 45 ]
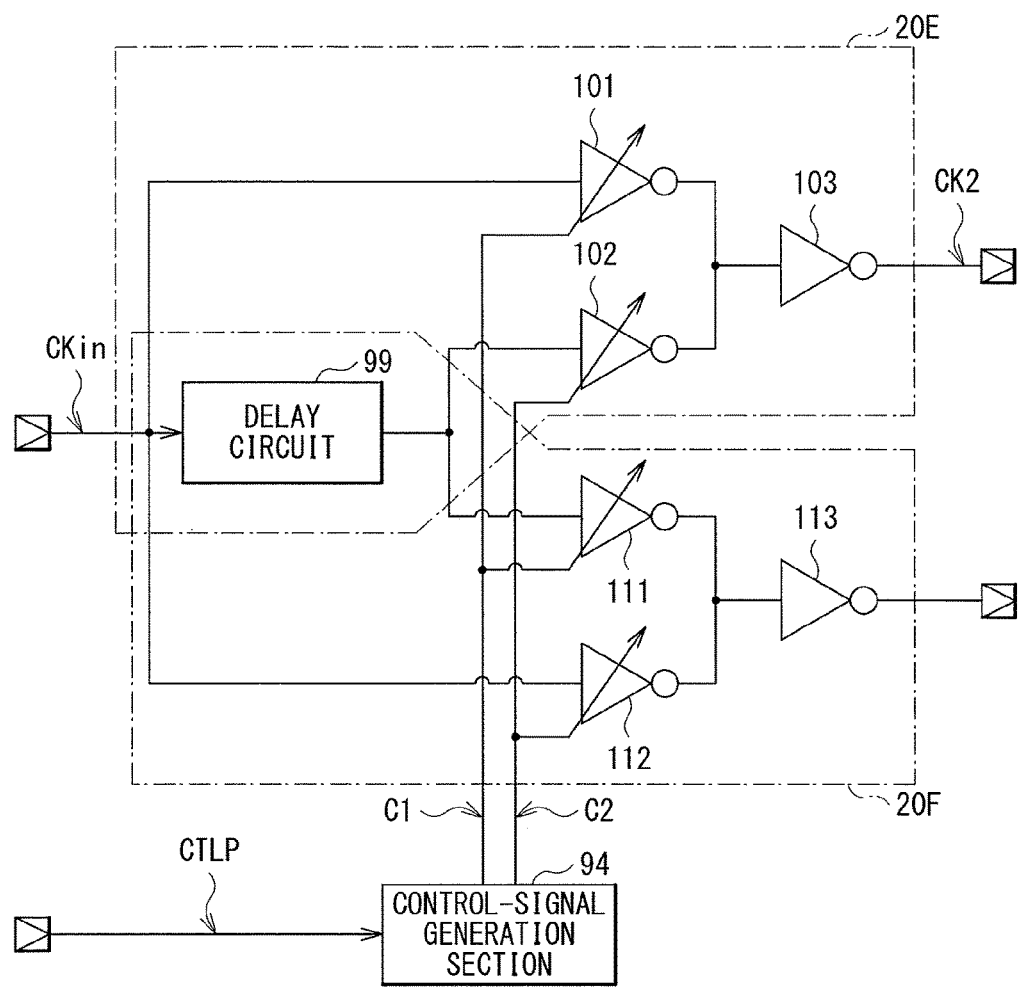

PHASE-LOCKED LOOP, PHASE-LOCKING METHOD, AND COMMUNICATION UNIT

TECHNICAL FIELD

The disclosure relates to a phase-locked loop that generates a clock signal synchronized with an input clock signal, a phase-locking method used for such a phase-locked loop, and a communication unit including such a phase-locked loop.

BACKGROUND ART

An electronic apparatus is often equipped with a phase-locked loop. For example, a communication system often communicates on the basis of a clock signal generated by the phase-locked loop. Specifically, for example, a transmission unit transmits a data signal, using a clock signal generated by the phase-locked loop. Further, for example, a receiving unit receives a data signal, using a clock signal generated by the phase-locked loop. NPL 1 discloses a phase-locked loop usable in such a communication system.

CITATION LIST

Patent Literature

NPL 1: Jri Lee and Huaide Wang, "Study of Subharmonically Injection-Locked PLLs", IEEE JOURNAL OF SOLID-STATE CIRCUITS, VOL. 44, NO. 5, May 2009

SUMMARY OF INVENTION

In general, high quality of a clock signal to be generated is desired in a phase-locked loop, and further enhancement in the quality is expected.

It is desirable to provide a phase-locked loop, a phase-locking method, and a communication unit that make it possible to enhance quality of a clock signal.

A phase-locked loop according to an embodiment of the disclosure includes a detector, an oscillator, an adjuster, and a controller. The detector detects a transition of an input clock signal. The oscillator generates a clock signal having a frequency corresponding to a first control signal, and changes a phase of the clock signal on a basis of a detection result in the detector. The adjuster adjusts a phase difference between a phase of the input clock signal and the phase of the clock signal depending on a second control signal. The controller compares the phase of the input clock signal and the phase of the clock signal at a plurality of comparison timings, and generates the first control signal and the second control signal on a basis of a result of the comparison.

A phase-locking method according to an embodiment of the disclosure includes: detecting a transition of an input clock signal; generating a clock signal having a frequency corresponding to a first control signal, and changing a phase of the clock signal on a basis of the transition of the input clock signal; adjusting a phase difference between a phase of the input clock signal and the phase of the clock signal depending on a second control signal; and comparing the phase of the input clock signal and the phase of the clock signal at a plurality of comparison timings, and generating the first control signal and the second control signal on a basis of a result of the comparison.

A communication unit according to an embodiment of the disclosure includes a first phase-locked section and a communication section. The first phase-locked section generates a clock signal. The communication section performs communication by using the clock signal. The first phase-locked section includes a detector, an oscillator, an adjuster, and a controller. The detector detects a transition of an input clock signal. The oscillator generates a clock signal having a frequency corresponding to a first control signal, and changes a phase of the clock signal on a basis of a detection result in the detector. The adjuster adjusts a phase difference between a phase of the input clock signal and the phase of the clock signal depending on a second control signal. The controller compares the phase of the input clock signal and the phase of the clock signal at a plurality of comparison timings, and generates the first control signal and the second control signal on a basis of a result of the comparison.

In the phase-locked loop, the phase-locking method, and the communication unit according to the respective embodiments of the disclosure, the clock signal having the phase that changes depending on the transition of the input clock signal is generated on the basis of the first control signal. Further, the phase difference between the phase of the input clock signal and the phase of the clock signal is adjusted on the basis of the second control signal. Furthermore, the phase of the input clock signal and the phase of the clock signal are compared at the plurality of comparison timings, and the first control signal and the second control signal are generated on the basis of the result of the comparison.

According to the phase-locked loop, the phase-locking method, and the communication unit in the respective embodiments of the disclosure, the phase of the input clock signal and the phase of the clock signal are compared at the plurality of comparison timings, and the first control signal and the second control signal are generated on the basis of the result of the comparison. It is therefore possible to enhance quality of the clock signal. It is to be noted that effects described here are not necessarily limitative, and may be any of effects described in the disclosure.

BRIEF DESCRIPTION OF DRAWINGS

FIG. 1 is a block diagram illustrating a configuration example of a phase-locked loop according to a first embodiment of the disclosure.

FIG. 2 is a circuit diagram illustrating a configuration example of a variable delay circuit illustrated in FIG. 1.

FIG. 3 is a timing waveform diagram illustrating an operation example of the variable delay circuit illustrated in FIG. 1.

FIG. 4 is a circuit diagram illustrating a configuration example of an oscillation circuit illustrated in FIG. 1.

FIG. 5 is a timing waveform diagram illustrating an operation example of the variable delay circuit, the oscillation circuit, and a frequency dividing circuit illustrated in FIG. 1.

FIG. 6 is a timing waveform diagram illustrating an operation example of a phase comparison circuit illustrated in FIG. 1.

FIG. 7 is a timing waveform diagram illustrating another operation example of the phase comparison circuit illustrated in FIG. 1.

FIG. 8 is a block diagram illustrating a configuration example of a control circuit illustrated in FIG. 1.

FIG. 9 is a timing waveform diagram illustrating an operation example of the phase-locked loop illustrated in FIG. 1.

FIG. 10 is a block diagram illustrating a configuration example of a phase-locked loop according to a comparative example.

FIG. 11 is a schematic diagram illustrating a clock signal generated by the phase-locked loop illustrated in FIG. 10.

FIG. 12 is a schematic diagram illustrating a clock signal generated by the phase-locked loop illustrated in FIG. 1.

FIG. 13 is a block diagram illustrating a configuration example of a phase-locked loop according to another comparative example.

FIG. 14 is a block diagram illustrating a configuration example of an oscillation circuit according to a modification example of the first embodiment.

FIG. 15 is a block diagram illustrating a configuration example of an oscillation circuit according to another modification example of the first embodiment.

FIG. 16 is a block diagram illustrating a configuration example of an oscillation circuit according to another modification example of the first embodiment.

FIG. 17 is a block diagram illustrating a configuration example of a phase-locked loop according to another modification example of the first embodiment.

FIG. 18 is a block diagram illustrating a configuration example of a phase-locked loop according to another modification example of the first embodiment.

FIG. 19 is a block diagram illustrating a configuration example of a phase-locked loop according to another modification example of the first embodiment.

FIG. 20 is a block diagram illustrating a configuration example of a phase-locked loop according to another modification example of the first embodiment.

FIG. 21 is a block diagram illustrating a configuration example of a phase-locked loop according to another modification example of the first embodiment.

FIG. 22 is a block diagram illustrating a configuration example of a phase-locked loop according to another modification example of the first embodiment.

FIG. 23 is a timing waveform diagram illustrating an operation example of an oscillation circuit and a frequency dividing circuit illustrated in FIG. 22.

FIG. 24 is a block diagram illustrating a configuration example of a control circuit illustrated in FIG. 22.

FIG. 25 is a timing waveform diagram illustrating an operation example of the phase-locked loop illustrated in FIG. 22.

FIG. 26 is a block diagram illustrating a configuration example of a phase-locked loop according to another modification example of the first embodiment.

FIG. 27 is a block diagram illustrating a configuration example of a phase-locked loop according to a second embodiment.

FIG. 28 is a timing waveform diagram illustrating an operation example of each of a variable delay circuit, an oscillation circuit, and a frequency dividing circuit illustrated in FIG. 27.

FIG. 29 is a block diagram illustrating a configuration example of a control circuit illustrated in FIG. 27.

FIG. 30 is a timing waveform diagram illustrating an operation example of the phase-locked loop illustrated in FIG. 27.

FIG. 31 is a block diagram illustrating a configuration example of a phase-locked loop according to a modification example of the second embodiment.

FIG. 32 is a timing waveform diagram illustrating an operation example of the phase-locked loop illustrated in FIG. 31.

FIG. 33 is a timing waveform diagram illustrating an operation example of a phase-locked loop according to another modification example of the second embodiment.

FIG. 34 is a block diagram illustrating a configuration example of a phase-locked loop according to a third embodiment.

FIG. 35 is a timing waveform diagram illustrating an operation example of the phase-locked loop illustrated in FIG. 34.

FIG. 36 is a block diagram illustrating a configuration example of a phase-locked loop according to a modification example of the third embodiment.

FIG. 37 is a block diagram illustrating a configuration example of a communication system to which a phase-locked loop according to an embodiment is applied.

FIG. 38 is a block diagram illustrating a configuration example of another communication system to which a phase-locked loop according to an embodiment is applied.

FIG. 39 is a block diagram illustrating a configuration example of another communication system to which a phase-locked loop according to an embodiment is applied.

FIG. 40 is a block diagram illustrating a configuration example of another communication system to which a phase-locked loop according to an embodiment is applied.

FIG. 41 is a block diagram illustrating a configuration example of another communication system to which a phase-locked loop according to an embodiment is applied.

FIG. 42 is a block diagram illustrating a configuration example of another communication system to which a phase-locked loop according to an embodiment is applied.

FIG. 43 is a block diagram illustrating a configuration example of a variable delay circuit according to another modification example.

FIG. 44 is a block diagram illustrating a configuration example of a phase-locked loop according to another modification example.

FIG. 45 is a block diagram illustrating a configuration example of a variable delay circuit illustrated in FIG. 44.

MODES FOR CARRYING OUT THE INVENTION

Some embodiments of the disclosure are described below in detail with reference to the drawings. It is to be noted that the description is given in the following order.
1. First Embodiment
2. Second Embodiment
3. Third Embodiment
4. Application Examples 1. First Embodiment

[Configuration Example]

FIG. 1 illustrates a configuration example of a phase-locked loop (a phase-locked loop 1) according to a first embodiment. It is to be noted that a phase-locking method according to an embodiment of the disclosure is embodied by the present embodiment, and thus is described together.

The phase-locked loop 1 is a circuit that generates a clock signal CKout on the basis of an inputted clock signal CKin. In this example, a frequency of the clock signal CKout is eight times a frequency of the clock signal CKin. In other words, the phase-locked loop 1 serves as a frequency multiplier that multiplies a frequency by eight. It is to be noted that this is not limitative, and the frequency may be multiplied by a number except eight. The phase-locked loop 1 includes a variable delay circuit 20, an oscillation circuit 30, a frequency dividing circuit 13, phase comparison circuits 11 and 12, and a control circuit 40.

The variable delay circuit 20 delays the clock signal CKin by an amount of delay corresponding to a control signal CTLP, and outputs the delayed clock signal CKin as a clock signal CK2.

FIG. 2 illustrates a configuration example of the variable delay circuit 20. The variable delay circuit 20 has a delay circuit 21 and an inverter 22. It is to be noted that, in this example, the variable delay circuit 20 is configured using the one delay circuit 21, but this is not limitative. The variable delay circuit 20 may be configured using a plurality of delay circuits 21 coupled in series to each other.

The delay circuit 21 delays the clock signal CKin by the amount of delay corresponding to the control signal CTLP. The delay circuit 21 also inverts the clock signal CKin, and outputs the inverted clock signal. The delay circuit 21 includes current sources 26 and 29, and transistors 27 and 28. The current sources 26 and 29 are so-called variable current sources, which each generate a current that flows from a first terminal to a second terminal and has a current value corresponding to the control signal CTLP. The first terminal of the current source 26 is supplied with a power supply voltage VDD, and the second terminal thereof is coupled to a source of the transistor 27. The first terminal of the current source 29 is coupled to a source of the transistor 28, and the second terminal thereof is grounded. The transistor 27 is a P-channel MOS (Metal Oxide Semiconductor) type transistor. A gate of the transistor 27 is supplied with the clock signal CKin, the source thereof is coupled to the second terminal of the current source 26, and a drain thereof is coupled to a drain of the transistor 28 and coupled to an input terminal of the inverter 22. The transistor 28 is an N-channel MOS type transistor. A gate of the transistor 28 is supplied with the clock signal CKin, the drain thereof is coupled to the drain of the transistor 27 and coupled to the input terminal of the inverter 22, and the source thereof is coupled to the first terminal of the current source 29.

Owing to this configuration, in the delay circuit 21, the transistors 27 and 28 each serve as an inverter, which inverts the clock signal CKin, and outputs the inverted clock signal. In this situation, the current sources 26 and 29 each generate the current of the current value corresponding to the control signal CTLP. Accordingly, in the delay circuit 21, in a case where the current value is large, an output voltage transitions in a short period of time, and thus the amount of delay is small, whereas in a case where the current value is small, the output voltage transitions slowly, and thus the amount of delay is large. In this way, the delay circuit 21 serves as a delay circuit of a current control type. It is to be noted that, in this example, the amount of delay is controlled on the basis of the current value, but this is not limitative. Instead of this, for example, it is possible to apply various configurations that allow for adjustment of the amount of delay, such as a method of controlling the amount of delay on the basis of a load capacitance value.

The inverter 22 inverts a signal supplied from the delay circuit 21 and outputs the inverted signal as the clock signal CK2.

FIG. 3 illustrates an operation example of the variable delay circuit 20. (A) of FIG. 3 illustrates a waveform of the clock signal CKin, and (B) of FIG. 3 illustrates a waveform of the clock signal CK2. (B) of FIG. 3 illustrates the clock signal CK2 in each of three cases C1 to C3. The case C1 is a case where an amount of delay d is small, the case C2 is a case where the amount of delay d is moderate, and the case C3 is a case where the amount of delay d is large. In the variable delay circuit 20, the delay circuit 21 and the inverter 22 both invert an input signal and output the inverted signal.

Hence, an input signal (the clock signal CKin) and an output signal (the clock signal CK2) of the variable delay circuit 20 are of the same polarity. The amount of delay d of the variable delay circuit 20 corresponds to a sum of the amount of delay of the delay circuit 21 and the amount of delay of the inverter 22. This amount of delay d is controlled using the control signal CTLP by the control circuit 40 to allow a transition timing of a clock signal CK4 (described later) to coincide with a transition timing of the clock signal CK2, as described later.

The oscillation circuit 30 generates the clock signal CKout having a frequency corresponding to a control signal CTLF. This clock signal CKout has a frequency of about eight times the frequency of the clock signal CKin. Further, the oscillation circuit 30 also has a function of changing a phase of the clock signal CKout on the basis of the clock signal CKin. This oscillation circuit 30 is an oscillation circuit of a so-called gated VCO (Voltage Controlled Oscillator) type.

FIG. 4 illustrates a configuration example of the oscillation circuit 30. The oscillation circuit 30 includes an edge detection circuit 37, delay circuits 31 to 35, and an AND circuit 36. It is to be noted that, in this example, the five delay circuits 31 to 35 are used, but this is not limitative. Four delay circuits or less may be used, or six delay circuits or more may be used.

The edge detection circuit 37 detects a rising edge of the clock signal CKin, and generates a signal E1. Specifically, in a case of detecting the rising edge of the clock signal CKin, the edge detection circuit 37 sets the signal E1 to a low level in a period PG having a length of about a half of one cycle of the clock signal CKout, and sets the signal E1 to a high level in other periods.

The delay circuits 31 to 35 each delay an inputted signal by the amount of delay corresponding to the control signal CTLF, invert the delayed signal, and output the inverted signal. The delay circuits 31 to 35 each have, for example, a configuration similar to the configuration of the delay circuit 21 illustrated in FIG. 2. The delay circuits 31 to 35 are coupled in series in this order. An input terminal of the delay circuit 31 in a first stage is coupled to an output terminal of the AND circuit 36. Further, an output terminal of the delay circuit 35 in a last stage is coupled to a first input terminal of the AND circuit 36.

The AND circuit 36 determines a logical product (AND) of a signal supplied to the first input terminal and a signal supplied to a second input terminal, and outputs a result thereof as the clock signal CKout. The first input terminal of the AND circuit 36 is coupled to the output terminal of the delay circuit 35, the second input terminal thereof is coupled to an output terminal of the edge detection circuit 37 and supplied with the signal E1, and the output terminal thereof is coupled to the input terminal of the delay circuit 31. It is to be noted that, as with the delay circuits 31 to 35, the AND circuit 36 may have, in addition to a function of determining a logical product, a function of changing the amount of delay depending on the control signal CTLF.

Owing to this configuration, in the oscillation circuit 30, the signal E1 maintains the high level, in a period except the period PG corresponding to a rise of the clock signal CKin, and thus a loop configured by the delay circuits 31 to 35 and the AND circuit 36 forms a so-called ring oscillator, and generates the clock signal CKout having a frequency corresponding to the control signal CTLF. Specifically, for example, in a case where the amount of delay of each of the delay circuits 31 to 35 is large, the amount of delay in the loop is large, and thus the frequency of the clock signal CKout is low. Further, for example, in a case where the amount of delay of each of the delay circuits 31 to 35 is small, the amount of delay in the loop is small, and thus the frequency of the clock signal CKout is high. This frequency of the clock signal CKout is so controlled using the control signal CTLF by the control circuit 40, as to be eight times the frequency of the clock signal CKin, as described later.

Further, in the oscillation circuit 30, when the clock signal CKin rises, the phase of the clock signal CKout changes in response to this transition. In other words, when the clock signal CKin rises, the signal E1 is caused to be at the low level for a predetermined period in response to this rising edge, and thus the AND circuit 36 sets an output signal (the clock signal CKout) to the low level. In other words, the oscillation circuit 30 corrects the phase of the clock signal CKout, in response to the rising edge of the clock signal CKin. Further, at this rising edge and thereafter, the loop of the oscillation circuit 30 serves as a ring oscillator. In this way, the oscillation circuit 30 changes the phase of the clock signal CKout on the basis of the clock signal CKin.

The frequency dividing circuit 13 (FIG. 1) generates the clock signal CK4 by dividing a frequency of the clock signal CKout by eight. In other words, a frequency of the clock signal CK4 is one-eighth (⅛) of the frequency of the clock signal CKout. Hence, in the phase-locked loop 1, frequencies of the two clock signals CK2 and CK4 to be supplied to the phase comparison circuits 11 and 12 are equal to each other.

FIG. 5 illustrates an operation example of the variable delay circuit 20, the oscillation circuit 30, and the frequency dividing circuit 13. (A) of FIG. 5 illustrates a waveform of the clock signal CKin, (B) of FIG. 5 illustrates a waveform of the signal E1, (C) of FIG. 5 illustrates a waveform of the clock signal CKout, (D) of FIG. 5 illustrates a waveform of the clock signal CK4, and (E) of FIG. 5 illustrates a waveform of the clock signal CK2.

In this example, at first, the edge detection circuit 37 of the oscillation circuit 30 detects the rising edge of the clock signal CKin at a timing t11, and sets the signal E1 to the low level in the period PG starting from a timing t12 lagging behind the timing t11 by circuit delay ((B) of FIG. 5). In response to the signal E1 changing to the low level at the timing t12, the AND circuit 36 sets the clock signal CKout to the low level in a period from a timing t13 lagging behind the timing t12 by circuit delay to a timing t14 ((C) of FIG. 5). On the basis of a rising edge of the clock signal CKout at the timing t14, the frequency dividing circuit 13 changes the clock signal CK4 from the low level to the high level at a timing t15 lagging behind the timing t14 by circuit delay ((D) of FIG. 5). In other words, a phase of the clock signal CK4 is corrected at the timing t15. Subsequently, on the basis of the rising edge of the clock signal CKout at a timing t16 after a lapse of time equivalent to four cycles of the clock signal CKout from the timing t14, the frequency dividing circuit 13 changes the clock signal CK4 from the high level to the low level, at a timing t17 lagging behind the timing t16 by circuit delay. This (D) of FIG. 5 illustrates a triangle overlaid on a rising edge of the clock signal CK4. This triangle indicates that this transition is a transition when a phase is corrected by the oscillation circuit 30. In this way, in the phase-locked loop 1, the phase of the clock signal CK4 is corrected once, in a period equivalent to one cycle of the clock signal CKin. In other words, a cycle Tsync in which the phase of the clock signal CK4 is corrected is equal to a length of a period equivalent to one cycle of the clock signal CKin. The variable delay circuit 20 generates the clock signal CK2, by delaying the clock signal CKin ((E) of FIG. 5). As a result, in the phase-locked loop 1, phases of the clock signals CK2 and CK4 substantially coincide with each other, as illustrated in (D) and (E) of FIG. 5. In this way, in the phase-locked loop 1, the amount of delay of the variable delay circuit 20 is controlled to allow the phases of the clock signals CK2 and CK4 to substantially coincide with each other.

The phase comparison circuit 11 compares the phase of the clock signal CK2 and the phase of the clock signal CK4 on the basis of rising edges of the clock signals CK2 and CK4, and generates a comparison signal S11 on the basis of a result of the comparison. The phase comparison circuit 12 compares the phase of the clock signal CK2 and the phase of the clock signal CK4 on the basis of the rising edges of the clock signals CK2 and CK4, and generates a comparison signal S12 on the basis of a result of the comparison.

FIGS. 6 and 7 illustrate operation of the phase comparison circuits 11 and 12. FIG. 6 illustrates a case where the phase of the clock signal CK4 leads, and FIG. 7 illustrates a case where the phase of the clock signal CK4 lags. In FIGS. 6 and 7, (A) illustrates a waveform of the clock signal CK2, (B) illustrates a waveform of the clock signal CK4, (C) illustrates a waveform of the comparison signal S11, and (D) illustrates a waveform of the comparison signal S12.

The phase comparison circuit 11 compares the phase of the clock signal CK2 and the phase of the clock signal CK4, on the basis of the rising edges of the clock signals CK2 and CK4. For example, in a case where the phase of the clock signal CK4 leads (FIG. 6), a rising timing (e.g., a timing t21) of the clock signal CK4 precedes a rising timing (e.g., a timing t22) of the clock signal CK2 ((A) and (B) of FIG. 6). Hence, on the basis of this preceding, the phase comparison circuit 11 determines that the phase of the clock signal CK4 leads the phase of the clock signal CK2, and sets the comparison signal S11 to the high level ((C) of FIG. 6). Further, for example, in a case where the phase of the clock signal CK4 lags (FIG. 7), the rising timing (e.g., a timing t32) of the clock signal CK4 follows the rising timing (e.g., a timing t31) of the clock signal CK2 ((A) and (B) of FIG. 7). Hence, on the basis of this following, the phase comparison circuit 11 determines that the phase of the clock signal CK4 lags behind the phase of the clock signal CK2, and sets the comparison signal S11 to the low level ((C) of FIG. 7).

Similarly, the phase comparison circuit 12 compares the phase of the clock signal CK2 and the phase of the clock signal CK4, on the basis of falling edges of the clock signals CK2 and CK4. For example, in a case where the phase of the clock signal CK4 leads (FIG. 6), a falling timing (e.g., a timing t23) of the clock signal CK4 precedes a falling timing (e.g., a timing t24) of the clock signal CK2 ((A) and (B) of FIG. 6). Hence, on the basis of this preceding, the phase comparison circuit 12 determines that the phase of the clock signal CK4 leads the phase of the clock signal CK2, and sets the comparison signal S12 to the high level ((D) of FIG. 6). Further, for example, in a case where the phase of the clock signal CK4 lags (FIG. 7), the falling timing (e.g., a timing t34) of the clock signal CK4 follows the falling timing (e.g., a timing t33) of the clock signal CK2 in ((A) and (B) of FIG. 7). Hence, on the basis of this following, the phase comparison circuit 12 determines that the phase of the clock signal CK4 lags behind the phase of the clock signal CK2, and sets the comparison signal S12 to the low level ((D) of FIG. 7).

The control circuit 40 generates the control signals CTLP and CTLF on the basis of the comparison signals S11 and S12 and the clock signal CK4.

FIG. 8 illustrates a configuration example of the control circuit 40. The control circuit 40 includes a phase determination circuit 41, a frequency determination circuit 42, and integration circuits 43 and 44.

The phase determination circuit 41 generates a signal SIGP on the basis of the comparison signals S11 and S12 and the clock signal CK4. Specifically, in a case where the phase determination circuit 41 determines that the phase of the clock signal CK4 leads and thus delaying is necessary, the phase determination circuit 41 sets the signal SIGP to "+1". In a case where the phase determination circuit 41 determines that the phase of the clock signal CK4 lags and thus leading is necessary, the phase determination circuit 41 sets the signal SIGP to "−1". Further, in a case where the phase determination circuit 41 determines that maintaining the phase of the clock signal CK4 is necessary, the phase determination circuit 41 sets the signal SIGP to "0".

The integration circuit 43 serves as a so-called loop filter, and integrates a value of the signal SIGP. Further, the integration circuit 43 generates the control signal CTLP on the basis of this integrated value, and supplies this control signal CTLP to the variable delay circuit 20.

The frequency determination circuit 42 generates a signal SIGF on the basis of the comparison signals S11 and S12 and the clock signal CK4. Specifically, in a case where the frequency determination circuit 42 determines that the frequency of the clock signal CK4 is high and thus lowering is necessary, the frequency determination circuit 42 sets the signal SIGF to "+1". In a case where the frequency determination circuit 42 determines that the frequency of the clock signal CK4 is low and thus raising is necessary, the frequency determination circuit 42 sets the signal SIGF to "−1". Further, in a case where the frequency determination circuit 42 determines that maintaining the frequency of the clock signal CK4 is necessary, the frequency determination circuit 42 sets the signal SIGF to "0".

The integration circuit 44 serves as a so-called loop filter, and integrates a value of the signal SIGF. Further, the integration circuit 44 generates the control signal CTLF on the basis of this integrated value, and supplies this control signal CTLF to the oscillation circuit 30.

Here, the edge detection circuit 37 corresponds to a specific example of a "detector" in the disclosure. The delay circuits 31 to 35 and the AND circuit 36 correspond to a specific example of an "oscillator" in the disclosure. The variable delay circuit 20 corresponds to a specific example of a "first delay section" in the disclosure. The frequency dividing circuit 13 corresponds to a specific example of a "frequency divider" in the disclosure. The phase comparison circuits 11 and 12 and the control circuit 40 correspond to a specific example of a "controller" in the disclosure. The clock signal CKin corresponds to a specific example of an "input clock signal" in the disclosure. The clock signal CKout corresponds to a specific example of a "clock signal" in the disclosure. The control signal CTLF corresponds to a specific example of a "first control signal" in the disclosure. The control signal CTLP corresponds to a specific example of a "second control signal" in the disclosure.

[Operation and Workings]

Next, operation and workings of the phase-locked loop 1 of the present embodiment is described.

(Outline of Overall Operation)

First, an outline of overall operation of the phase-locked loop 1 is described with reference to figures including FIG. 1. The variable delay circuit 20 delays the clock signal CKin by the amount of delay corresponding to the control signal CTLP, and outputs the delayed clock signal CKin as the clock signal CK2. The oscillation circuit 30 generates the clock signal CKout having the frequency corresponding to the control signal CTLF, and changes the phase of the clock signal CKout on the basis of the clock signal CKin. The frequency dividing circuit 13 generates the clock signal CK4 by dividing the frequency of the clock signal CKout. The phase comparison circuit 11 compares the phases of the clock signals CK2 and CK4 on the basis of the rising edges of the clock signals CK2 and CK4, and generates the comparison signal S11 on the basis of a result of the comparison. The phase comparison circuit 12 compares the phases of the clock signals CK2 and CK4 on the basis of the falling edges of the clock signals CK2 and CK4, and generates the comparison signal S12 on the basis of a result of the comparison. The control circuit 40 generates the control signals CTLP and CTLF, on the basis of the comparison signals S11 and S12 and the clock signal CK4.

(Detailed Operation)

FIG. 9 illustrates an operation example of the phase-locked loop 1. (A) of FIG. 9 illustrates a waveform of the clock signal CK2, (B) of FIG. 9 illustrates a waveform of the clock signal CK4, (C) of FIG. 9 illustrates a waveform of the comparison signal S11, (D) of FIG. 9 illustrates a waveform of the comparison signal S12, (E) of FIG. 9 illustrates the signal SIGP, and (F) of FIG. 9 illustrates the signal SIGF. (C) and (D) of FIG. 9 each also illustrate "1" and "0", in addition to the waveform, for convenience of description. Here, "1" indicates that the signal is at the high level, and "0" indicates that the signal is at the low level. It is to be noted that, in this FIG. 9, circuit delay is omitted for convenience of description.

The phase comparison circuit 11 generates the comparison signal S11, by comparing the phases of the clock signals CK2 and CK4 on the basis of the rising edges of the clock signals CK2 and CK4 ((C) of FIG. 9). Further, the phase comparison circuit 12 generates the comparison signal S12 by comparing the phases of the clock signals CK2 and CK4 on the basis of the falling edges of the clock signals CK2 and CK4 ((D) of FIG. 9). As illustrated in FIG. 9, the phase of the clock signal CK2 and the phase of the clock signal CK4 substantially coincide with each other. It is therefore possible for the control circuit 40 to determine leading or lagging of the phase of the clock signal CK4, on the basis of the comparison result (the comparison signal S11) obtained by the phase comparison circuit 11 and the comparison result (the comparison signal S12) obtained by the phase comparison circuit 12.

The phase determination circuit 41 of the control circuit 40 generates the signal SIGP by comparing the comparison signal S11 and the comparison signal S12 ((E) of FIG. 9). The frequency determination circuit 42 generates the signal SIGF by comparing the comparison signal S11 and the comparison signal S12 ((F) of FIG. 9).

Specifically, for example, the comparison result (the comparison signal S11) obtained by the phase comparison circuit 11 at a timing t42 is "1" ((C) of FIG. 9), and the comparison result (the comparison signal S12) obtained by the phase comparison circuit 12 at a timing t43 is "1" ((D) of FIG. 9). In other words, the phase of the clock signal CK4 leads the phase of the clock signal CK2 at both of the timing t42 and the timing t43. Hence, the phase determination circuit 41 determines that the phase of the clock signal CK4 leads and thus delaying is necessary, and sets the signal SIGP to "+1", in a period from a timing t44 to a timing t46 ((E) of FIG. 9). At this time, the frequency determination circuit 42 determines that maintaining the frequency of the clock signal CK4 is necessary, and sets the signal SIGF to "0", in the period from the timing t44 to the timing t46 ((F) of FIG. 9).

Further, for example, the comparison result (the comparison signal S11) obtained by the phase comparison circuit 11 at the timing t44 is "0" ((C) of FIG. 9), and the comparison result (the comparison signal S12) obtained by the phase comparison circuit 12 at the timing t45 is "1" ((D) of FIG. 9). In other words, at the timing t44, the phase of the clock signal CK4 lags behind the phase of the clock signal CK2, and at the timing t45, the phase of the clock signal CK4 leads the phase of the clock signal CK2. Hence, the frequency determination circuit 42 determines that the frequency of the clock signal CK4 is high and thus lowering is necessary, and sets the signal SIGF to "+1", in a period from the timing t46 to a timing t48 ((F) of FIG. 9). At this time, the phase determination circuit 41 determines that maintaining the phase of the clock signal CK4 is necessary, and sets the signal SIGP to "0", in the period from the timing t46 to the timing t48 ((E) of FIG. 9).

Further, for example, the comparison result (the comparison signal S11) obtained by the phase comparison circuit 11 at the timing t46 is "0" ((C) of FIG. 9), and the comparison result (the comparison signal S12) obtained by the phase comparison circuit 12 at the timing t47 is "0" ((D) of FIG. 9). In other words, the phase of the clock signal CK4 lags behind the phase of the clock signal CK2 at both of the timing t46 and the timing t47. Hence, the phase determination circuit 41 determines that the phase of the clock signal CK4 lags and thus leading is necessary, and sets the signal SIGP to "−1", in a period from the timing t48 to a timing t50 ((E) of FIG. 9). At this time, the frequency determination circuit 42 determines that maintaining the frequency of the clock signal CK4 is necessary, and sets the signal SIGF to "0", in the period from the timing t48 to the timing t49 ((F) of FIG. 9).

Further, for example, the comparison result (the comparison signal S11) obtained by the phase comparison circuit 11 at the timing t48 is "1" ((C) of FIG. 9), and the comparison result (the comparison signal S12) obtained by the phase comparison circuit 12 at the timing t49 is "0" ((D) of FIG. 9). In other words, at the timing t48, the phase of the clock signal CK4 leads the phase of the clock signal CK2, and at the timing t49, the phase of the clock signal CK4 lags behind the phase of the clock signal CK2. Hence, the frequency determination circuit 42 determines that the frequency of the clock signal CK4 is low and thus raising is necessary, and sets the signal SIGF to "−1", in a period from the timing t50 to a timing t52 ((F) of FIG. 9). At this time, the phase determination circuit 41 determines that maintaining the phase of the clock signal CK4 is necessary, and sets the signal SIGP to "0", in the period of from the timing t50 to the timing t52 ((E) of FIG. 9).

In this way, the phase comparison circuits 11 and 12 compare the phases of the clock signals CK2 and CK4 at comparison timings different from each other. Subsequently, in a case where these two comparison results (the comparison signals S11 and S12) coincide with each other, the phase determination circuit 41 sets the signal SIGP to "+1" or "−1" on the basis of a result of the comparison. Further, in a case where these two comparison results (the comparison signals S11 and S12) are different from each other, the frequency determination circuit 42 sets the signal SIGF to "+1" or "−1" on the basis of a result of the comparison.

An integration circuit 45 generates the control signal CTLP by integrating the signal SIGP. Further, the variable delay circuit 20 changes the amount of delay on the basis of this control signal CTLP. In this way, in the phase-locked loop 1, negative feedback control of the amount of delay in the variable delay circuit 20 is performed to allow the transition timings of the clock signals CK2 and CK4 to coincide with each other.

An integration circuit 46 generates the control signal CTLF by integrating the signal SIGF. Further, the oscillation circuit 30 changes the frequency of the clock signal CKout on the basis of this control signal CTLF. This causes the frequency of the clock signal CK4 to also change. In this way, in the phase-locked loop 1, negative feedback control of the frequency of the clock signal CK4 is performed to allow the frequencies of the clock signals CK2 and CK4 to coincide with each other.

In this way, in the phase-locked loop 1, the variable delay circuit 20 is provided, and the control circuit 40 controls the amount of delay in the variable delay circuit 20. It is therefore possible to cause the transition timings of the clock signals CK2 and CK4 to coincide with each other. In other words, in a case where a configuration is adopted in which the frequency of the clock signal CK4 is controlled on the basis of a phase difference between the clock signals CK2 and CK4 without providing the variable delay circuit 20, the control circuit determines that the frequencies are out of synchronization because the clock signals CK2 and CK4 are out of phase with each other, even when the frequencies of the clock signals CK2 and CK4 substantially coincide with each other. In this case, the control circuit controls the frequency, and thus there is a possibility of occurrence of a malfunction. In contrast, in the phase-locked loop 1, the variable delay circuit 20 is provided, and the control circuit 40 separately controls the amount of delay in the variable delay circuit 20 and the frequency in the oscillation circuit 30 on the basis of the comparison signals S11 and S12. Accordingly, in the phase-locked loop 1, it is possible to adjust the amount of delay in the variable delay circuit 20 to a desired amount on the basis of the comparison results of the phase comparison circuits 11 and 12. Hence, it is possible to reduce a possibility of occurrence of such a malfunction. As a result, it is possible to enhance quality of the clock signal CKout.

In addition, in the phase-locked loop 1, in a case where the two comparison results (the comparison signals Si 1 and S12) at different comparison timings are different from each other, the signal SIGF is set to "+1" or "−1" on the basis of the result of the comparison. It is therefore possible to control the frequency of the clock signal CKout effectively. In other words, at first, the oscillation circuit 30 corrects the phase of the clock signal CKout on the basis of the rising edge of the clock signal CKin. Hence, the oscillation circuit 30 generates the clock signal CKout of the frequency corresponding to the control signal CTLF, without correcting the phase of the clock signal CKout, during a period from the rising edge to the next rising edge of the clock signal CKin. The phase comparison circuits 11 and 12 compare the phases of the clock signals CK2 and CK4, at comparison timings different from each other, during the period from the rising edge to the next rising edge of the clock signal CKin. In other words, a comparison result at a first comparison timing is obtained immediately after the phase of the clock signal CKout is corrected, and a comparison result at a second comparison timing is obtained after a lapse of time following completion of this correction. Hence, in a case where these two comparison results are different from each other, it is highly likely that there is a shift in the frequency of the clock signal CKout. In the phase-locked loop 1, in the case where these two comparison results are different from each other, the signal SIGF is generated on the basis of a result of the comparison. Accordingly, in the phase-locked loop 1, it is possible to control the frequency of the clock signal CKout effectively.

Moreover, in the phase-locked loop 1, in a case where the two comparison results (the comparison signals S11 and S12) at the different comparison timings coincide with each other, the signal SIGP is set to "+1" or "−1" on the basis of the result of the comparison. It is therefore possible to control the amount of delay in the variable delay circuit 20 effectively. In other words, a comparison result at a first comparison timing is obtained immediately after the phase of the clock signal CKout is corrected, and a comparison result at a second comparison timing is obtained after a lapse of time following completion of this correction. Hence, in a case where these two comparison results coincide with each other, it is highly likely that there is a deviation in the amount of delay in the variable delay circuit 20. In the phase-locked loop 1, in the case where these two comparison results coincide with each other, the signal SIGP is generated on the basis of a result of the comparison. Accordingly, in the phase-locked loop 1, it is possible to control the amount of delay in the variable delay circuit 20 effectively.

Next, effects of the phase-locked loop 1 according to the present embodiment are described while making comparisons with some comparative examples.

Comparative Example 1

FIG. 10 illustrates a configuration example of a phase-locked loop 1R according to a comparative example 1. The phase-locked loop 1R includes a phase comparison circuit 51, a charge pump 52, a loop filter 53, an oscillation circuit 54, and a frequency dividing circuit 55. The phase comparison circuit 51 compares the phase of the clock signal CKin and the phase of the clock signal CK4. On the basis of a comparison result in the phase comparison circuit 51, the charge pump 52 supplies a predetermined current to the loop filter 53, or synchronizes a predetermined current from the loop filter 53. The loop filter 53 generates the control signal CTLF that specifies an oscillating frequency for the oscillation circuit 54. The oscillation circuit 54 generates the clock signal CKout having a frequency corresponding to the control signal CTLF. The frequency dividing circuit 55 generates the clock signal CK4 by dividing the frequency of the clock signal CKout.

FIG. 11 schematically illustrates a waveform of the clock signal CKout generated by the phase-locked loop 1R. In the phase-locked loop 1R, as illustrated in FIG. 11, for example, noise generated in the oscillation circuit 54 is integrated for a long period of time, thereby causing jitter J at each edge of the clock signal CKout. To reduce such jitter J, for example, it is effective to widen a loop band of the phase-locked loop 1R. However, when the loop band is widened, there is a possibility that the phase-locked loop 1R may not stably operate, and thus the loop band is limited to, for example, about one-twentieth (1/20) the frequency of the clock signal CKin. As a result, in the phase-locked loop 1R, there is a possibility that the jitter J may not be sufficiently reduced.

On the other hand, in the phase-locked loop 1 according to the present embodiment, the oscillation circuit 30 of the gated VCO type is used, and thus it is possible to reduce the jitter J, as described below.

FIG. 12 schematically illustrates a waveform of the clock signal CKout generated by the phase-locked loop 1. The oscillation circuit 30 corrects the phase of the clock signal CKout on the basis of the rising edge of the clock signal CKin, as illustrated in FIG. 5. Hence, in the phase-locked loop 1, noise generated in the oscillation circuit 30 is reset, and as a result, it is possible to reduce the jitter J occurring in the clock signal CKout, as illustrated in FIG. 12.

In this way, in the phase-locked loop 1, the oscillation circuit 30 of the gated VCO type is used, and thus it is possible to widen the loop band equivalently, and it is possible to reduce the jitter J. As a result, in the phase-locked loop 1, it is possible to enhance the quality of the clock signal CKout.

Further, in this way, in the phase-locked loop 1, it is possible to reduce the jitter J, and thus it is possible to reduce a footprint. In other words, in the phase-locked loop 1R according to the comparative example 1, for example, it is desirable to configure the oscillation circuit 54 by using an oscillation circuit of an LC resonance type, in order to reduce the noise generated in the oscillation circuit 54. However, in this case, there is a possibility that a footprint of the oscillation circuit 54 may increase. In addition, in a case where the oscillation circuit 54 is configured using a ring oscillator, it is desirable to increase size of an element configuring the oscillation circuit 54, in order to reduce the noise generated in the oscillation circuit 54. However, in this case as well, there is a possibility that the footprint of the oscillation circuit 54 may increase. In contrast, in the phase-locked loop 1 according to the present embodiment, the jitter J is reduced using the oscillation circuit 30 of the gated VCO type, and thus it is possible to reduce the jitter J even when a small-size element is used. It is therefore possible to reduce the footprint of the phase-locked loop 1.

Furthermore, in this way, in the phase-locked loop 1, it is possible to reduce the jitter J, thus making it possible to reduce current consumption. In other words, in the phase-locked loop 1R according to the comparative example 1, in a case where the oscillation circuit 54 is configured using a ring oscillator, it is desirable to increase a current to be fed to the circuit, in order to reduce the noise generated in the oscillation circuit 54. In this case, however, there is a possibility that the current consumption may become large. In contrast, in the phase-locked loop 1 according to the present embodiment, the jitter J is reduced using the oscillation circuit 30 of the gated VCO type, and thus it is possible to reduce the jitter J even when the current to be fed to the circuit is reduced. It is therefore possible to reduce the current consumption.

Comparative Example 2

FIG. 13 illustrates a configuration example of a phase-locked loop 1S according to a comparative example 2. The phase-locked loop 1S includes an oscillation circuit 59. The oscillation circuit 59 generates the clock signal CKout having a frequency corresponding to the control signal CTLF supplied from the loop filter 53. Further, the oscillation circuit 59 also has a function of changing the phase of the clock signal CKout on the basis of the clock signal CKin, as with the oscillation circuit 30 according to the present embodiment. This oscillation circuit 59 is an oscillation circuit of the gated VCO type.

As with the oscillation circuit 30 according to the present embodiment, this oscillation circuit 59 is able to change the phase of the clock signal CKout on the basis of the clock signal CKin. However, there is a possibility of occurrence of a malfunction, in a case where the phase of the clock signal CKin to be inputted to the oscillation circuit 59 does not coincide with the phase of the clock signal CKout. In other words, the oscillation circuit 59 attempts to correct the phase of the clock signal CKout on the basis of the phase of the clock signal CKin. In addition, a loop configured by the phase comparison circuit 51, the charge pump 52, the loop filter 53, the oscillation circuit 59, and the frequency dividing circuit 55 also attempts to correct the phase of the clock signal CKout on the basis of the phase of the clock signal CKin. Hence, in the case where the phase of the clock signal CKin to be inputted to the oscillation circuit 59 does not coincide with the phase of the clock signal CKout, each of these two mechanisms attempts to correct the phase of the clock signal CKout to a phase different from the phase of the clock signal CKout of the other, and thus a malfunction occurs. Even when a delay circuit, etc. is inserted to allow the phase of the clock signal CKin to be inputted to the oscillation circuit 59 to coincide with the phase of the clock signal CKout, a malfunction occurs, in a case where an amount of delay in the delay circuit deviates from a desired amount due to a factor such as a manufacturing variation and an environmental variation.

In contrast, in the phase-locked loop 1 according to the present embodiment, the variable delay circuit 20 is provided, and the control circuit 40 controls the amount of delay in the variable delay circuit 20. Hence, even when the factor such as a manufacturing variation and an environmental variation occurs, the amount of delay in the variable delay circuit 20 is controlled to be a desired amount of delay. As a result, in the phase-locked loop 1, it is possible to reduce a possibility of occurrence of a malfunction, and it is possible to enhance the quality of the clock signal CKout.

[Effects]

As described above, in the present embodiment, the variable delay circuit is provided, and the control circuit controls the amount of delay in the variable delay circuit. Hence, it is possible to reduce the possibility of occurrence of a malfunction, and it is possible to enhance the quality of the clock signal CKout.

In addition, in the present embodiment, the oscillation circuit of the gated VCO type is used. Hence, it is possible to reduce the footprint, and it is possible to lower power consumption.

Moreover, in the present embodiment, in the case where the two comparison results at the different comparison timings are different from each other, the signal SIGF is generated on the basis of the result of the comparison, and thus it is possible to control the frequency of the clock signal effectively. As a result, it is possible to enhance the quality of the clock signal CKout.

Further, in the present embodiment, in the case where the two comparison results at the different comparison timings coincide with each other, the signal SIGP is generated on the basis of the result of the comparison. Hence, it is possible to control the amount of delay in the variable delay circuit effectively, and as a result it is possible to enhance the quality of the clock signal CKout.

Modification Example 1-1

In the above-described embodiment, a portion or all of the circuit may be configured by a differential circuit.

Modification Example 1-3

In the above-described embodiment, the oscillation circuit 30 is configured using the AND circuit 36, but this is not limitative. The present modification example is described below, with reference to some examples.

FIG. 14 illustrates a configuration example of an oscillation circuit 30B according to the present modification example. The oscillation circuit 30B includes the four delay circuits 31 to 34, and an inverted AND circuit 36B. The inverted AND circuit 36B determines an inverted logical product (NAND) of a signal supplied to a first input terminal and a signal supplied to a second input terminal, and outputs a result thereof as the clock signal CKout. The first input terminal of the inverted AND circuit 36B is coupled to an output terminal of the delay circuit 34, the second input terminal thereof is coupled to the output terminal of the edge detection circuit 37 and supplied with the signal E1, and an output terminal thereof is coupled to the input terminal of the delay circuit 31. In this oscillation circuit 30B, the signal E1 is caused to be at the low level for a predetermined period, in response to the rising edge of the clock signal CKin, and thus the inverted AND circuit 36B sets the output signal (the clock signal CKout) to the high level. In this way, the oscillation circuit 30B changes the phase of the clock signal CKout on the basis of the clock signal CKin.

FIG. 15 illustrates a configuration example of another oscillation circuit 30C according to the present modification example. The oscillation circuit 30C includes an edge detection circuit 37C, the five delay circuits 31 to 35, and an OR circuit 36C. In a case of detecting a rise of the clock signal CKin, the edge detection circuit 37C sets the signal E1 to the high level in the period PG with a length of about a half of one cycle of the clock signal CKout, and sets the signal E1 to the low level in other periods. The OR circuit 36C determines a logical sum (OR) of a signal supplied to a first input terminal and a signal supplied to a second input terminal, and outputs a result thereof as the clock signal CKout. The first input terminal of the OR circuit 36C is coupled to the output terminal of the delay circuit 35, the second input terminal thereof is coupled to an output terminal of the edge detection circuit 37C and supplied with the signal E1, and an output terminal thereof is coupled to the input terminal of the delay circuit 31. In this oscillation circuit 30C, the signal E1 is caused to be at the high level for a predetermined period, in response to the rising edge of the clock signal CKin, and thus the OR circuit 36C sets an output signal (the clock signal CKout) to the high level. In this way, the oscillation circuit 30C changes the phase of the clock signal CKout on the basis of the clock signal CKin.

FIG. 16 illustrates a configuration example of another oscillation circuit 30D according to the present modification example. The oscillation circuit 30D includes the edge detection circuit 37C, the four delay circuits 31 to 34, and an inverted OR circuit 36D. The inverted OR circuit 36D determines an inverted logical sum (NOR) of a signal supplied to a first input terminal and a signal supplied to a second input terminal, and outputs a result thereof as the clock signal CKout. The first input terminal of the inverted OR circuit 36D is coupled to the output terminal of the delay circuit 34, the second input terminal thereof is coupled to the output terminal of the edge detection circuit 37C and supplied with the signal E1, and an output terminal thereof is coupled to the input terminal of the delay circuit 31. In this oscillation circuit 30D, the signal E1 is caused to be at the high level for a predetermined period, in response to the rising edge of the clock signal CKin, and thus the inverted OR circuit 36D sets an output signal (the clock signal CKout) to the low level. In this way, the oscillation circuit 30D changes the phase of the clock signal CKout on the basis of the clock signal CKin.

Modification Example 1-3

In the above-described embodiment, the variable delay circuit 20 is disposed in a stage preceding the phase comparison circuits 11 and 12, but this is not limitative. Instead of this, for example, as represented by a phase-locked loop 1E illustrated in FIG. 17, the variable delay circuit 20 may be disposed in a stage preceding the oscillation circuit 30. This phase-locked loop 1E includes a control circuit 40E. As with the control circuit 40, the control circuit 40E controls the amount of delay in the variable delay circuit 20 to allow transition timings of the clock signals CKin and CK4 to coincide with each other. Further, for example, as represented by a phase-locked loop 1F illustrated in FIG. 18, the variable delay circuit 20 may be disposed between the oscillation circuit 30 and the frequency dividing circuit 13. Furthermore, for example, as represented by a phase-locked loop 1G illustrated in FIG. 19, the variable delay circuit 20 may be disposed in a stage following the frequency dividing circuit 13, and an output signal (the clock signal CK4) of this variable delay circuit 20 may be supplied to the phase comparison circuits 11 and 12 and to the control circuit 40E.

Moreover, in the above-described embodiment, the one variable delay circuit 20 is provided, but this is not limitative. Instead of this, for example, as represented by a phase-locked loop 1H illustrated in FIG. 20, and by a phase-locked loop 1J illustrated in FIG. 21, a plurality of variable delay circuits may be provided.

The phase-locked loop 1H includes variable delay circuits 20A and 20B, and a control circuit 40H, as illustrated in FIG. 20. The variable delay circuit 20A delays the clock signal CKin by an amount of delay corresponding to a control signal CTLPA, and supplies the delayed signal to the phase comparison circuits 11 and 12. The variable delay circuit 20B delays an output signal of the frequency dividing circuit 13 by an amount of delay corresponding to a control signal CTLPB, and supplies the delayed signal (the clock signal CK4) to the phase comparison circuits 11 and 12. The control circuit 40H generates the control signals CTLPA, CTLPB, and CTLF, on the basis of the comparison signals S11 and S12 and the clock signal CK4. As with the control circuit 40, this control circuit 40H controls the amount of delay of each of the variable delay circuits 20A and 20B to allow the transition timings of the output signal of the variable delay circuit 20A and the clock signal CK4 to coincide with each other.

The phase-locked loop 1J includes the variable delay circuits 20B, variable delay circuits 20C and 20D, and a control circuit 40J, as illustrated in FIG. 21. The variable delay circuit 20C delays the clock signal CKin by an amount of delay corresponding to a control signal CTLPC, and supplies the delayed signal to the phase comparison circuit 11. The variable delay circuit 20D delays the clock signal CKin by an amount of delay corresponding to a control signal CTLPD, and supplies the delayed signal to the phase comparison circuit 12. The control circuit 40J generates the control signals CTLPB, CTLPC, CTLPC, and CTLF, on the basis of the comparison signals S11 and S12 and the clock signal CK4. As with the control circuit 40, this control circuit 40J controls the amount of delay of each of the variable delay circuits 20B, 20C, and 20D to allow the transition timings of the output signal of the variable delay circuit 20C, the output signal of the variable delay circuit 20D, and the clock signal CK4 to coincide with each other.

Modification Example 1-4

In the above-described embodiment, the phase comparison circuits 11 and 12 operate on the basis of the clock signal CK4 of a single phase, but this is not limitative. Instead of this, for example, these circuits may operate on the basis of a multiphase clock signal. The present modification example is described below in detail.

FIG. 22 illustrates a configuration example of a phase-locked loop 1K according to the present modification example. The phase-locked loop 1K is a circuit that generates the clock signal CKout on the basis of two inputted clock signals CKIin and CKQin. The clock signal CKIin and the clock signal CKQin are 90 degrees out of phase with each other. The phase-locked loop 1K includes the variable delay circuit 20, an oscillation circuit 30K, a frequency dividing circuit 13K, phase comparison circuits 11A, 12A, 11B, and 12B, and a control circuit 40K.

The variable delay circuit 20 delays the clock signal CKIin by an amount of delay corresponding to the control signal CTLP, and outputs the delayed signal as a clock signal CK3. The oscillation circuit 30K includes a function of changing the phase of the clock signal CKout on the basis of a rising edge and a falling edge of the clock signal CK3. This oscillation circuit 30K has an edge detection circuit 37K. The edge detection circuit 37K detects the rising edge and the falling edge of the clock signal CKin, and generates the signal E1. It is to be noted that the oscillation circuit 30K is not limited thereto. For example, as with the oscillation circuit 30 according to the above-described embodiment, the oscillation circuit 30K either may change the phase of the clock signal CKout on the basis of the rising edge of the clock signal CK3, or may change the phase of the clock signal CKout on the basis of the falling edge of the clock signal CK3. The frequency dividing circuit 13K generates clock signals CKI4 and CKQ4 by dividing the frequency of the clock signal CKout by eight. The frequency of each of the clock signals CKI4 and CKQ4 is one-eighth (⅛) the frequency of the clock signal CKout. Further, the clock signal CKI4 and the clock signal CKQ4 are 90 degrees out of phase with each other. In this way, the clock signals CKI4 and CKQ4 form the multiphase clock signal.

FIG. 23 illustrates an operation example of the oscillation circuit 30K and the frequency dividing circuit 13K. (A) of FIG. 23 illustrates a waveform of the clock signal CK3, (B) of FIG. 23 illustrates a waveform of the signal E1, (C) of FIG. 23 illustrates a waveform of the clock signal CKout, (D) of FIG. 23 illustrates a waveform of the clock signal CKI4, and (E) of FIG. 23 illustrates a waveform of the clock signal CKQ4.

In this example, first, the edge detection circuit 37K of the oscillation circuit 30K detects the rising edge of the clock signal CK3 at a timing t61, and sets the signal E1 to the low level in the period PG starting from a timing t62 lagging behind the timing t61 by circuit delay ((B) of FIG. 23). In response to the signal E1 being set to the low level at the timing t62, the AND circuit 36 sets the clock signal CKout to the low level, in a period from a timing t63 lagging behind the timing t62 by circuit delay to a timing t64, ((C) of FIG. 23). On the basis of the rising edge of the clock signal CKout at the timing t64, the frequency dividing circuit 13K changes the clock signal CKI4 from the low level to the high level, at a timing t65 lagging behind the timing t64 by circuit delay ((D) of FIG. 23). Subsequently, on the basis of the rising edge of the clock signal CKout at a timing t66 after a lapse of time equivalent to two cycles of the clock signal CKout from the timing t64, the frequency dividing circuit 13K changes the clock signal CKQ4 from the low level to the high level, at a timing t67 lagging behind the timing t66 by circuit delay, ((E) of FIG. 23).

Next, the edge detection circuit 37K of the oscillation circuit 30K detects the falling edge of the clock signal CK3 at a timing t68, and sets the signal E1 to the low level, in the period PG starting from a timing t69 lagging behind the timing t68 by circuit delay ((B) of FIG. 23). In response to the signal E1 being set to the low level at the timing t69, the AND circuit 36 sets the clock signal CKout to the low level, in a period from a timing t70 lagging behind the timing t69 by circuit delay to a timing t71 ((C) of FIG. 23). On the basis of the rising edge of the clock signal CKout at the timing t71, the frequency dividing circuit 13K changes the clock signal CKI4 from the high level to the low level, at a timing t72 lagging behind the timing t71 by circuit delay ((D) of FIG. 23). Subsequently, on the basis of the rising edge of the clock signal CKout at a timing t73 after a lapse of time equivalent to two cycles of the clock signal CKout from the timing t71, the frequency dividing circuit 13K changes the clock signal CKQ4 from the high level to the low level, at a timing t74 lagging behind the timing t73 by circuit delay ((E) of FIG. 23).

In this way, in the phase-locked loop 1K, the phases of the clock signals CKI4 and CKQ4 are corrected twice, in a period equivalent to one cycle of the clock signal CKin. In other words, the cycle Tsync in which the phases of the clock signals CKI4 and CKQ4 are corrected is equal to a half of a length of one cycle of the clock signal CKin.

The phase comparison circuit 11A (FIG. 22) compares the phase of the clock signal CKIin and the phase of the clock signal CKI4 on the basis of the rising edges of the clock signals CKIin and CKI4, and generates a comparison signal S11A on the basis of a result of the comparison. The phase comparison circuit 12A compares the phase of the clock signal CKIin and the phase of the clock signal CKI4 on the basis of the falling edges of the clock signals CKIin and CKI4, and generates a comparison signal S12A on the basis of a result of the comparison.

The phase comparison circuit 11B compares the phase of the clock signal CKQin and the phase of the clock signal CKQ4 on the basis of the rising edges of the clock signals CKQin and CKQ4, and generates a comparison signal S11B on the basis of a result of the comparison. The phase comparison circuit 12B compares the phase of the clock signal CKQin and the phase of the clock signal CKQ4 on the basis of the falling edges of the clock signals CKQin and CKQ4, and generates a comparison signal S12B on the basis of a result of the comparison.

The control circuit 40K generates the control signals CTLP and CTLF, on the basis of the comparison signals S11A, S11B, S12A, and S12B and the clock signals CKI4 and CKQ4. This control circuit 40K controls each of the amounts of delay in the variable delay circuit 20 to allow the transition timings of the clock signal CKIin and the clock signal CKI4 to coincide with each other, and to allow the transition timings of the clock signal CKQin and the clock signal CKQ4 to coincide with each other.

FIG. 24 illustrates a configuration example of the control circuit 40K. The control circuit 40K includes a phase determination circuit 41K, a frequency determination circuit 42K, and the integration circuits 43 and 44. The phase determination circuit 41K generates the signal SIGP on the basis of the comparison signals S11A, S11B, S12A, and S12B and the clock signals CKI4 and CKQ4. The frequency determination circuit 42K generates the signal SIGF on the basis of the comparison signals S11A, S11B, S12A, and S12B and the clock signals CKI4 and CKQ4.

FIG. 25 illustrates an operation example of the phase-locked loop 1K. (A) of FIG. 25 illustrates a waveform of the clock signal CKIin, (B) of FIG. 25 illustrates a waveform of the clock signal CKQin, (C) of FIG. 25 illustrates a waveform of the clock signal CKI4, (D) of FIG. 25 illustrates a waveform of the clock signal CKQ4, (E) of FIG. 25 illustrates a waveform of the comparison signal S11A, (F) of FIG. 25 illustrates a waveform of the comparison signal S11B, (G) of FIG. 25 illustrates a waveform of the comparison signal S12A, (H) of FIG. 25 illustrates a waveform of the comparison signal S12B, (I) of FIG. 25 illustrates the signal SIGP, and (J) of FIG. 25 illustrates the signal SIGF.

The phase comparison circuit 11A generates the comparison signal S11A, by comparing the phases of the clock signals CKIin and CKI4 on the basis of the rising edges of the clock signals CKIin and CKI4 ((E) of FIG. 25). The phase comparison circuit 11B generates the comparison signal S11B, by comparing the phases of the clock signals CKQin and CKQ4 on the basis of the rising edges of the clock signals CKQin and CKQ4 ((F) of FIG. 25). The phase comparison circuit 12A generates the comparison signal S12A, by comparing the phases of the clock signals CKIin and CKI4 on the basis of the falling edges of the clock signals CKIin and CKI4 ((G) of FIG. 25). The phase comparison circuit 12B generates the comparison signal S12B, by comparing the phases of the clock signals CKQin and CKQ4 on the basis of the falling edges of the clock signals CKQin and CKQ4 ((H) of FIG. 25). As illustrated in FIG. 25, the phase of the clock signal CKIin and the phase of the clock signal CKI4 substantially coincide with each other, and the phase of the clock signal CKQin and the phase of the clock signal CKQ4 substantially coincide with each other. It is therefore possible for the control circuit 40K to determine leading or lagging of the phases of the clock signals CKI4 and CKQ4 on the basis of the comparison results (the comparison signals S11A, S11B, S12A, and S12B) obtained by the phase comparison circuits 11A, 11B, 12A, and 12B.

The phase determination circuit 41K of the control circuit 40K generates the signal SIGP, by comparing the comparison signal S11A and the comparison signal S11B, and by comparing the comparison signal S12A and the comparison signal S12B ((I) of FIG. 25). The frequency determination circuit 42K generates the signal SIGF, by comparing the comparison signal S11A and the comparison signal S11B, and by comparing the comparison signal S12A and the comparison signal S12B ((J) of FIG. 25).

Specifically, for example, the comparison result (the comparison signal S11A) obtained by the phase comparison circuit 11A at a timing t81 is "1" ((E) of FIG. 25), and the comparison result (the comparison signal S11B) obtained by the phase comparison circuit 11B at a timing t82 is "1" ((F) of FIG. 25). In other words, at both of the timings t81 and t82, the phases of the clock signals CKI4 and CKQ4 lead the phases of the clock signals CKIin and CKQin, respectively. Hence, the phase determination circuit 41K determines that the phases of the clock signal CKI4 and CKQ4 lead and thus delaying is necessary, and sets the signal SIGP to "+1", in a period of timings t83 to t85 ((I) of FIG. 25). At this time, the frequency determination circuit 42K determines that maintaining the frequencies of the clock signals CKI4 and CKQ4 is necessary, and sets the signal SIGF to "0", in the period of the timings t83 to t85 ((J) of FIG. 25).

Further, for example, the comparison result (the comparison signal S12A) obtained by the phase comparison circuit 12A at the timing t83 is "1" ((G) of FIG. 25), and the comparison result (the comparison signal S12B) obtained by the phase comparison circuit 12B at the timing t84 is "0" ((H) of FIG. 25). In other words, at the timing t83, the phase of the clock signal CKI4 leads the phase of the clock signal CKIin, and at the timing t84, the phase of the clock signal CKQ4 lags behind the phase of the clock signal CKQin. Hence, the frequency determination circuit 42K determines that the frequencies of the clock signals CKI4 and CKQ4 are low and thus raising is necessary, and sets the signal SIGF to "−1", in a period of timings t85 to t87 ((J) of FIG. 25). At this time, the phase determination circuit 41K determines that maintaining the phases of the clock signal CKI4 and CKQ4 is necessary, and sets the signal SIGP to "0", in the period of the timings t85 to t87 ((I) of FIG. 25).

In such a configuration as well, it is possible to obtain effects similar to the effects in the case of the above-described embodiment.

Modification Example 1-5

In the above-described embodiment, the phase-locked loop 1 is configured using the phase comparison circuits 11 and 12, but this is not limitative. Instead of this, for example, as represented by a phase-locked loop 1L illustrated in FIG. 26, flip-flop (F/F) circuits 11L and 12L may be used. The flip-flop circuit 11L generates the comparison signal S11, by sampling the clock signal CK2 at the rising timing of the clock signal CK4 and by inverting a sampling result thereof. The flip-flop circuit 12L generates the comparison signal S12, by sampling the clock signal CK2 at the falling timing of the clock signal CK4. In such a configuration as well, it is possible to obtain effects similar to the effects in the case of the above-described embodiment.

Other Modification Examples

Moreover, two or more of these modification examples may be combined.

2. Second Embodiment

Next, a phase-locked loop 2 according to a second embodiment is described. In the present embodiment, the phase-locked loop 2 is configured using one phase comparison circuit. It is to be noted that components substantially the same as those of the phase-locked loop 1 according to the above-described first embodiment are denoted by the same reference numerals, and the description thereof is omitted where appropriate.

FIG. 27 illustrates a configuration example of the phase-locked loop 2. The phase-locked loop 2 includes the variable delay circuit 20, an oscillation circuit 50, the frequency dividing circuit 13, the phase comparison circuit 11, and a control circuit 60. In other words, in the present embodiment, the phase-locked loop 2 is configured using the one phase comparison circuit 11, unlike the phase-locked loop 1 according to the first embodiment.

The oscillation circuit 50 includes an edge detection circuit 57 as illustrated in FIG. 4. The edge detection circuit 57 detects the rising edge of the clock signal CKin at a rate of one in every two thereof, and thereby generates the signal E1.

FIG. 28 illustrates an operation example of the variable delay circuit 20, the oscillation circuit 50, and the frequency dividing circuit 13. As illustrated in (B) of FIG. 28, the edge detection circuit 57 of the oscillation circuit 50 detects the rising edge of the clock signal CKin at a rate of one in every two thereof, and thereby generates the signal E1. The oscillation circuit 50 thereby corrects the phase of the clock signal CKout at a rate of once in every period equivalent to two cycles of the clock signal CKin. In other words, the cycle Tsync in which the phase of the clock signal CK4 is corrected is equal to a length of the period equivalent to two cycles of the clock signal CKin.

The control circuit 60 generates the control signals CTLP and CTLF on the basis of the comparison signal S11 and the clock signal CK4.

FIG. 29 illustrates a configuration example of the control circuit 60. The control circuit 60 includes a phase determination circuit 61 and a frequency determination circuit 62. The phase determination circuit 61 generates the signal SIGP on the basis of the comparison signal S11 and the clock signal CK4. The frequency determination circuit 62 generates the signal SIGF on the basis of the comparison signal S11 and the clock signal CK4.

FIG. 30 illustrates an operation example of the phase-locked loop 2. (A) of FIG. 30 illustrates a waveform of the clock signal CK2, (B) of FIG. 30 illustrates a waveform of the clock signal CK4, (C) of FIG. 30 illustrates a waveform of the comparison signal S11, (D) of FIG. 30 illustrates the signal SIGP, and (E) of FIG. 30 illustrates the signal SIGF.

The phase comparison circuit 11 generates the comparison signal S11, by comparing the phases of the clock signals CK2 and CK4 on the basis of the rising edges of the clock signals CK2 and CK4 ((C) of FIG. 30). The phase of the clock signal CK2 and the phase of the clock signal CK4 substantially coincide with each other, as illustrated in FIG. 30. It is therefore possible for the control circuit 60 to determine leading or lagging of the phase of the clock signal CK4 on the basis of the comparison result (the comparison signal S11) obtained by the phase comparison circuit 11. The phase determination circuit 61 of the control circuit 60 generates the signal SIGP on the basis of the comparison signal S11 ((D) of FIG. 30). The frequency determination circuit 62 generates the signal SIGF on the basis of the comparison signal S11 ((E) of FIG. 30).

Specifically, for example, the comparison result obtained by the phase comparison circuit 11 at a timing t91 is "1", and the comparison result obtained by the phase comparison circuit 11 at a timing t92 is "0" ((C) of FIG. 30). In other words, at the timing t91, the phase of the clock signal CK4 leads the phase of the clock signal CK2, and at the timing t92, the phase of the clock signal CK4 lags behind the phase of the clock signal CK2. Hence, the frequency determination circuit 62 determines that the frequency of the clock signal CK4 is low and thus raising is necessary, and sets the signal SIGF to "−1", in a period of the timing t92 to a timing t93 ((E) of FIG. 30). At this time, the phase determination circuit 61 determines that maintaining the phase of the clock signal CK4 is necessary, and sets the signal SIGP to "0", in the period of the timings t92 to t93 ((D) of FIG. 30).

Further, for example, the comparison result obtained by the phase comparison circuit 11 at the timing t93 is "0", and the comparison result obtained by the phase comparison circuit 11 at a timing t94 is "1" ((C) of FIG. 30). In other words, at the timing t93, the phase of the clock signal CK4 lags behind the phase of the clock signal CK2, and at the timing t94, the phase of the clock signal CK4 leads the phase of the clock signal CK2. Hence, the frequency determination circuit 62 determines that the frequency of the clock signal CK4 is high and thus lowering is necessary, and sets the signal SIGF to "+1", in a period of the timing t94 to a timing t95 ((E) of FIG. 30). At this time, the phase determination circuit 61 determines that maintaining the phase of the clock signal CK4 is necessary, and sets the signal SIGP to "0", in the period of the timings t94 to t95 ((D) of FIG. 30).

Further, for example, the comparison result obtained by the phase comparison circuit 11 at the timing t95 is "1", and the comparison result obtained by the phase comparison circuit 11 at a timing t96 is "1" ((C) of FIG. 30). In other words, at both of the timings t95 and t96, the phase of the clock signal CK4 leads the phase of the clock signal CK2. Hence, the phase determination circuit 61 determines that the phase of the clock signal CK4 leads and thus lowering is necessary, and sets the signal SIGP to "+1", in a period from the timing t96 ((D) of FIG. 30). At this time, the frequency determination circuit 62 determines that maintaining the frequency of the clock signal CK4 is necessary, and sets the signal SIGF to "0", in the period from the timing t96 ((E) of FIG. 30).

In this way, the phase comparison circuit 11 compares the phases of the clock signals CK2 and CK4 at comparison timings different from each other. Subsequently, in a case where these two comparison results coincide with each other, the phase determination circuit 61 sets the signal SIGP to "+1" or "−1" on the basis of a result of the comparison. Further, in a case where these two comparison results are different from each other, the frequency determination circuit 62 sets the signal SIGF to "+1" or "−1" on the basis of a result of the comparison.

As described above, in the present embodiment, the control circuit generates the signals SIGP and SIGF on the basis of the two comparison results in the phase comparison circuit, and thus it is possible to reduce the number of phase comparison circuits. It is therefore possible to simplify a circuit configuration. Other effects are similar to those in the case of the first embodiment.

Modification Example 2-1

In the above-described embodiment, the phase-locked loop 2 is configured using the phase comparison circuit 11 that compares the phases of the clock signals CK2 and CK4 on the basis of the rising edges of the clock signals CK2 and CK4, but this is not limitative. Instead of this, for example, as illustrated in FIGS. 31 and 32, a phase-locked loop 2A may be configured using the phase comparison circuit 12 that compares the phases of the clock signals CK2 and CK4 on the basis of the falling edges of the clock signals CK2 and CK4. The phase comparison circuit 12 generates the comparison signal S12, by comparing the phases of the clock signals CK2 and CK4 on the basis of the falling edges of the clock signals CK2 and CK4 ((C) of FIG. 32). The phase determination circuit 61 generates the signal SIGP on the basis of the comparison signal S12 ((D) of FIG. 32), and the frequency determination circuit 62 generates the signal SIGF on the basis of the comparison signal S12 ((E) of FIG. 32).

Modification Example 2-2

In the above-described embodiment, the oscillation circuit 50 corrects the phase of the clock signal CKout at a rate of once in every period equivalent to two cycles of the clock signal CKin, but this is not limitative. Instead of this, for example, the phase of the clock signal CKout may be corrected at a rate of once in every period equivalent to three cycles or more of the clock signal CKin. A phase-locked loop 2B according to the present modification example is described below in detail.

As illustrated in FIG. 31, the phase-locked loop 2B includes an oscillation circuit 50B and a control circuit 60B. The oscillation circuit 50B corrects the clock signal CKout at a rate of once in every period equivalent to four cycles of the clock signal CKin. The control circuit 60B generates the control signals CTLP and CTLF on the basis of the comparison signal S12 and the clock signal CK4.

FIG. 33 illustrates an operation example of the phase-locked loop 2B. The phase comparison circuit 12 generates the comparison signal S12, by comparing the phases of the clock signals CK2 and CK4 on the basis of the falling edges of the clock signals CK2 and CK4 ((C) of FIG. 33). The phase determination circuit 61 generates the signal SIGP on the basis of the comparison signal S12 ((D) of FIG. 33), and the frequency determination circuit 62 generates the signal SIGF on the basis of the comparison signal S12 ((E) of FIG. 33).

Specifically, for example, the comparison result obtained by the phase comparison circuit 12 at a timing t111 is "1", and the comparison result obtained by the phase comparison circuit 12 at a timing t114 is "1" ((C) of FIG. 33). It is to be noted that, in this example, as indicated by a triangle in (B) of FIG. 33, the comparison results obtained by the phase comparison circuit 12 at timings t112 and t113 are not considered, because the clock signal CKout is corrected at a rate of once in every period equivalent to four cycles of the clock signal CKin. In this example, the phase of the clock signal CK4 leads the phase of the clock signal CK2 at both of the timings t111 and t114. Hence, the phase determination circuit 61 determines that the phase of the clock signal CK4 leads and thus delaying is necessary, and sets the signal SIGP to "+1", in a period of the timing t114 to a timing t115 ((D) of FIG. 33). At this time, the frequency determination circuit 62 determines that maintaining the frequency of the clock signal CK4 is necessary, and sets the signal SIGF to "0", in the period of the timings t114 to t115, ((E) of FIG. 33).

In such a configuration as well, it is possible to obtain effects similar to the effects in the case of the above-described embodiment.

3. Third Embodiment

Next, a phase-locked loop 3 according to a third embodiment is described. In the present embodiment, a flip-flop circuit is used in place of the phase comparison circuit, and is configured to have varying frequencies of two clock signals supplied to the flip-flop circuit. It is to be noted that components substantially the same as those of the phase-locked loop 1 according to the above-described first embodiment are denoted by the same reference numerals, and the description thereof is omitted where appropriate.

FIG. 34 illustrates a configuration example of the phase-locked loop 3. The phase-locked loop 3 includes a frequency dividing circuit 73, flip-flop (F/F) circuits 71 and 72, and a control circuit 80.

The frequency dividing circuit 73 generates a clock signal CK5 by dividing the frequency of the clock signal CKout by two. In other words, a frequency of the clock signal CK5 is one-half (½) the frequency of the clock signal CKout, and four times the frequency of the clock signal CK2.

The flip-flop circuit 71 generates a comparison signal S71, by sampling the clock signal CK2 at a rising timing of the clock signal CK5. The flip-flop circuit 72 generates a comparison signal S72, by sampling the clock signal CK2 at a falling timing of the clock signal CK5.

The control circuit 80 generates the control signals CTLP and CTLF, on the basis of the comparison signals S71 and S72 and the clock signal CK5. The control circuit 80 includes a phase determination circuit 81 and a frequency determination circuit 82, as illustrated in FIG. 8. The phase determination circuit 81 generates the signal SIGP, on the basis of the comparison signals S71 and S72 and the clock signal CK5. The frequency determination circuit 82 generates the signal SIGF, on the basis of the comparison signals S71 and S72 and the clock signal CK5.

FIG. 35 illustrates an operation example of the phase-locked loop 3. (A) of FIG. 35 illustrates a waveform of the clock signal CK2, (B) of FIG. 35 illustrates a waveform of the clock signal CK5, (C) of FIG. 35 illustrates a waveform of the comparison signal S72, (D) of FIG. 35 illustrates a waveform of the comparison signal S71, (E) of FIG. 35 illustrates the signal SIGP, and (F) of FIG. 35 illustrates the signal SIGF.

The flip-flop circuit 71 generates the comparison signal S71, by sampling the clock signal CK2 at the rising timing of the clock signal CK5 ((D) of FIG. 35). The flip-flop circuit 72 generates the comparison signal S72, by sampling the clock signal CK2 at the falling timing of the clock signal CK5 ((C) of FIG. 35). At a rate of one in every two rising timings of the clock signal CK5, the rising timings of the clock signal CK5 substantially coincides with the transition timing of the clock signal CK2, as illustrated in FIG. 35. It is therefore possible for the control circuit 80 to determine leading or lagging of the phase of the clock signal CK5 on the basis of the sampling result (the comparison signal S71) obtained by the flip-flop circuit 71.

The phase determination circuit 81 of the control circuit 80 generates the signal SIGP by comparing the comparison signal S71 and the comparison signal S72 ((E) of FIG. 35). The frequency determination circuit 82 generates the signal SIGF by comparing the comparison signal S71 and the comparison signal S72 ((F) of FIG. 35).

Specifically, for example, the sampling result (the comparison signal S71) obtained by the flip-flop circuit 71 at a timing t121 is "1", and this sampling result is equal to the sampling result (the comparison signal S72) obtained by the flip-flop circuit 72 immediately after this timing t121, as illustrated in (C) of FIG. 35 and (D). Hence, at this timing t121, the phase of the clock signal CK5 lags. In addition, the sampling result (the comparison signal S71) obtained by the flip-flop circuit 71 at a timing t122 is "0", and this sampling result is equal to the sampling result (the comparison signal S72) obtained by the flip-flop circuit 72 immediately after this timing t122. Hence, at this timing t122, the phase of the clock signal CK5 lags. In this way, at both of the timings t121 and t122, the phase of the clock signal CK5 lags. Accordingly, the phase determination circuit 81 determines that the phase of the clock signal CK5 lags and thus leading is necessary, and sets the signal SIGP to "−1", in a period of timings t123 to t125 ((E) of FIG. 35). At this time, the frequency determination circuit 82 determines that maintaining the frequency of the clock signal CK5 is necessary, and sets the signal SIGF to "0", in the period of the timings t123 to t125, ((F) of FIG. 35).

Further, for example, the sampling result (the comparison signal S71) obtained by the flip-flop circuit 71 at the timing t123 is "1", and this sampling result is equal to the sampling result (the comparison signal S72) obtained by the flip-flop circuit 72 immediately after this timing t123. Hence, at this timing t123, the phase of the clock signal CK5 lags. In addition, the sampling result (the comparison signal S71) obtained by the flip-flop circuit 71 at a timing t124 is "1", and this sampling result is equal to the sampling result (the comparison signal S72) obtained by the flip-flop circuit 72 immediately before this timing t124. Hence, at this timing t124, the phase of the clock signal CK5 leads. In this way, the phase of the clock signal CK5 lags at the timing t123, and the phase of the clock signal CK5 leads at the timing t124. Accordingly, the frequency determination circuit 82 determines that the frequency of the clock signal CK5 is high and thus lowering is necessary, and sets the signal SIGF to "+1", in a period of the timing t125 to a timing t127 ((F) of FIG. 35). At this time, the phase determination circuit 81 determines that maintaining the phase of the clock signal CK5 is necessary, and sets the signal SIGP to "0", in the period of the timings t125 to t127 ((E) of FIG. 35).

Further, for example, the sampling result (the comparison signal S71) obtained by the flip-flop circuit 71 at the timing t125 is "0", and this sampling result is equal to the sampling result (the comparison signal S72) obtained by the flip-flop circuit 72 immediately before this timing t125. Hence, at this timing t125, the phase of the clock signal CK5 leads. In addition, the sampling result (the comparison signal S71) obtained by the flip-flop circuit 71 at the timing t126 is "1", and this sampling result is equal to the sampling result (the comparison signal S72) obtained by the flip-flop circuit 72 immediately before this timing t122. Hence, at this timing t126, the phase of the clock signal CK5 leads. In this way, at both of the timings t125 and t126, the phase of the clock signal CK5 leads. Accordingly, the phase determination circuit 81 determines that the phase of the clock signal CK5 leads and thus delaying is necessary, and sets the signal SIGP to "+1", in a period of the timing t127 to a timing t129 ((E) of FIG. 35). The frequency determination circuit 82 determines that maintaining the frequency of the clock signal CK5 is necessary, and sets the signal SIGF to "0", in the period of the timings t127 to t129 ((F) of FIG. 35).

Further, for example, the sampling result (the comparison signal S71) obtained by the flip-flop circuit 71 at the timing t127 is "0", and this sampling result is equal to the sampling result (the comparison signal S72) obtained by the flip-flop circuit 72 immediately before this timing t127. Hence, at this timing t127, the phase of the clock signal CK5 leads. In addition, the sampling result (the comparison signal S71) obtained by the flip-flop circuit 71 at the timing t128 is "1", and this sampling result is equal to the sampling result (the comparison signal S72) obtained by the flip-flop circuit 72 immediately before this timing t128. Hence, at this timing t128, the phase of the clock signal CK5 leads. In this way, at both of the timings t127 and t128, the phase of the clock signal CK5 leads. Accordingly, the phase determination circuit 81 determines that the phase of the clock signal CK5 leads and thus delaying is necessary, and sets the signal SIGP to "+1", in a period of the timing t129 to a timing t131 ((E) of FIG. 35). At this time, the frequency determination circuit 82 determines that maintaining the frequency of the clock signal CK5 is necessary, and sets the signal SIGF to "0", in the period of the timings t129 to t131 ((F) of FIG. 35).

Further, for example, the sampling result (the comparison signal S71) obtained by the flip-flop circuit 71 at the timing t129 is "0", and this sampling result is equal to the sampling result (the comparison signal S72) obtained by the flip-flop circuit 72 immediately after this timing t129. Hence, at this timing t129, the phase of the clock signal CK5 leads. In addition, the sampling result (the comparison signal S71) obtained by the flip-flop circuit 71 at the timing t130 is "0", and this sampling result is equal to the sampling result (the comparison signal S72) obtained by the flip-flop circuit 72 immediately after this timing t130. Hence, at this timing t130, the phase of the clock signal CK5 lags. In this way, the phase of the clock signal CK5 leads at the timing t129, and the phase of the clock signal CK5 lags at the timing t130. Accordingly, the frequency determination circuit 82 determines that the frequency of the clock signal CK5 is low and thus raising is necessary, and sets the signal SIGF to "−1", in a period from the timing t131 ((F) of FIG. 35). At this time, the phase determination circuit 81 determines that maintaining the phase of the clock signal CK5 is necessary, and sets the signal SIGP to "0", in the period from the timing t131 ((E) of FIG. 35).

In this way, the control circuit 80 determines leading or lagging of the phase of the clock signal CK5, at timings different from each other. Subsequently, in a case where these two determination results coincide with each other, the phase determination circuit 81 sets the signal SIGP to "+1" or "−1" on the basis of a determination result thereof. Further, in a case where these two determination results are different from each other, the frequency determination circuit 82 sets the signal SIGF to "+1" or "−1" on the basis of a determination result thereof.

As described above, in the present embodiment, the frequency of the clock signal CK5 is higher than the frequency of the clock signal CK2, and thus it is possible to reduce the number of frequency divisions in the frequency dividing circuit. It is therefore possible to simplify a circuit configuration. Other effects are similar to those in the case of the first embodiment.

Modification Example 3-1

In the above-described embodiment, the frequency dividing circuit 73 generates the clock signal CK5 by dividing the frequency of the clock signal CKout by two, but this is not limitative. The clock signal CK5 may be generated by dividing the frequency of the clock signal CKout by four. In addition, as represented by a phase-locked loop 3B illustrated in FIG. 36, no frequency dividing circuit may be provided. The phase-locked loop 3B includes the variable delay circuit 20, the oscillation circuit 30, the flip-flop circuits 71 and 72, and a control circuit 80B.

4. Application Examples

Next, application examples of the phase-locked loop described in each of the above-described embodiments and modification examples are described.

Application Example 1

FIG. 37 illustrates a configuration example of a communication system 100 according to an application example 1. The communication system 100 includes a transmission unit 200 and a receiving unit 300. The transmission unit 200 transmits a data signal SIG to the receiving unit 300 through a transmission channel 900, and the receiving unit 300 receives the data signal SIG transmitted from the transmission unit 200 through the transmission channel 900.

The transmission unit 200 has a phase-locked loop 201, a serializer 202, and a driver 203. The phase-locked loop 201 generates a clock signal CKtx1 on the basis of a clock signal CKtx. For example, the phase-locked loop according to any of the above-described embodiments, etc. is applied to this phase-locked loop 201. The serializer 202 generates a serial data signal Stx, by serializing a parallel data signal Dtx on the basis of the parallel data signal Dtx and the clock signal CKtx1. Further, the serializer 202 also has a function of outputting a clock signal Ctx. The driver 203 generates the data signal SIG on the basis of the serial data signal Stx.

The receiving unit 300 has a receiver 301, a phase-locked loop 302, a CDR (Clock and Data Recovery) 303, and a deserializer 304. The receiver 301 receives the data signal SIG. The phase-locked loop 302 generates a clock signal CKrx1 on the basis of a clock signal CKrx. For example, the phase-locked loop according to any of the above-described embodiments, etc. is applied to this phase-locked loop 302. The CDR 303 generates a serial data signal Srx and a clock signal CR on the basis of an output signal of the receiver 301 and the clock signal CKrx1. The deserializer 304 generates a parallel data signal Drx, by deserializing the serial data signal Srx on the basis of the serial data signal Srx and the clock signal CR. Further, the deserializer 304 also has a function of outputting a clock signal CRx.

Application Example 2

FIG. 38 illustrates a configuration example of a communication system 120 according to an application example 2. A communication system 110 includes a transmission unit 210 and a receiving unit 310. The transmission unit 210 transmits a plurality of data signals SIG to the receiving unit 310 through a plurality of transmission channels 900, and the receiving unit 310 receives the plurality of data signals SIG transmitted from the transmission unit 210 through the plurality of transmission channels 900.

The transmission unit 210 includes a phase-locked loop 213 and a plurality of transmitters 211. The phase-locked loop 213 generates the clock signal CKtx1 on the basis of the clock signal CKtx. For example, the phase-locked loop according to any of the above-described embodiments, etc. is applied to this phase-locked loop 213. The plurality of transmitters 211 transmit the plurality of data signals SIG to the receiving unit 310 through the plurality of transmission channels 900, respectively. The transmitters 211 each include the serializer 202 and the driver 203. The serializer 202 of each of the transmitters 211 is supplied with the clock signal CKtx1 from the phase-locked loop 213 through some of buffers 212.

A receiving unit 320 includes a phase-locked loop 313 and a plurality of receivers 311. The phase-locked loop 313 generates the clock signal CKrx1 on the basis of the clock signal CKrx. For example, the phase-locked loop according to any of the above-described embodiments, etc. is applied to this phase-locked loop 313. The plurality of receivers 311 receive the plurality of data signals SIG transmitted from the transmission unit 210 through the plurality of transmission channels 900, respectively. Each of the receivers 311 includes the receiver 301, the CDR 303, and the deserializer 304. The CDR 303 of each of the receivers 311 is supplied with the clock signal CKrx1 from the phase-locked loop 313 through some of buffers 312.

Application Example 3

FIG. 39 illustrates a configuration example of the communication system 120 according to an application example 3. The communication system 120 includes a transmission unit 220 and the receiving unit 320. The transmission unit 220 transmits the plurality of data signals SIG to the receiving unit 320 through the plurality of transmission channels 900, respectively, and transmits a clock signal CLK to the receiving unit 320 through a transmission channel 901. The receiving unit 320 receives the plurality of data signals SIG transmitted from the transmission unit 220 through the plurality of transmission channels 900, respectively, and receives the clock signal CLK transmitted from the transmission unit 220 through the transmission channel 901.

The transmission unit 220 includes the phase-locked loop 213, the plurality of transmitters 211, a frequency dividing circuit 221, and a driver 222. The frequency dividing circuit 221 generates a frequency-dividing clock signal, by dividing a frequency of the clock signal CKtx1 supplied from the phase-locked loop 213 through some of the buffers 212. The driver 222 generates the clock signal CLK on the basis of the frequency-dividing clock signal supplied from the frequency dividing circuit 221.

The receiving unit 320 includes a phase-locked loop 321 and the plurality of receivers 311. The phase-locked loop 321 generates the clock signal CKrx1, on the basis of the clock signal CLK transmitted from the transmission unit 220 through the transmission channel 901. For example, the phase-locked loop according to any of the above-described embodiments, etc. is applied to this phase-locked loop 321. The CDR 303 of each of the receivers 311 is supplied with the clock signal CKrx1 from this phase-locked loop 321 through some of the buffers 312.

Application Example 4

FIG. 40 illustrates a configuration example of a communication system 130 according to an application example 4. The communication system 130 includes a transmission unit 230 and a receiving unit 330. The transmission unit 230 transmits the plurality of data signals SIG to the receiving unit 330 through the plurality of transmission channels 900, respectively, and the receiving unit 330 receives the plurality of data signals SIG transmitted from the transmission unit 230 through the plurality of transmission channels 900, respectively.

The transmission unit 230 includes the phase-locked loop 213 and a plurality of transmitters 231. The transmitters 231 each include the phase-locked loop 201, the serializer 202, and the driver 203. The phase-locked loop 201 of each of the transmitters 231 is supplied with the clock signal CKtx1 from the phase-locked loop 213 through some of the buffers 212.

The receiving unit 330 includes the phase-locked loop 313 and a plurality of receivers 331. The receivers 331 each include the receiver 301, the phase-locked loop 302, the CDR 303, and the deserializer 304. The phase-locked loop 302 of each of the receivers 331 is supplied with the clock signal CKrx1 from the phase-locked loop 313 through some of the buffers 312.

Application Example 5

FIG. 41 illustrates a configuration example of a communication system 140 according to an application example 5. The communication system 140 includes a transmission unit 240 and a receiving unit 340. The transmission unit 240 transmits the plurality of data signals SIG to the receiving unit 340 through the plurality of transmission channels 900, respectively, and transmits the clock signal CLK to the receiving unit 340 through the transmission channel 901. The receiving unit 340 receives the plurality of data signals SIG transmitted from the transmission unit 240 through the plurality of transmission channels 900, respectively, and receives the clock signal CLK transmitted from the transmission unit 240 through the transmission channel 901.

The transmission unit 240 includes the phase-locked loop 213, the plurality of transmitters 231, the frequency dividing circuit 221, and the driver 222. The frequency dividing circuit 221 and the phase-locked loop 201 of each of the transmitters 231 are supplied with the clock signal CKtx1 from the phase-locked loop 213 through some of the buffers 212.

The receiving unit 340 includes the phase-locked loop 321 and the plurality of receivers 331. The phase-locked loop 302 of each of the receivers 331 is supplied with the clock signal CKrx1 from the phase-locked loop 321 through some of the buffers 312.

Application Example 6

FIG. 42 illustrates a configuration example of a communication system 150 according to an application example 6. The communication system 150 includes a communication unit 250 and a communication unit 350. The communication unit 250 transmits the data signal SIG to the communication unit 350 through the transmission channel 900, and receives the data signal SIG transmitted from the communication unit 350 through a transmission channel 902. The communication unit 350 transmits the data signal SIG to the communication unit 250 through the transmission channel 902, and receives the data signal SIG transmitted from the communication unit 250 through the transmission channel 900.

The communication unit 250 includes a phase-locked loop 251, the serializer 202, the driver 203, a receiver 252, a CDR 253, and a deserializer 254. This communication unit 250 has functions of both of the transmission unit 200 and the receiving unit 300 illustrated in FIG. 37.

The communication unit 350 includes a phase-locked loop 351, the receiver 301, the CDR 303, the deserializer 304, a serializer 352, and a driver 353. This communication unit 350 has functions of both of the transmission unit 200 and the receiving unit 300 illustrated in FIG. 37.

Although the technology has been described above referring to the some embodiments and modification examples, the technology is not limited thereto, and may be modified in a variety of ways.

For example, in each of the above-described embodiments, the oscillator of the so-called gated VCO type is used, but this is not limitative. Instead of this, for example, an oscillator of injection lock type may be used.

Further, for example, in each of the above-described embodiments, the configuration of the variable delay circuit 20 is not limited to the configuration illustrated in FIG. 2. For example, a configuration illustrated in FIG. 43 is also possible. This variable delay circuit 90 includes a delay circuit 99, inverters 91 and 92, an inverter 93, and a control-signal generation section 94. The delay circuit 99 delays the clock signal CKin by a predetermined amount of delay, and outputs the delayed clock signal. It is possible for the predetermined amount of delay to have, for example, a length of about one-quarter (¼) of one cycle of the clock signal CKin. The inverter 91 inverts the clock signal CKin and outputs the inverted clock signal, and is configured to be able to adjust a driving force depending on a control signal C1. Specifically, for example, it is possible for the inverter 91 to change the number of transistors to be used and a current value, depending on the control signal C1. The inverter 92 inverts an output signal of the delay circuit 99 and outputs the inverted signal, and is configured to be able to adjust a driving force depending on a control signal C2. The inverters 91 and 92 have respective output terminals that are coupled to each other and are guided to an input terminal of the inverter 93. The inverter 93 inverts a supplied signal, and outputs the inverted signal as the clock signal CK2. The control-signal generation section 94 generates the control signals C1 and C2 on the basis of the control signal CTLP. Owing to this configuration, in the variable delay circuit 90, a data signal DT and a data signal outputted from the delay circuit 99 are weighted by the inverters 91 and 92, respectively, and are added together. Accordingly, for example, the phase of the clock signal CK2 leads in a case where the driving force of the inverter 91 is increased, and the phase of the clock signal CK2 lags in a case where the driving force of the inverter 92 is increased.

Next, a phase-locked loop using this technique is described. FIG. 44 illustrates a configuration example of a phase-locked loop 1M according to the present modification example. The phase-locked loop 1M includes variable delay circuits 20E and 20F, and the control circuit 40. The control circuit 40 supplies the control signal CTLP to the variable delay circuits 20E and 20F. FIG. 45 illustrates a configuration example of the variable delay circuits 20E and 20F according to the present modification example. An inverter 101 inverts the clock signal CKin and outputs the inverted clock signal, and is configured to be able to adjust a driving force depending on the control signal C1. An inverter 102 inverts an output signal of the delay circuit 99 and outputs the inverted signal, and is configured to be able to adjust a driving force depending on the control signal C2. The inverters 101 and 102 have respective output terminals that are coupled to each other and are guided to an input terminal of an inverter 103. An inverter 111 inverts an output signal of the delay circuit 99 and outputs the inverted signal, and is configured to be able to adjust a driving force depending on the control signal C1. An inverter 112 inverts the clock signal CKin and outputs the inverted clock signal, and is configured to be able to adjust a driving force depending on the control signal C2. The inverters 111 and 112 have respective output terminals that are coupled to each other and are guided to an input terminal of an inverter 113. A circuit block configured by the delay circuit 99, the inverters 101 and 102, and the inverter 103 corresponds to the variable delay circuit 20E, and a circuit block configured by the delay circuit 99, the inverters 111 and 112, and the inverter 113 corresponds to the variable delay circuit 20F. In this configuration, for example, in a case where the driving forces of the inverters 101 and 111 are increased, the phase of the output signal (the clock signal CK2) of the variable delay circuit 20E leads, and a phase of an output signal of the variable delay circuit 20F lags. Further, for example, in a case where the driving forces of the inverters 102 and 112 are increased, the phase of the output signal (the clock signal CK2) of the variable delay circuit 20E lags, and the phase of the output signal of the variable delay circuit 20F leads.

It is to be noted that the effects described herein are mere examples and non-limiting, and other effects may also be provided.

It is to be noted that the technology may adopt the following configurations.

(1)

A phase-locked loop including:

a detector that detects a transition of an input clock signal;

an oscillator that generates a clock signal having a frequency corresponding to a first control signal, and changes a phase of the clock signal on a basis of a detection result in the detector;

an adjuster that adjusts a phase difference between a phase of the input clock signal and the phase of the clock signal depending on a second control signal; and a controller that compares the phase of the input clock signal and the phase of the clock signal at a plurality of comparison timings, and generates the first control signal and the second control signal on a basis of a result of the comparison.

(2)

The phase-locked loop according to (1), in which the adjuster includes a first delay section that delays the input clock signal by an amount of delay corresponding to the second control signal, and the controller compares the phase of the input clock signal delayed by the first delay section and the phase of the clock signal.

(3)

The phase-locked loop according to (1), in which the adjuster includes a second delay section that delays the input clock signal by an amount of delay corresponding to the second control signal, and the detector detects the transition of the input clock signal delayed by the second delay section.

(4)

The phase-locked loop according to (1), in which the adjuster includes a third delay section that delays the clock signal by an amount of delay corresponding to the second control signal, and the controller compares the phase of the input clock signal and the phase of the clock signal delayed by the third delay section.

(5)

The phase-locked loop according to (1), further including a frequency divider that divides a frequency of the clock signal, in which the adjuster includes a fourth delay section that delays the clock signal of which frequency is divided by the frequency divider, by an amount of delay corresponding to the second control signal, and the controller compares the phase of the input clock signal and the phase of the clock signal delayed by the fourth delay section.

(6)

The phase-locked loop according to any one of (1) to (5), in which the plurality of comparison timings include a first comparison timing and a second comparison timing, and the controller generates the first control signal and the second control signal, on a basis of a first comparison result at the first comparison timing and a second comparison result at the second comparison timing.

(7)

The phase-locked loop according to (6), in which, in a case where the first comparison result and the second comparison result are different from each other, the controller generates the first control signal on a basis of the first comparison result and the second comparison result.

(8)

The phase-locked loop according to (6) or (7), in which, in a case where the first comparison result and the second comparison result are equal to each other, the controller generates the second control signal on a basis of the first comparison result and the second comparison result.

(9)

The phase-locked loop according to any one of (6) to (8), in which the controller includes a first comparison section that generates the first comparison result by comparing the phase of the input clock signal and the phase of the clock signal at the first comparison timing, and a second comparison section that generates the second comparison result by comparing the phase of the input clock signal and the phase of the clock signal at the second comparison timing.

(10)

The phase-locked loop according to any one of (6) to (8), in which the controller includes a comparison section that generates the first comparison result by comparing the phase of the input clock signal and the phase of the clock signal at the first comparison timing, and generates the second comparison result by comparing the phase of the input clock signal and the phase of the clock signal at the second comparison timing.

(11)

The phase-locked loop according to any one of (6) to (10), in which the plurality of comparison timings further includes a third comparison timing preceding the first comparison timing, a fourth comparison timing following the first comparison timing, a fifth comparison timing preceding the second comparison timing, and a sixth comparison timing following the second comparison timing, and the controller generates the first control signal and the second control signal, on a basis of which one of a third comparison result at the third comparison timing and a fourth comparison result at the fourth comparison timing coincides with the first comparison result, and on a basis of which one of a fifth comparison result at the fifth comparison timing and a sixth comparison result at the sixth comparison timing coincides with the second comparison result.

(12)

The phase-locked loop according to any one of (1) to (11), further including a frequency divider that divides the frequency of the clock signal, in which the controller compares the phase of the input clock signal and the phase of the clock signal of which frequency is divided by the frequency divider.

(13)

The phase-locked loop according to any one of (1) to (12), in which the oscillator detects a transition at a rate of one in every predetermined number of transitions, and the plurality of comparison timings include a timing within a period corresponding to a period from detection of a transition to detection of a next transition by the oscillator.

(14)

A phase-locking method including:

detecting a transition of an input clock signal;

generating a clock signal having a frequency corresponding to a first control signal, and changing a phase of the clock signal on a basis of the transition of the input clock signal;

adjusting a phase difference between a phase of the input clock signal and the phase of the clock signal depending on a second control signal; and comparing the phase of the input clock signal and the phase of the clock signal at a plurality of comparison timings, and generating the first control signal and the second control signal on a basis of a result of the comparison.

(15)

A communication unit including:

a first phase-locked section that generates a clock signal; and a communication section that performs communication by using the clock signal, in which the first phase-locked section includes a detector that detects a transition of an input clock signal, an oscillator that generates the clock signal having a frequency corresponding to a first control signal, and changes a phase of the clock signal on a basis of a detection result in the detector, an adjuster that adjusts a phase difference between a phase of the input clock signal and the phase of the clock signal depending on a second control signal, and a controller that compares the phase of the input clock signal and the phase of the clock signal at a plurality of comparison timings, and generates the first control signal and the second control signal on a basis of a result of the comparison.

(16)

The communication unit according to (15), further including a second phase-locked section that generates the input clock signal.

(17)

The communication unit according to (15) or (16), in which the communication section includes a transmitter that transmits a data signal.

(18)

The communication unit according to any one of (15) to (17), in which the communication section includes a receiver that receives a data signal.

This application is based upon and claims priority from Japanese Patent Application No. 2015-179019 filed with the Japan Patent Office on Sep. 11, 2015, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A phase-locked loop comprising:
a detector that detects at least transition of an input clock signal;
an oscillator that generates a clock signal having a frequency corresponding to a first control signal, and changes a phase of the clock signal on a basis of a detection result in the detector, wherein the basic of the detection result comprises a pulse signal;
an adjuster that adjusts a phase difference between a phase of the input clock signal and the phase of the clock signal depending on a second control signal; and
a controller that compares the phase of the input clock signal and the phase of the clock signal at a plurality of comparison timings, and generates the first control signal and the second control signal on a basis of a result of the comparison.

2. The phase-locked loop according to claim 1, further comprising a frequency divider that divides a frequency of the clock signal, wherein
the controller compares the phase of the input clock signal and the phase of the clock signal of which frequency is divided by the frequency divider.

3. The phase-locked loop according to claim 1, wherein
the adjuster includes a second delay section that delays the input clock signal by an amount of delay corresponding to the second control signal, and
the detector detects the at least transition of the input clock signal delayed by the second delay section.

4. The phase-locked loop according to claim 1, wherein
the adjuster includes a third delay section that delays the clock signal by an amount of delay corresponding to the second control signal, and the controller compares the phase of the input clock signal and the phase of the clock signal delayed by the third delay section.

5. The phase-locked loop according to claim 1, further comprising a frequency divider that divides a frequency of the clock signal, wherein
the adjuster includes a fourth delay section that delays the clock signal of which frequency is divided by the frequency divider, by an amount of delay corresponding to the second control signal, and
the controller compares the phase of the input clock signal and the phase of the clock signal delayed by the fourth delay section.

* * * * *